United States Patent
Tsuji et al.

(10) Patent No.: US 6,690,805 B1
(45) Date of Patent: Feb. 10, 2004

(54) AUDIO SIGNAL NOISE REDUCTION SYSTEM

(75) Inventors: Masayuki Tsuji, Tokyo (JP); Masahiro Tsujishita, Tokyo (JP); Kenichi Taura, Tokyo (JP); Masayuki Ishida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/315,035

(22) Filed: May 20, 1999

(30) Foreign Application Priority Data

Jul. 17, 1998 (JP) .......................................... 10-202948

(51) Int. Cl.⁷ .............................................. H04R 15/00
(52) U.S. Cl. ...................... 381/94.1; 455/222; 455/296; 381/13
(58) Field of Search ............................. 381/13, 10, 12, 381/1, 2, 3, 4, 7, 94.1, 94.4, 94.5, 94.2; 455/222, 296, 297

(56) References Cited

U.S. PATENT DOCUMENTS

| | | | |
|---|---|---|---|
| 4,195,203 A | * | 3/1980 | Sakai ........................... 381/13 |
| 4,574,390 A | | 3/1986 | Hirohashi et al. |
| 4,694,500 A | | 9/1987 | Tazaki et al. |
| 5,357,544 A | * | 10/1994 | Horner ........................... 381/7 |
| 5,586,192 A | * | 12/1996 | De Bijl ...................... 381/94.8 |

FOREIGN PATENT DOCUMENTS

JP          6387026          4/1988

* cited by examiner

Primary Examiner—Minsun Oh Harvey
(74) Attorney, Agent, or Firm—Birch, Stewart, Kolasch & Birch, LLP

(57) ABSTRACT

An audio signal noise reduction system comprises a noise detecting circuit 11 for detecting a noise from an audio signal and outputting a detection signal indicating a start time and an end time of a noise period of the noise, an LPF 12 for extracting a low frequency component of the audio signal, an HPF 14 for extracting intermediate and high frequency components of the audio signal, a polynomial interpolation circuit 13 for polynomial-interpolating the noise period of the low frequency component being extracted, a mute circuit 15 for muting an output level of the noise period of the intermediate and high frequency components being extracted, and a signal synthesizing circuit 16 for synthesizing the low frequency component whose noise period is polynomial-interpolated and the intermediate and high frequency components the level of whose noise period is suppressed to thus output the audio signal.

13 Claims, 69 Drawing Sheets

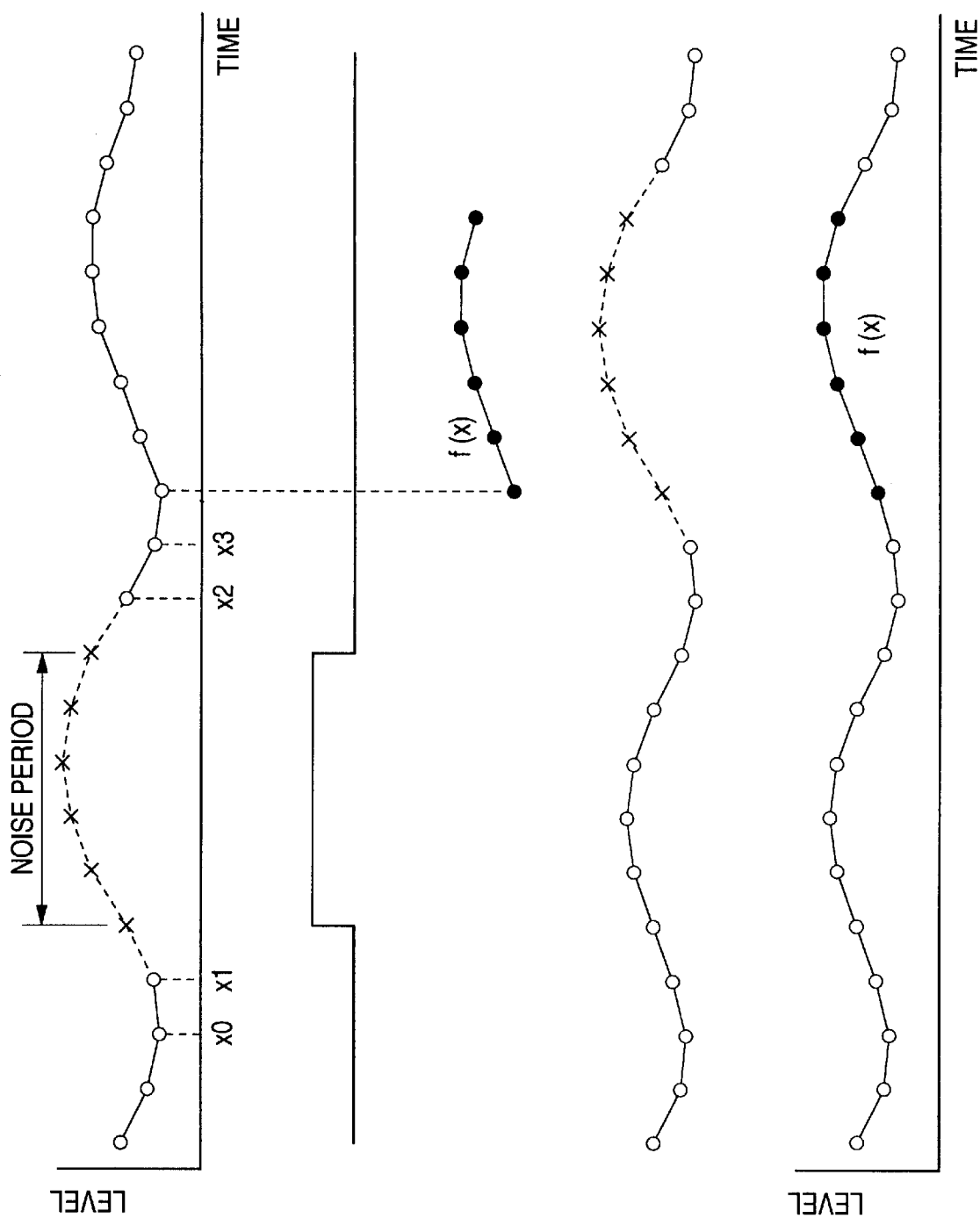

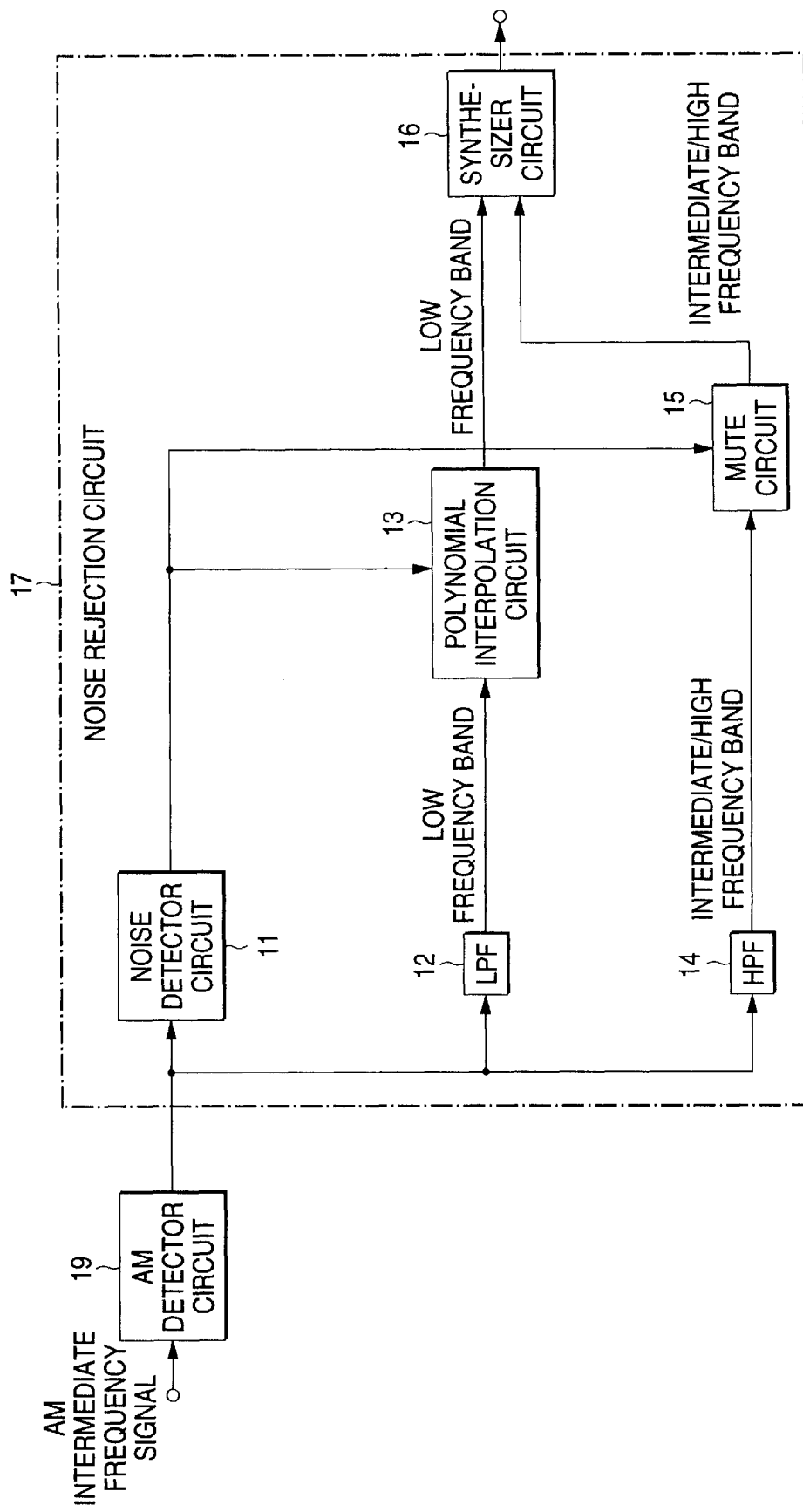

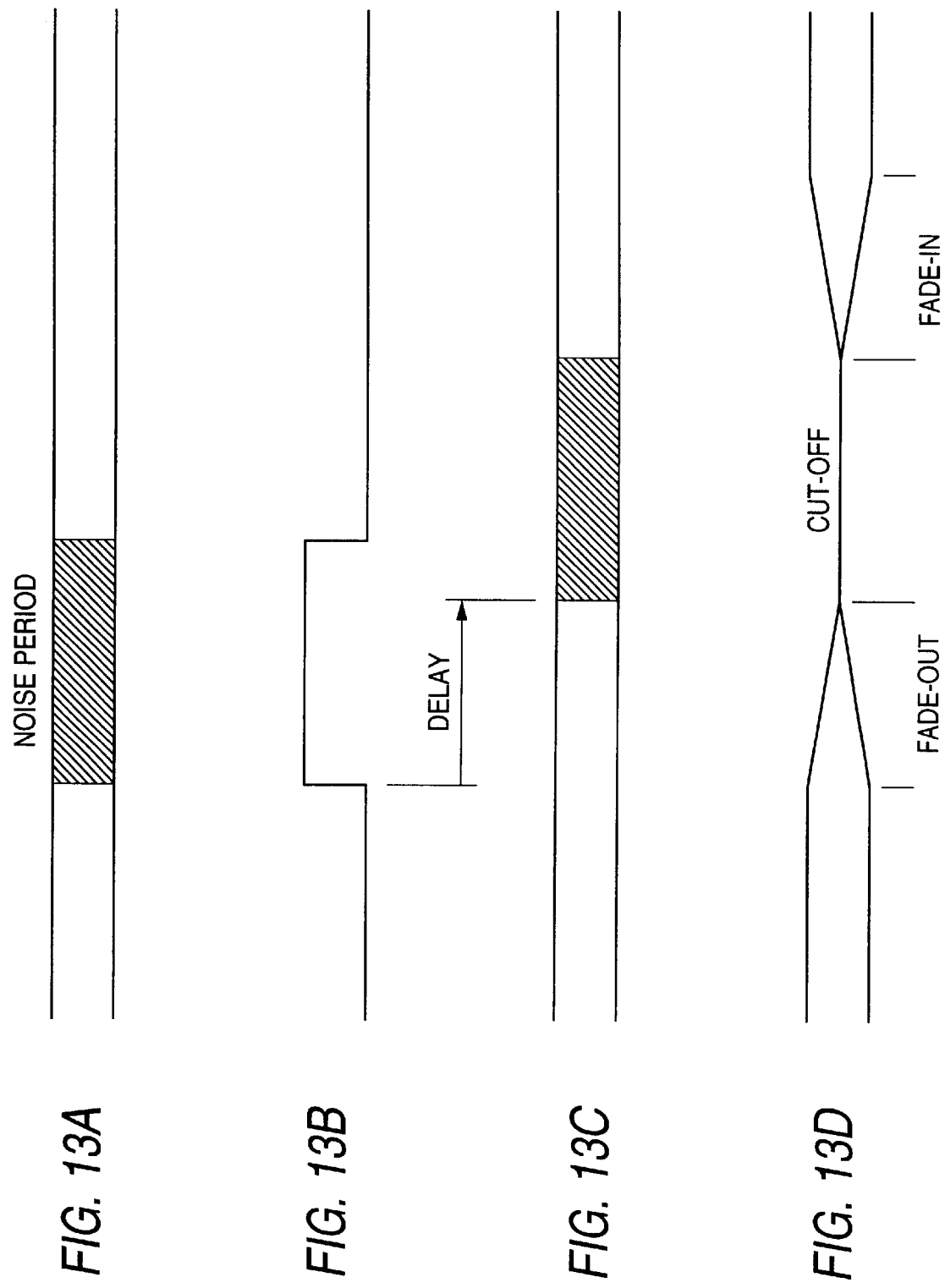

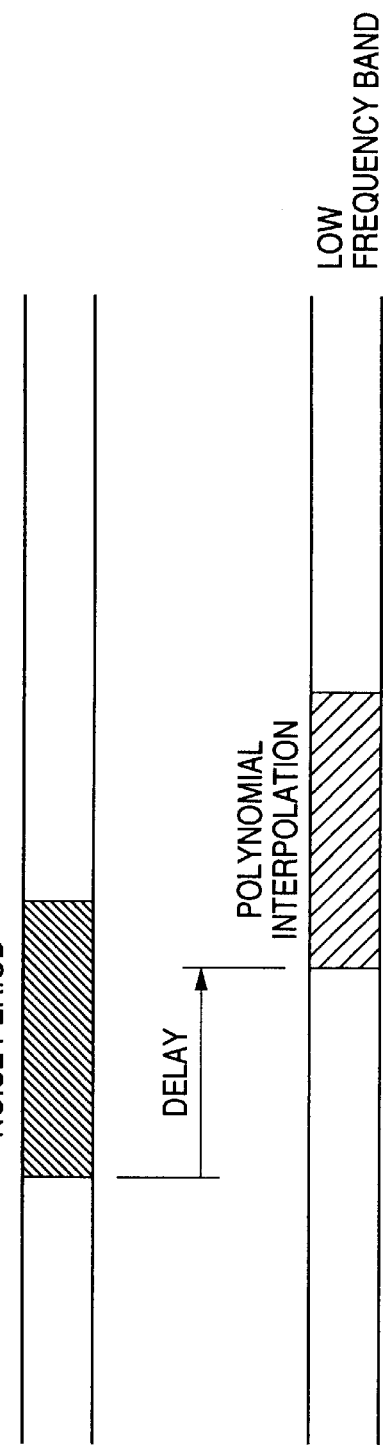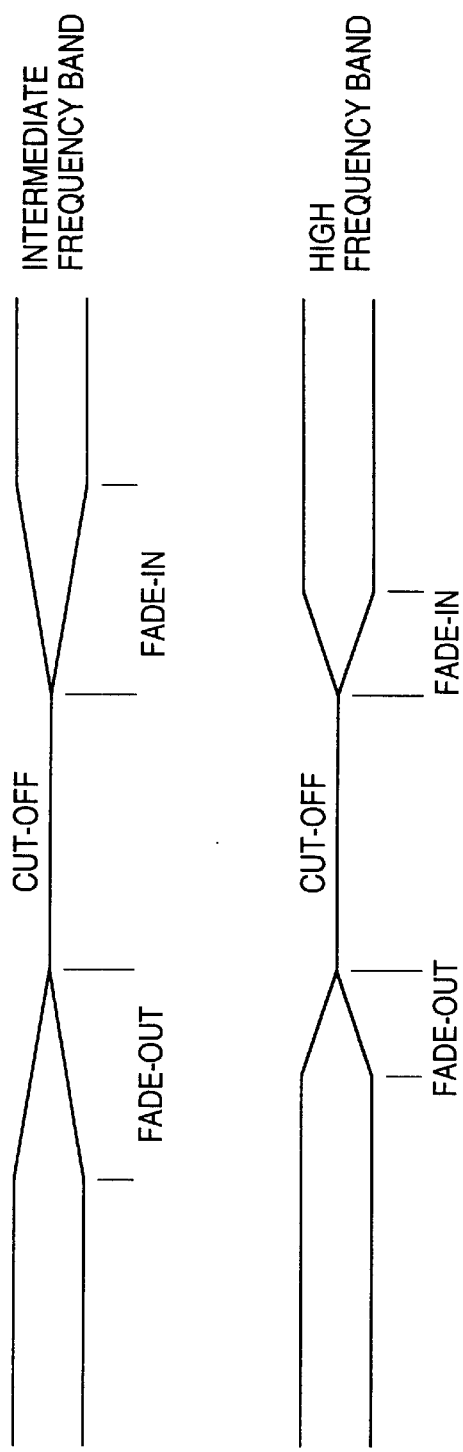
FIG. 17A  FIG. 17B  FIG. 17C  FIG. 17D

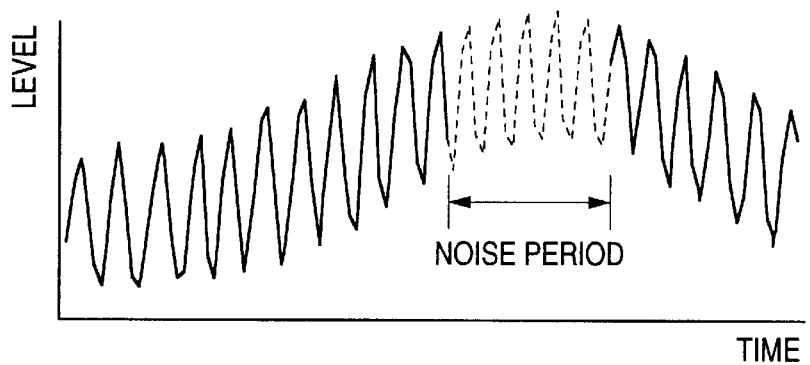
FIG. 35A
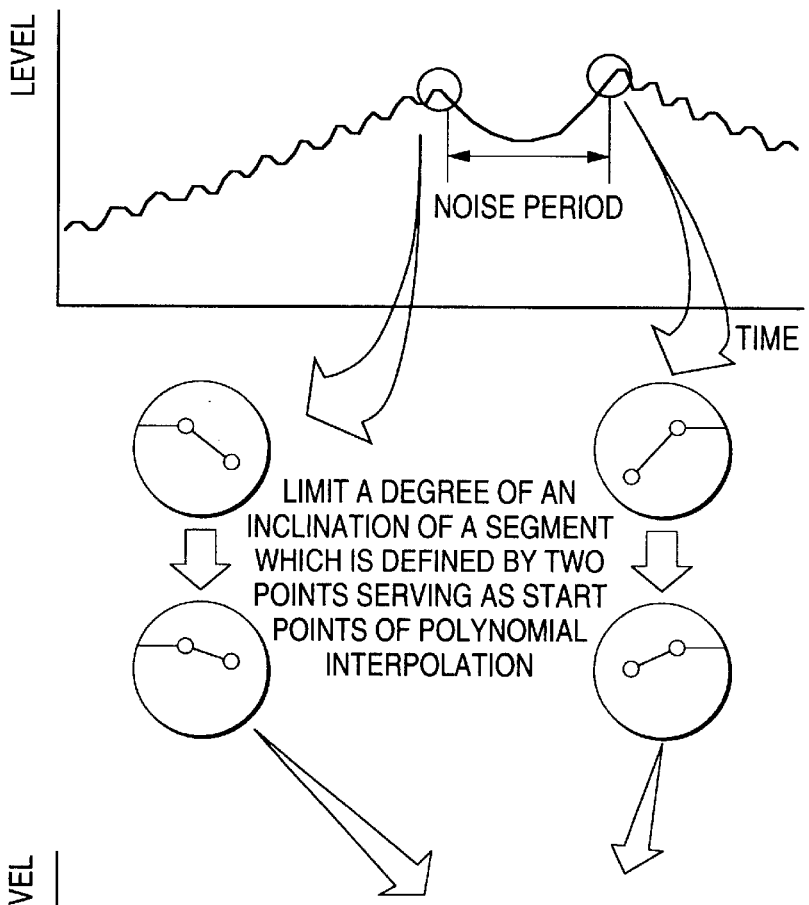
FIG. 35B
FIG. 35C

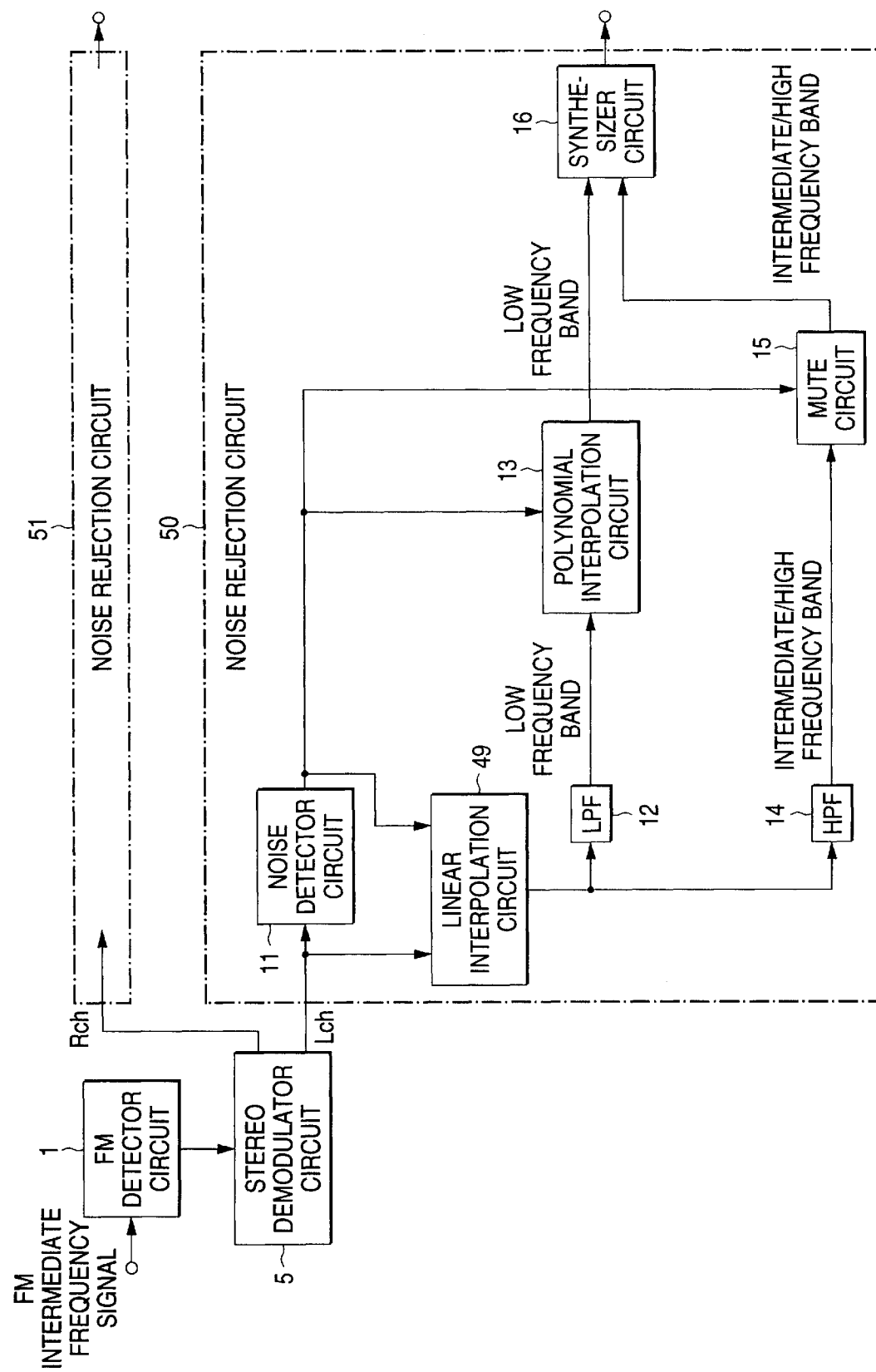

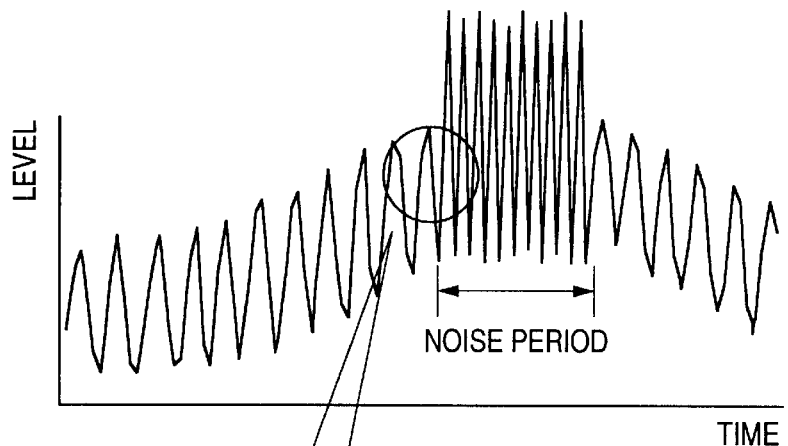
FIG. 46A
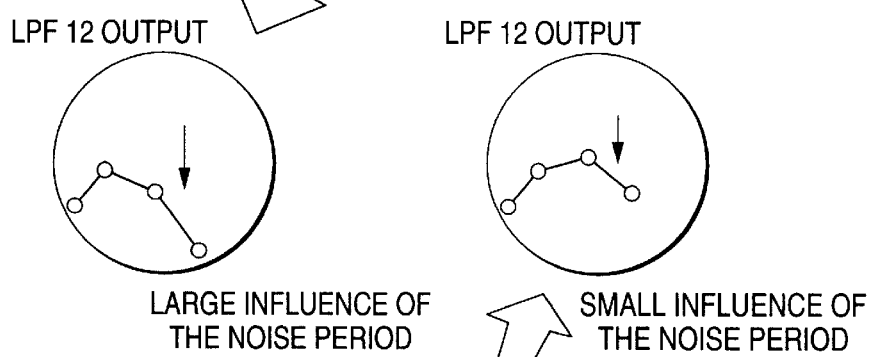
LARGE INFLUENCE OF THE NOISE PERIOD
SMALL INFLUENCE OF THE NOISE PERIOD
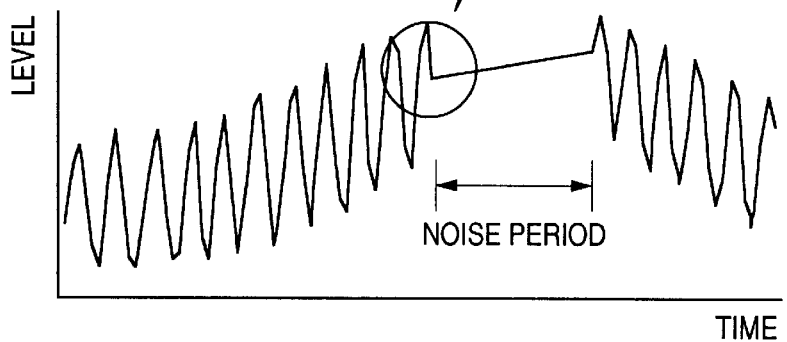
FIG. 46B

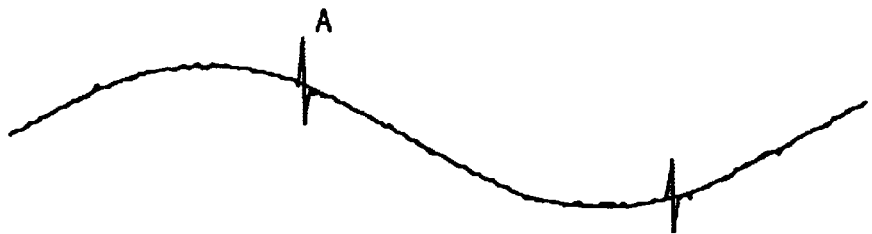
FIG. 55A PRIOR ART
FIG. 55B PRIOR ART
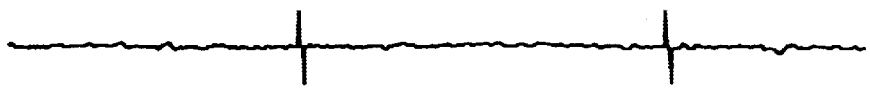
FIG. 55C PRIOR ART
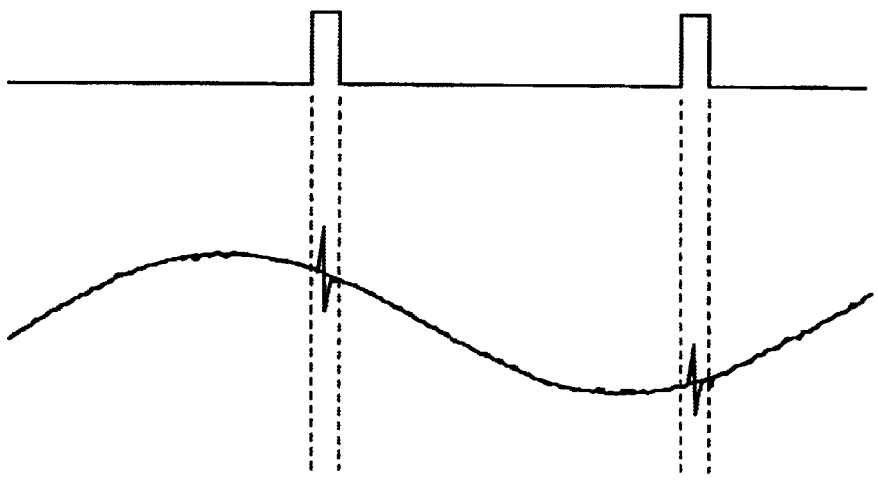
FIG. 55D PRIOR ART
FIG. 55E PRIOR ART
FIG. 55F PRIOR ART

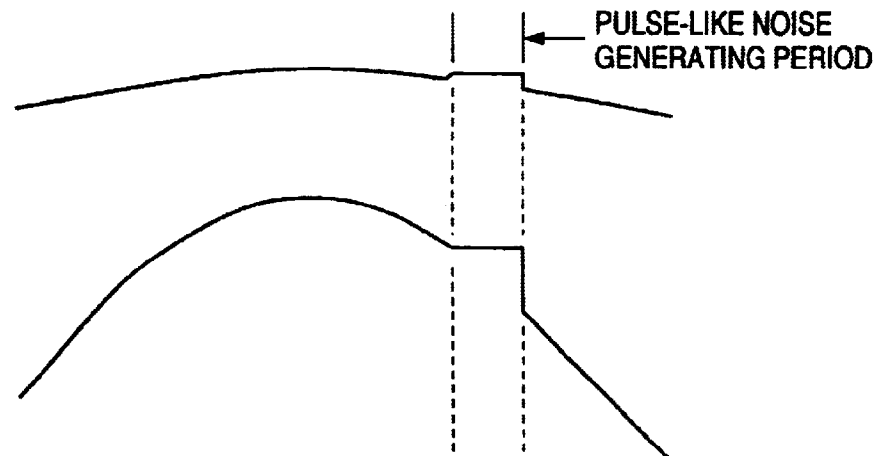
*FIG. 56A*
PRIOR ART
*FIG. 56B*
PRIOR ART
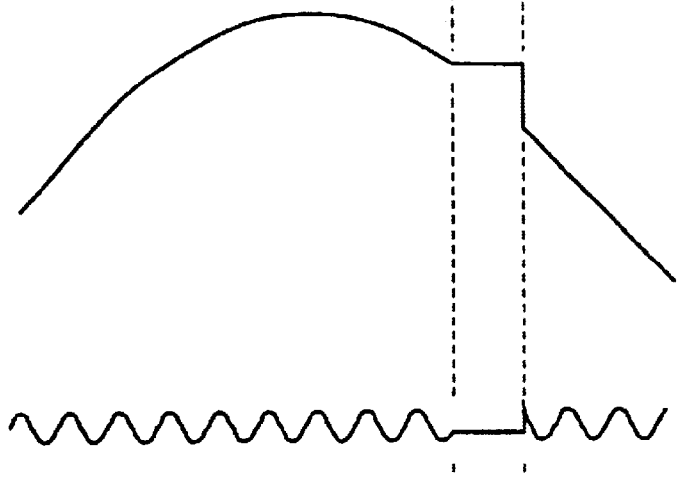
*FIG. 56C*
PRIOR ART
*FIG. 56D*
PRIOR ART
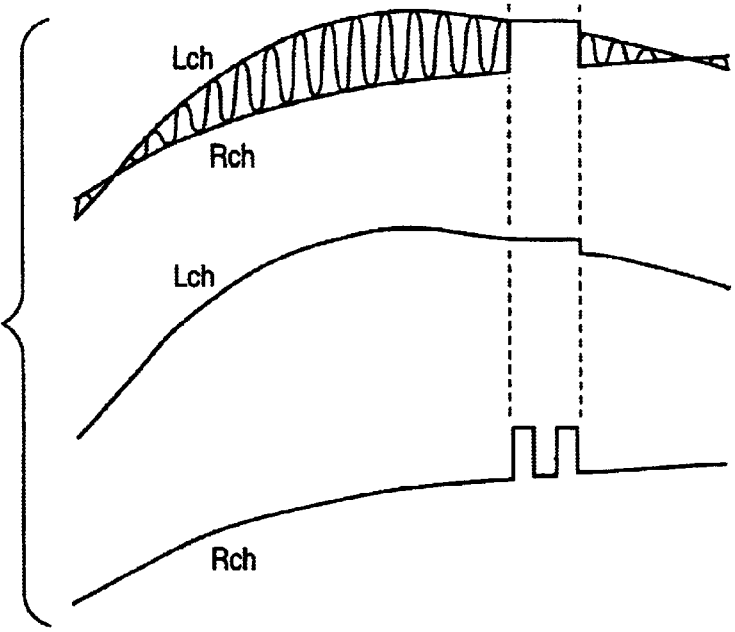

PULSE NOISE PERIOD

PULSE NOISE PERIOD

LOW FREQUENCY BAND INTERPOLATION SIGNAL

PULSE NOISE PERIOD

HIGH FREQUENCY BAND INTERPOLATION SIGNAL

PULSE NOISE PERIOD

INTERPOLATION PERIOD

PULSE NOISE PERIOD

PULSE NOISE PERIOD
LOW FREQUENCY BAND INTERPOLATION SIGNAL

PULSE NOISE PERIOD
FFT 
HIGH FREQUENCY BAND INTERPOLATION SIGNAL

PULSE NOISE PERIOD

INTERPOLATION PERIOD

AUDIO SIGNAL NOISE REDUCTION SYSTEM

BACKGROUND OF THE INVENTION

The present invention relates to an audio signal noise reduction system and, more particularly, a noise reduction system capable of removing a pulse-like noise (referred to as "pulse-like noise" or "noise" hereinafter) in a car radio, etc., which is caused by an ignition plug of an engine, an window open/close driving motor, etc.

FIG. 53 is a block diagram of a pulse-like noise reduction system in the prior art, which is set forth in Patent Application Publication (KOKAI) Sho 63-87026, for example. In FIG. 53, when receives an FM intermediate frequency signal of an FM receiver, an FM detector circuit 1 outputs a detected signal to a delay circuit 2 formed of an LPF (low-pass filter) which then delays the signal. Then, an output of the delay circuit 2 is supplied to a stereo demodulator circuit 5 via a gate circuit 3 and a level hold circuit 4. The detected signal is supplied to an HPF (high-pass filter) 6 to detect a noise. A noise signal passed through the HPF 6 is amplified by a noise amplifier 7 and then supplied to a noise detector circuit 8.

The noise detector circuit 8 is composed of a rectifier circuit which rectifies an output signal of the noise amplifier 7. An output of the noise detector circuit 8 is supplied to a waveform shaping circuit 9 and an integration circuit 10. The waveform shaping circuit 9 converts the output of the noise detector circuit 8 into a pulse with a predetermined time width and supplies the pulse to the gate circuit 3. The gate circuit 3, when driven by the pulse which is supplied from the waveform shaping circuit 9 to the gate circuit 3, is brought into its signal cut-off state. In this signal cut-off state, a delayed output level being detected immediately before the signal cut-off is held by the level hold circuit 4 and then supplied to the stereo demodulator circuit 5. Hence, generation of a spike due to sudden change in potential can be prevented. An integration circuit 10 outputs a direct current signal in answer to the noise level by smoothing the output of the noise detector circuit 8 and then feeds back it to the noise amplifier 7, whereby an AGC loop is constructed.

The delay circuit 2 is provided to compensate a time period ranging from a time point when the pulse-like noise is supplied to the HPF 6 to a time point when the gate circuit 3 is brought into its cut-off state. Since an Lch (left channel) signal and an Rch (right channel) which are balanced-modulated around (Lch+Rch)/2 by using a frequency of 38 kHz, as shown in FIG. 54, are input into the stereo demodulator circuit 5, Lch and Rch signals can be picked out separately from the stereo demodulator circuit 5 by virtue of the time division at 38 kHz, for example.

FIG. 55 is a view showing an operation of the noise reduction system in the prior art. Assume that the output signal of the FM detector circuit 1 is such a signal that includes the pulse-like noise (symbol A) shown in FIG. 55A, a high frequency component of the output signal of the FM detector circuit 1 is extracted by the HPF 6, so that a signal shown in FIG. 55B can be detected. An output signal of the HPF 6 is amplified by the noise amplifier 7, then rectified by the noise detector circuit 8, and then converted into the pulse with a predetermined time width, as shown in FIG. 55C, by the waveform shaping circuit 9. The gate circuit 3 brings a period of the pulse-like noise (referred to as a "pulse-like noise period" or "noise period" hereinafter) of the signal which is delayed by a predetermined time by the delay circuit 2, as shown in FIG. 55D, into a cut-off state, as shown in FIG. 55E. The level hold circuit 4 removes the pulse-like noise contained in the original signal by holding the level, which is detected immediately before the cut-off, during the cut-off period of the output of the gate circuit 3, as shown in FIG. 55F.

Since the pulse-like noise reduction system in the prior art is constructed as mentioned above, the pulse-like noise can be rejected. However, if the signal has an amplitude to some extent, discontinuity of the signal occurs at the end of the holding period, as shown in FIG. 56B, because of preceding value holding process, i.e., because a value detected immediately before the start of the holding period is held. As a result, the noise cannot be satisfactorily removed.

In addition, if the signal contains a high frequency component, the signal becomes discontinuous at both the beginning and end of the holding period, as shown in FIG. 56C, because of the preceding value holding process. Therefore, in some cases the presence of the noise rejection process is conspicuous in hearing sense.

Moreover, since the preceding value holding process is carried out before the stereo demodulation, there has been such a problem that, if there is a difference between the signals on both channels, signal portions which are largely different from the beginning and end of the process are caused on one channel, as shown in FIG. 56D, because of the preceding value holding process, and others.

SUMMARY OF THE INVENTION

The present invention has been made to overcome the above problems, and it is an object of the present invention to provide a noise reduction system which is capable of removing pulse-like noises from an audio signal without fail after stereo demodulation, and also causing no discontinuity between removed regions and their preceding and succeeding regions even if the audio signal contains a high frequency component.

An audio signal noise reduction system according to the present invention comprises a noise detecting means for detecting a noise of an audio signal and outputting a detection signal indicating a start time and an end time of a noise period of the noise; a first filter means for extracting a low frequency component of the audio signal; a low frequency band interpolation means for polynomial-interpolating the noise period of the low frequency component being extracted; a second filter means for extracting intermediate and high frequency components of the audio signal; a means for suppressing a level of the noise period of the intermediate and high frequency components being extracted; and a signal synthesizing means for synthesizing the low frequency component, whose noise period is polynomial-interpolated, and the intermediate and high frequency components, the level of whose noise period is suppressed, to output the audio signal.

In this audio signal noise reduction system, since the low frequency component of the audio signal is extracted by the low-pass filter means and then the noise period from which the pulse-like noise is detected is polynomial-interpolated, the protruded interpolation signal is never derived and also the signal does not become extremely discontinuous before and after the noise period at all. In addition, since the intermediate and high frequency components of the audio signal are extracted by the intermediate/high-pass filter, then the level of the noise period of the intermediate and high frequency components is suppressed, and then the intermediate and high frequency components are synthesized with the low frequency component which is polynomial-interpolated, the audio signal from which the noise is completely removed can be derived.

Further, since the noise period is interpolated and suppressed independently every channel after the stereo demodulation, no discrepancy is caused before and after the noise period even if there is difference between signals over a plurality of channels.

An audio signal noise reduction system comprises a noise detecting means for detecting a noise of an audio signal and outputting a detection signal indicating a start time and an end time of a noise period of the noise; a first filter means for extracting a low frequency component of the audio signal; a limiter means for limiting a degree of an inclination of a segment serving as a start point of the noise period of the low frequency component being extracted; a means for polynomial-interpolating the noise period of the low frequency component in which the degree of the inclination of the segment serving as the start point of the noise period is limited; a second filter means for extracting intermediate and high frequency components of the audio signal; a means for suppressing a level of the noise period of the intermediate and high frequency components being extracted; and a signal synthesizing means for synthesizing the low frequency component, whose noise period is polynomial-interpolated, and the intermediate and high frequency components, the level of whose noise period is suppressed, to output the audio signal.

According to the above configuration, the polynomial interpolation is carried out after the low frequency component is extracted from the audio signal by the low-pass filter and then the degree of the inclination of the segment which is defined by two respective preceding and succeeding points of the noise period serving as the polynomial interpolation of the noise period is limited by the limiter means. Therefore, unless the cut-off characteristic of the LPF which extracts the low frequency component is set to be steep, the protruded interpolation signal is never derived and no prominent discontinuity is caused at the start and end points of the noise period. In addition, since the intermediate frequency component is extracted from the audio signal by the intermediate/high-pass filter, then the level of the noise period of the intermediate and high frequency components is suppressed, and then the intermediate and high frequency components are synthesized with the low frequency component which is polynomial-interpolated, the audio signal from which the noise is completely removed can be derived.

An audio signal noise reduction system comprises a noise detecting means for detecting a noise of an audio signal and outputting a detection signal indicating a start time and an end time of a noise period of the noise; a linear interpolation means for linear-interpolating the noise period of the audio signal; a first filter means for extracting a low frequency component of the audio signal being linear-interpolated; a means for polynomial-interpolating the noise period of the low frequency component being extracted; a second filter means for extracting intermediate and high frequency components of the audio signal being linear-interpolated; a means for suppressing a level of the noise period of the intermediate and high frequency components being extracted; and a signal synthesizing means for synthesizing the low frequency component, whose noise period is polynomial-interpolated, and the intermediate and high frequency components, the level of whose noise period is suppressed, to output the audio signal.

According to the above configuration, since the low frequency component is extracted and then the polynomial interpolation is executed after the noise period of the audio signal has been linear-interpolated previously, the inclination of the segment defined by two preceding and succeeding points of the noise period serving as the start points of the polynomial interpolation can be made small in comparison with the case where the low frequency component is extracted by the LPF while containing the pulse-like noise as it is. Therefore, the protruded interpolation signal is never generated and no remarkable discontinuity of the signal is caused at the start and end of the noise period. In addition, since the intermediate frequency component is extracted from the audio signal by the intermediate/high-pass filter, then the level of the noise period of the intermediate and high frequency components is suppressed, and then the intermediate and high frequency components are synthesized with the low frequency component which is polynomial-interpolated, the audio signal from which the noise is completely removed can be derived.

An audio signal noise reduction system comprises a noise detecting means for detecting a noise of an audio signal and outputting a detection signal indicating a start time and an end time of a noise period of the noise; a linear interpolation means for linear-interpolating the noise period of the audio signal; a first filter means for extracting a low frequency component of the audio signal being linear-interpolated; a limiting means for limiting a degree of an inclination of a segment serving as a start point of the noise period of the low frequency component being extracted; a means for polynomial-interpolating the noise period of the low frequency component in which the degree of the inclination of the segment serving as the start point of the noise period is limited; a second filter means for extracting intermediate and high frequency components of the audio signal being linear-interpolated; a means for suppressing a level of the noise period of the intermediate and high frequency components being extracted; and a signal synthesizing means for synthesizing the low frequency component, whose noise period is polynomial-interpolated, and the intermediate and high frequency components, the level of whose noise period is suppressed, to output the audio signal.

According to the above configuration, since the low frequency component is extracted and then the polynomial interpolation is executed after the noise period of the audio signal has been linear-interpolated previously, the inclination of the segment defined by two preceding and succeeding points of the noise period serving as the start points of the polynomial interpolation can be made small in comparison with the case where the low frequency component is extracted by the LPF while containing the pulse-like noise as it is. Therefore, the protruded interpolation signal is never generated and no remarkable discontinuity of the signal is caused at the start and end of the noise period. In addition, since the intermediate frequency component is extracted from the audio signal by the intermediate/high-pass filter, then the level of the noise period of the intermediate and high frequency components is suppressed, and then the intermediate and high frequency components are synthesized with the low frequency component which is polynomial-interpolated, the audio signal from which the noise is completely removed can be derived.

An audio signal noise reduction system comprises a noise detecting means for detecting a noise of an audio signal and outputting a detection signal indicating a start time and an end time of a noise period of the noise; a linear interpolation means for linear-interpolating the noise period of the audio signal; a first filter means for extracting a low frequency component of the audio signal being linear-interpolated; a second filter means for extracting intermediate and high frequency components of the audio signal being linear-interpolated; a means for suppressing a level of the noise period of the intermediate and high frequency components being extracted; and a signal synthesizing means for synthesizing the low frequency component being extracted and the intermediate and high frequency components, the level of whose noise period is suppressed, to output the audio signal.

According to the above configuration, the low frequency component is extracted by the LPF after the noise period of the audio signal has been linear-interpolated in advance, and then such low frequency component and the intermediate and high frequency components which are extracted from the linear-interpolated audio signal and whose noise period is suppressed in level are synthesized. Therefore, smoothness of the signal lacks rather than the case where the noise period of the low frequency component is polynomial-interpolated, but the audio signal from which the noise is completely removed can be derived.

The second filter means for extracting intermediate and high frequency components of the audio signal is composed of a delay means for delaying the audio signal by the same amount as that in the first filter means, and a subtracting means for subtracting the low frequency component extracted by the first filter means from the audio signal being delayed.

According to the above configuration, the second filter means for extracting intermediate and high frequency components can be accomplished with a simple configuration.

An audio signal noise reduction system further comprises a third filter means for extracting an intermediate frequency component from the intermediate and high frequency components which are extracted by the second filter means; a fourth filter means for extracting a high frequency component from the intermediate and high frequency components; a means for suppressing levels of noise periods of the intermediate frequency component and the high frequency component being extracted respectively; and a signal synthesizing means for synthesizing the low frequency component, whose noise period is polynomial-interpolated, and the intermediate frequency component and the high frequency component, the levels of whose noise periods are suppressed, to output the audio signal.

According to the above configuration, the third and fourth filter means for separating the intermediate and high frequency components being extracted by the second filter means into the intermediate frequency component and the high frequency component can be implemented with a simple structure.

The means for suppressing a level of the noise period of the intermediate and high frequency components being extracted by the second filter means, includes a muting means for attenuating the noise period of the intermediate and high frequency components, and a fade-out/in means for fading out the intermediate and high frequency components immediately before the noise period and fading in them immediately after the noise period, otherwise an ON/OFF means for turning OFF the intermediate and high frequency components at a beginning of the noise period and turning ON them at an end of the noise period.

According to the above configuration, since the rejecting means can be employed selectively according to the noise component contained in the intermediate and high frequency components, the noise can be rejected without damage of the audio signal.

The means for suppressing the noise period of the intermediate frequency component which is extracted by the third filter means, includes a fade-out/in means for fading out the intermediate frequency component immediately before the noise period and fading in it immediately after the noise period, and an ON/OFF means for turning OFF the intermediate frequency component at a beginning of the noise period and also turning ON it at an end of the noise period, otherwise a level down means for suppressing a level of the noise period, and the means for suppressing the level of the noise period of the high frequency component being extracted by the fourth filter means includes a fade-out/in means for fading out the high frequency component immediately before the noise period and fading in it immediately after the noise period.

According to the above configuration, the noise components contained in the noise period of the intermediate frequency component and the high frequency component respectively can be rejected effectively.

Fade-out/in characteristics of the fade-out/in means are set like a saturation curve which saturates from a pass-band region toward a cut-off region respectively.

According to the above configuration, discontinuity between the noise period and the signals at the start and end of the noise period can be reduced.

An audio signal noise noise reduction system comprises a noise detecting means for detecting a noise which is mixed into an audio signal; a first delay means for providing a delay amount generated in the noise detecting means to the noise signal; a first filter means for extracting a low frequency component of the audio signal being output from the first delay means; a low frequency band interpolation means for polynomial-interpolating a period of an output of the first filter means, from which the noise is detected by the noise detecting means; a second delay means for providing a delay amount generated in the low frequency band interpolation means to the audio signal output from the first delay means; a second filter means for extracting a high frequency component of the audio signal output from first delay means; a memory means for storing an output of the second filter means; a high frequency band interpolation means for reading a high frequency component of the period, from which the noise is detected by the noise detecting means, from the memory means and polynomial-interpolating it; and a signal synthesizing means for exchanging the period of the audio signal output from the second delay means, from which the noise is detected by the noise detecting means, with a synthesized signal of an output signal of the low frequency band interpolation means and an output signal of the high frequency band interpolation means.

A low frequency band interpolation signal is generated by extracting the low frequency component of the audio signal by using the low-pass filter and then applying the polynomial interpolation of the low frequency component to the period from which the pulse-like noise is detected. A high frequency band interpolation signal is generated by extracting the high frequency component of the audio signal by using the high-pass filter, then storing it into the memory sequentially for a predetermined period, and then reading the past preceding signal from the memory over the period from which the pulse-like noise is detected. Finally, the low frequency band interpolation signal and the high frequency band interpolation signal are synthesized, and this synthesized signal is exchanged with the original audio signal over the period from which the pulse-like noise is detected.

An audio signal noise noise reduction system comprises a noise detecting means for detecting a noise which is mixed into an audio signal; a first delay means for providing a delay amount generated in the noise detecting means to the noise signal; a first filter means for extracting a low frequency component of the audio signal being output from the first delay means; a low frequency band interpolation means for polynomial-interpolating a period of an output of the first filter means, from which the noise is detected by the noise detecting means; a second delay means for providing a delay amount generated in the low frequency band interpolation means to the audio signal output from the first delay means; a frequency analyzer means for analyzing frequency components of the audio signal output from first delay means; a high frequency component generating means for detecting a single prominent frequency or a plurality of prominent frequencies within a frequency range, which is cut off by the first filter means, of an output signal of the frequency analyzer means immediately before the period, from which the noise is detected by the noise detecting means, and below a Nyquist frequency and then generating a sine wave of the frequency or frequencies; and a signal synthesizing means for exchanging the period of the audio signal output from the second delay means, from which the noise is detected by the noise detecting means, with a synthesized signal of an output signal of the low frequency band interpolation means and an output signal of the high frequency component generating means.

The low requency band interpolation signal is generated by extracting the low frequency component of the audio signal by using the low-pass filter and then applying the polynomial interpolation of the low frequency component to the period from which the pulse-like noise is detected. According to the result of the frequency analysis of the audio signal, the high frequency band interpolation signal is generated by detecting the single prominent frequency or a plurality of prominent frequencies within the frequency range, which is cut off by the low-pass filter means, immediately before the period, from which the pulse-like noise is detected, and below a Nyquist frequency and then generating a sine wave of the frequency or frequencies. Lastly, the low frequency band interpolation signal and the high frequency band interpolation signal are synthesized, and this synthesized signal is exchanged with the original audio signal over the period from which the pulse-like noise is detected.

BRIEF DESCRIPTION OF THE DRAWINGS

FIGS. 7A–7E are views showing an operation of a synthesizer circuit in FIG. 5 of the embodiment 1;

FIG. 11 is a block diagram showing another example of the configuration of the embodiment 1;

FIGS. 13A–13D is a view showing an operation of a fade-out/in circuit in the embodiment 2;

FIGS. 17A–17D are views showing an operation of a fade-out/in circuit in the embodiment 3;

FIGS. 35A–35C are views showing an operation of a limiter circuit in the embodiment 7;

FIG. 36 is a first block diagram showing a configuration of an embodiment 8 of the present invention;

FIGS. 46A–46B are views showing an operation of a linear interpolation circuit in the embodiment 8;

FIGS. 55A–55F are views showing an operation of the pulse-like noise reduction system in the prior art;

FIGS. 56A–56D is a view showing the problem caused by the pulse-like noise reduction system in the prior art.

DETAILED DESCRIPTION OF THE PREFERRED EMBODIMENTS

Embodiments of the present invention will be explained in detail with reference to the accompanying drawings hereinafter.

EMBODIMENT 1

Figure 1:
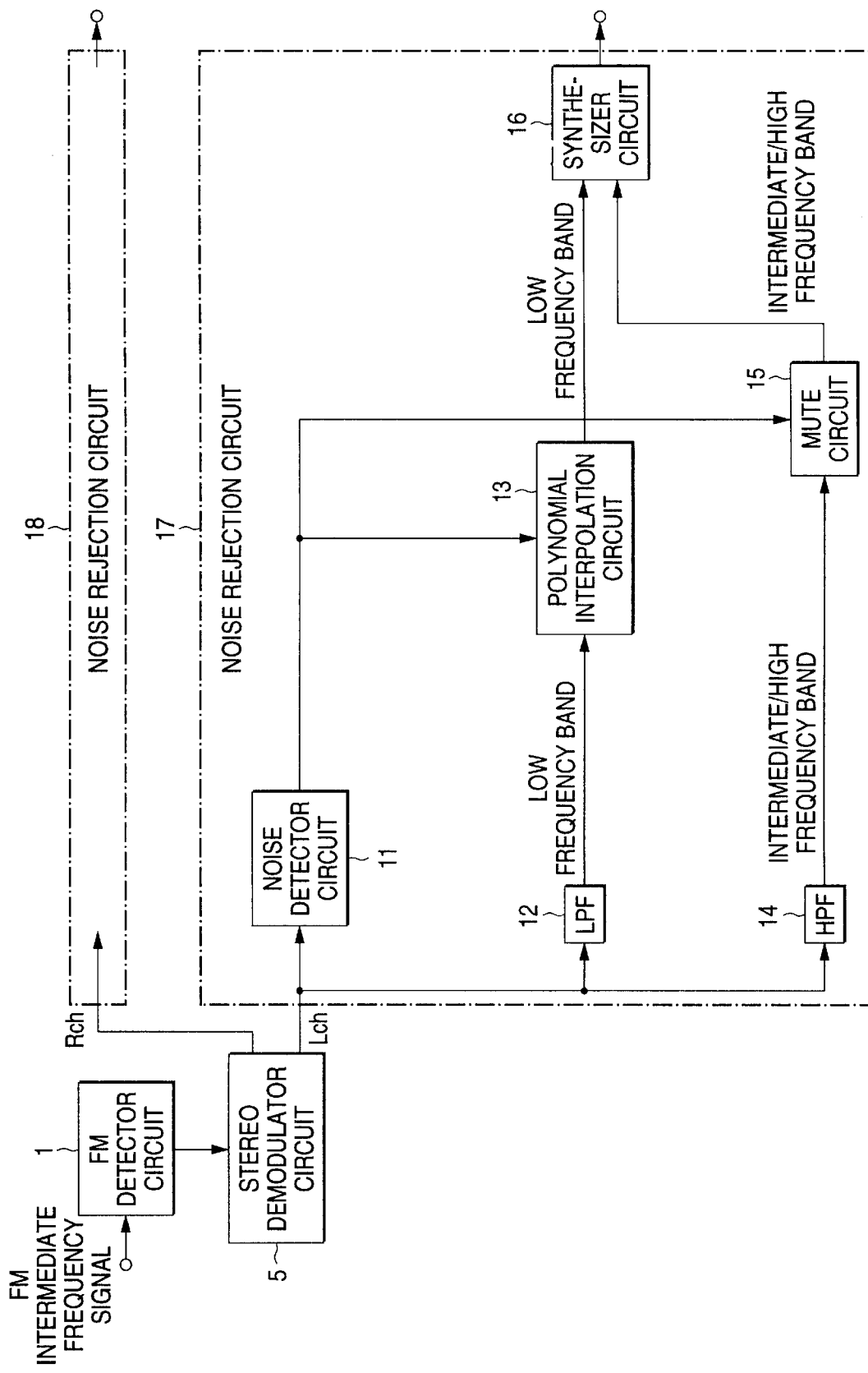
FIG. 1 is a block diagram showing a configuration of an embodiment 1 of the present invention.

FIG. 1 is a block diagram showing a noise reduction system according to an embodiment 1 of the present invention. In FIG. 1, a reference 1 denotes an FM detector circuit; 5, a stereo demodulator circuit; 11, a noise detector circuit; 12, an LPF; 13, a polynomial interpolation circuit; 14, an HPF; 15, a mute circuit; and 16, a synthesizer circuit 16. Thus, a noise rejection circuit 17 for the audio signal output from the stereo demodulator circuit 5 over one channel is constructed by the above constituent elements. A reference 18 denotes another noise rejection circuit. Since the noise rejection circuit 18 has the entirely same configuration as the noise rejection circuit 17, their explanation will be omitted in this disclosure.

Then, an operation will be explained hereunder. When receives an FM intermediate frequency signal from an FM receiver, the FM detector circuit 1 supplies its output to the stereo demodulator circuit 5. Then, the stereo demodulator circuit 5 outputs the audio signals which are separated into Lch and Rch signals. Then, such signals are input into the noise rejection circuits 17, 18 respectively. In the noise rejection circuit 17, in case the pulse-like noise is superposed on the audio signal being input from the stereo demodulator circuit 5, the noise detector circuit 11 outputs detection signals indicating start and end of a noise period of the pulse-like noise to the polynomial interpolation circuit and the mute circuit 15.

Figure 53:
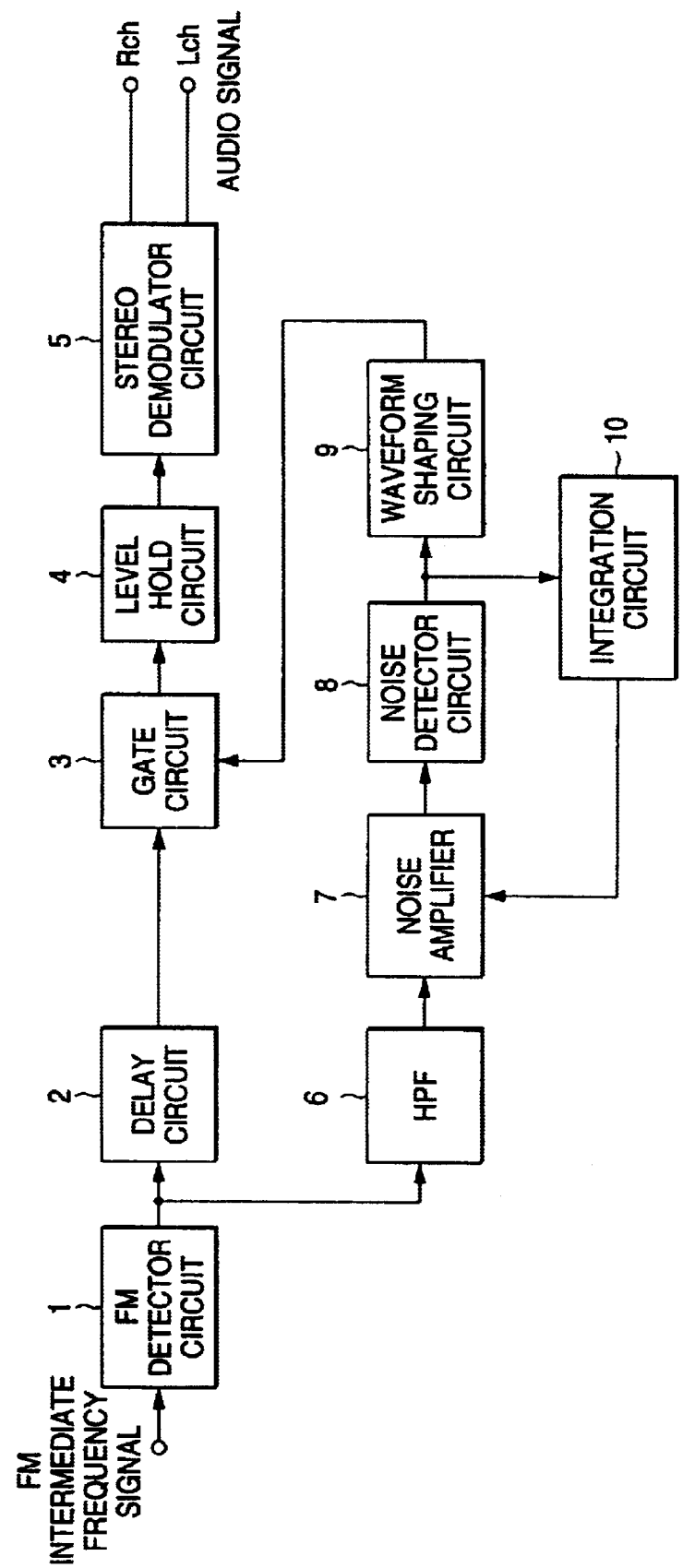
FIG. 53 is a block diagram showing a configuration of a pulse-like noise reduction system in the prior art.
Figure 54:
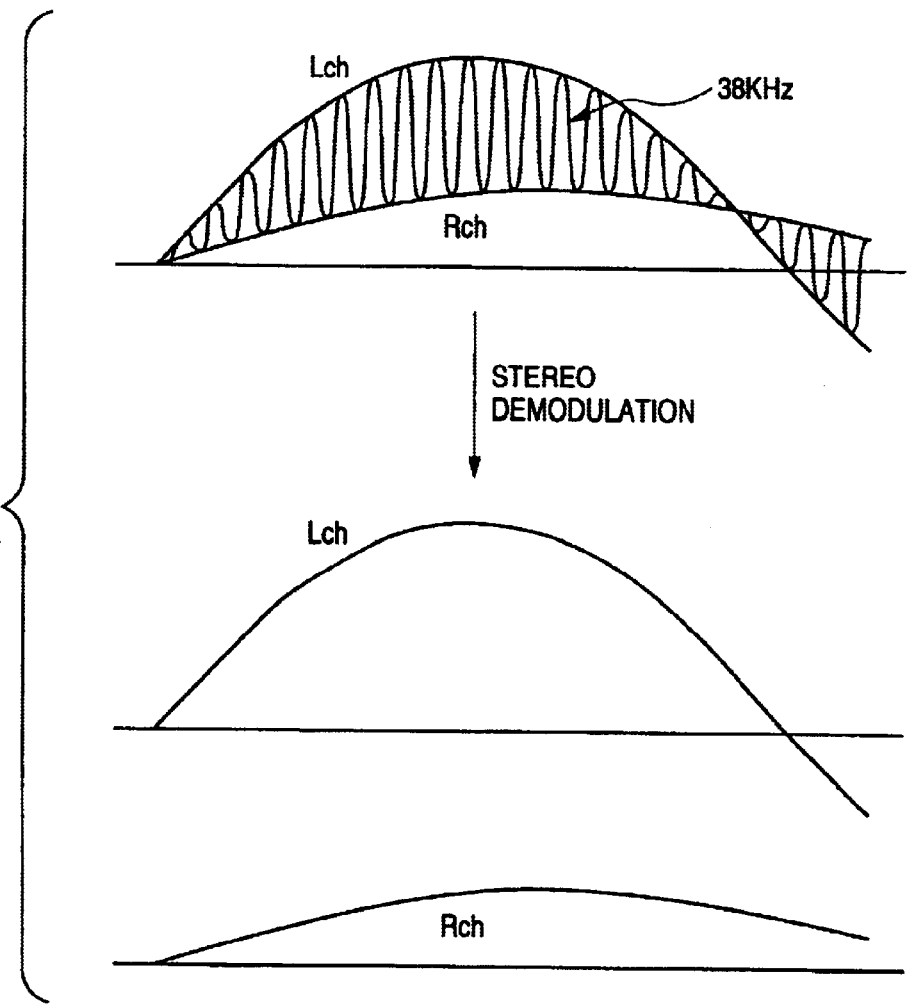
FIG. 54 is a view showing an operation of a stereo demodulator circuit in the pulse-like noise reduction system in the prior art.

As the noise detector circuit 11, for example, there is a circuit like a portion for generating a signal for controlling the gate circuit 3 employed in the prior art shown in FIG. 53, i.e., a portion which is composed of the HPF 6, the noise amplifier 7, the noise detector circuit 8, the waveform shaping circuit 9, and the integration circuit 10. The audio signal output from the stereo demodulator circuit 5 is input into the LPF 12 in which the low frequency component is extracted. The low frequency component of the audio signal, which is extracted by the LPF 12, is input into the polynomial interpolation circuit 13 in which the noise period detected by the noise detector circuit 11 is then interpolated by virtue of polynomial interpolation.

Figure 2A:
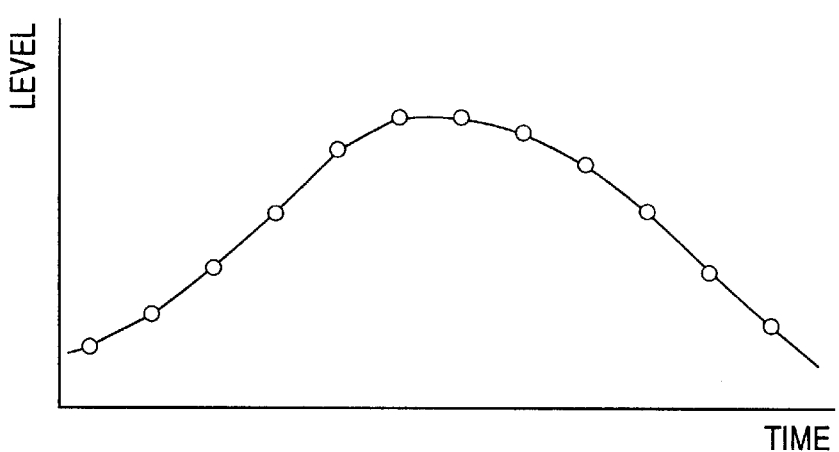
FIGS. 2A–2C are views showing cubic expression interpolation in the embodiment 1.
Figure 2B:
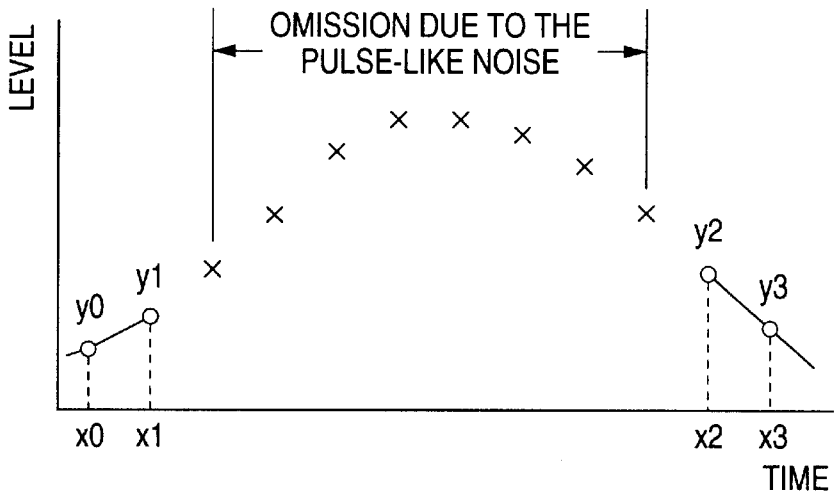
Figure 2C:
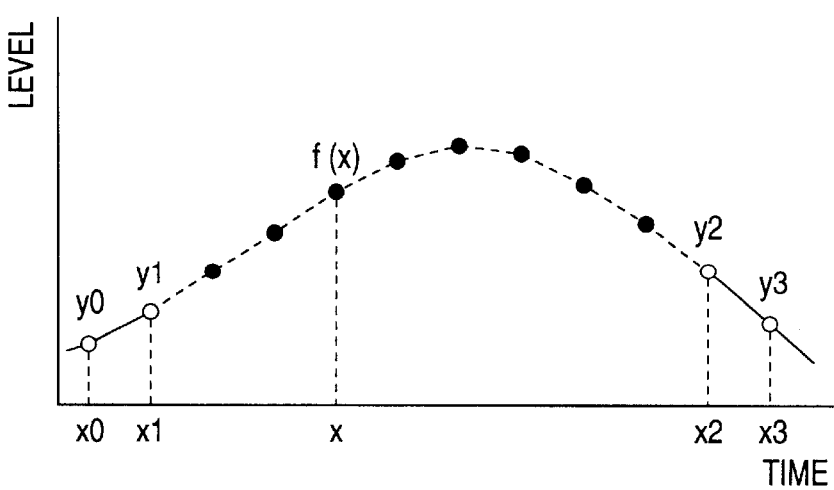

FIG. 2, is a view showing an operation in case cubic expression interpolation as an example of the polynomial interpolation circuit 13 is carried out. FIG. 2A shows an original audio signal, FIG. 2B shows the audio signal into which the pulse-like noise is mixed, and FIG. 2C shows a signal which has been subjected to the polynomial interpolation. More particularly, FIG. 2B shows a state in which the original signal is omitted since the pulse-like noise is mixed in a period from x1 to x2. Such noise period from x1 to x2 is interpolated by the Lagrange's cubic polynomial given in the following.

$$f(x) = \sum_{i=0}^{3} y_i \left[ \frac{\sum_{\substack{j=0 \\ j \neq 0}}^{3} (x - x_j)}{\sum_{\substack{j=0 \\ j \neq 0}}^{3} (x - x_j)} \right]$$

In this case, the interpolation is executed by forming a signal f(x) for the omitted signal portion, as shown in FIG. 2C, based on four points x0, x1, x2 and x3.

Figure 3A:
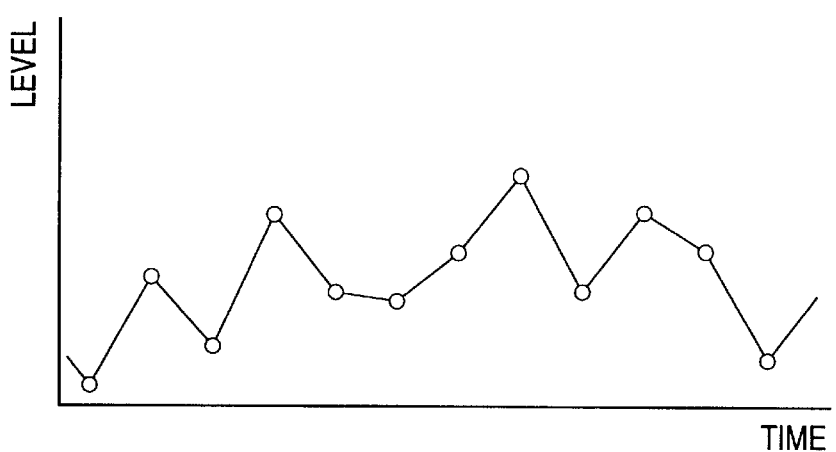
FIGS. 3A–3C are views showing the reason why intermediate and high frequency components must be removed in the embodiment 1.
Figure 3B:
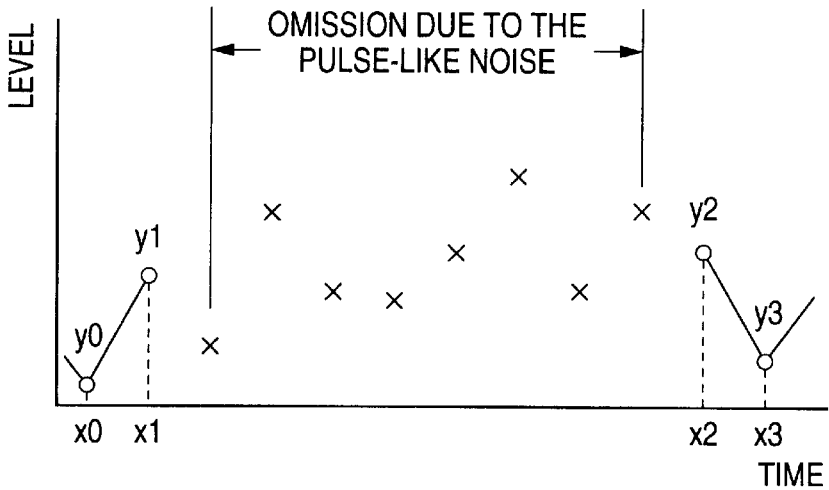
Figure 3C:
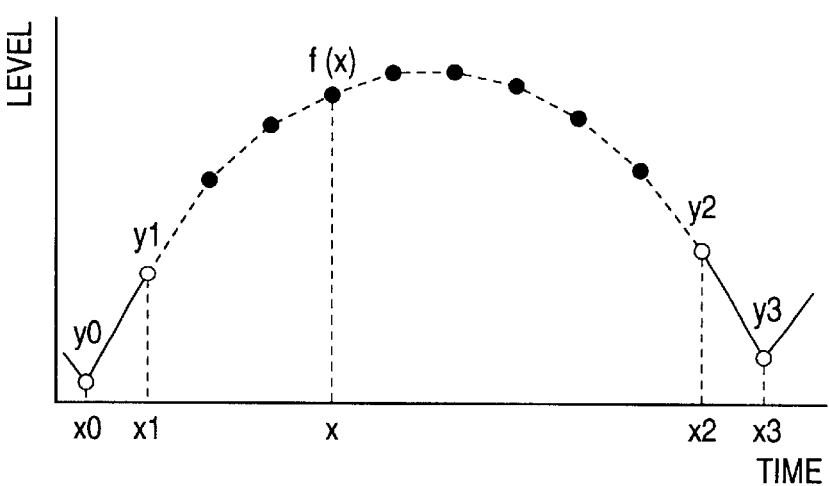

FIGS. 3 and 4 are views illustrating the reason why intermediate and high frequency components are removed by the LPF 12 prior to the polynomial interpolation. FIG. 3 shows an example of the interpolated signal if the polynomial interpolation is performed without removal of a high frequency component by using the cubic expression. More particularly, FIG. 3A shows an original audio signal, FIG. 3B shows an audio signal into which the pulse-like noise is mixed, and FIG. 3C shows an audio signal which has been subjected to the polynomial interpolation. As shown in FIG. 3A, when intermediate and high frequency components are contained in the audio signal and also the audio signal is oscillated, there is a possibility that the signal protrudes considerably according to the conditions, as shown in FIG. 3C, since interpolated data are calculated based on two points, i.e., the start point and the end point of the noise period.

Figure 4A:
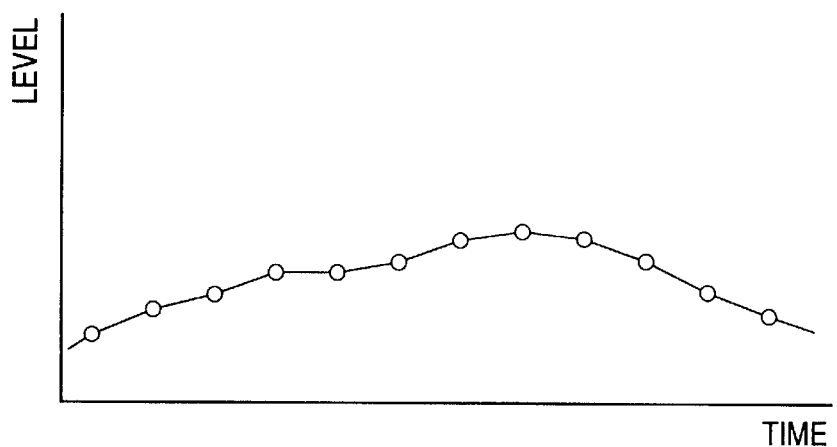
FIGS. 4A–4C are views showing an operation in the case where an LPF is applied to a signal containing a high frequency component in the embodiment 1.
Figure 4B:
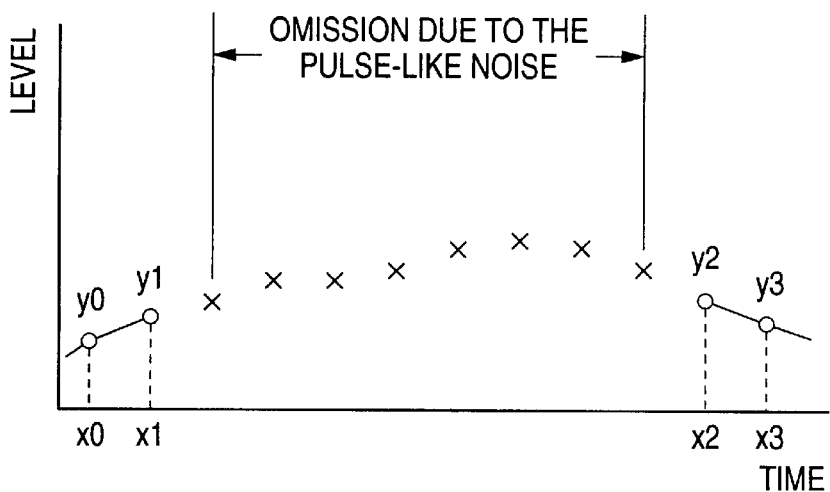
Figure 4C:
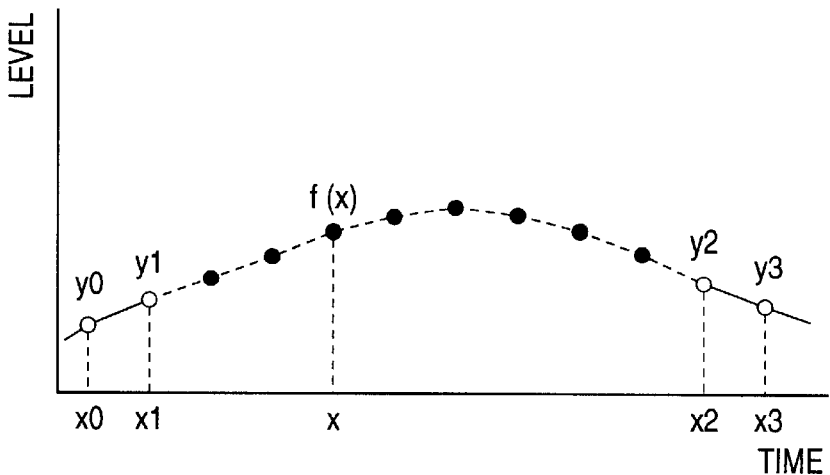

FIG. 4A shows the low frequency component which is detected by removing the intermediate and high frequency components by using the LPF 12 from the audio signal in FIG. 3A. FIG. 4B shows the low frequency component into which the pulse-like noise is mixed. FIG. 4C shows the low frequency component which has been subjected to the polynomial interpolation. In this manner, if the signal is interpolated after the intermediate and high frequency components have been removed, there is no possibility that the signal protrudes considerably.

Figure 5:
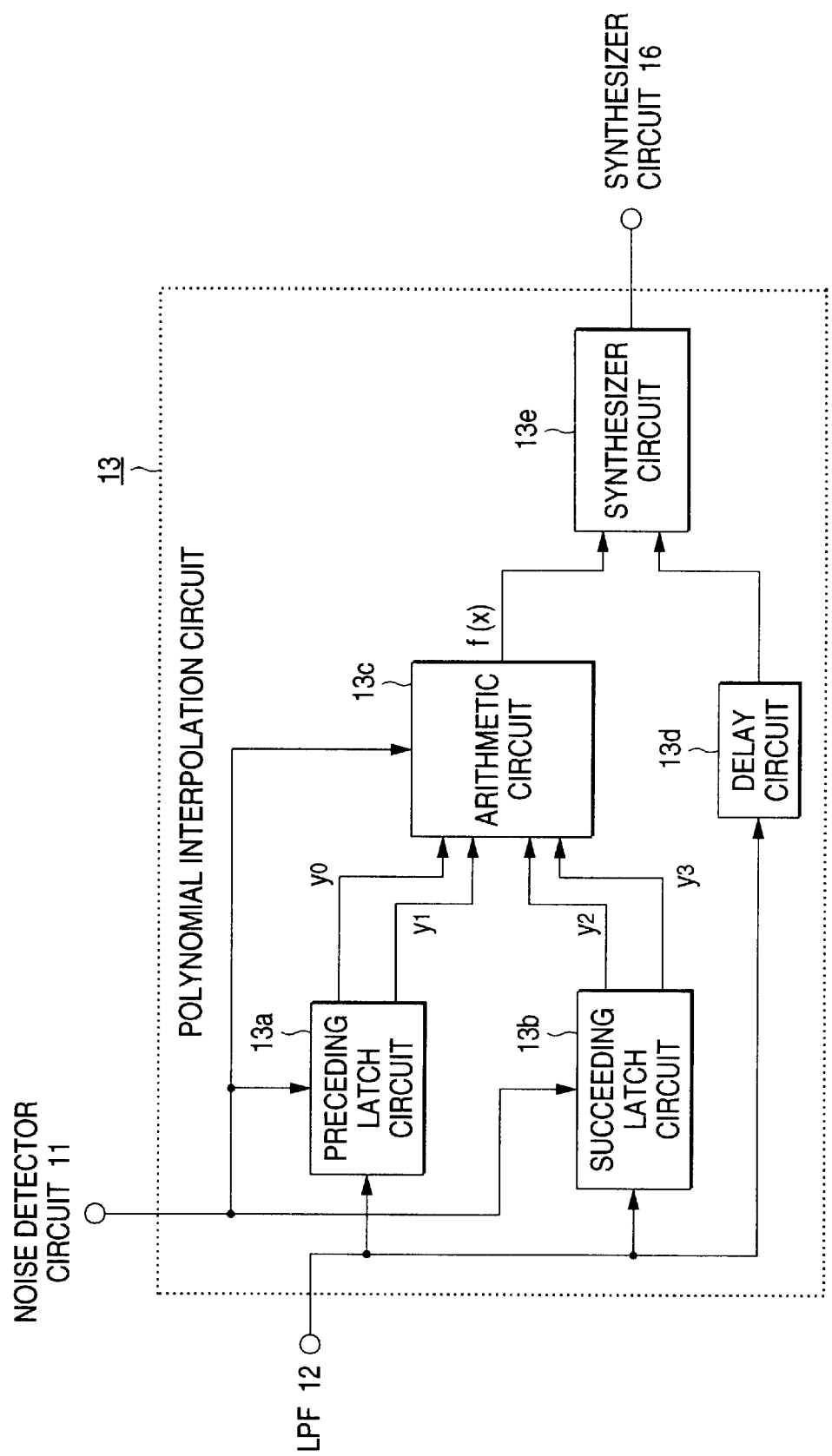
FIG. 5 is a block diagram showing an example of a configuration of a polynomial interpolation circuit in the embodiment 1.

FIG. 5 is a block diagram showing an example of a configuration of the polynomial interpolation circuit 13. This polynomial interpolation circuit 13 comprises a preceding latch 13a for latching levels y1 and y0 at two time points, i.e., the start point x1 of the noise period and the preceding point x0 shown in FIG. 2B, a succeeding latch 13b for latching levels y2 and y3 at two time points, i.e., the end point x2 of the noise period and the succeeding point x3, an arithmetic circuit 13c for generating an interpolation signal by using the Lagrange's cubic polynomial based on levels y0, y1, y2, y3 at these four points, a delay circuit 13d for compensating a delay caused in generating the interpolation signal, and a synthesizer circuit 13e for synthesizing the interpolation signal and the output of the delay circuit 13d.

Figures 6A, 6B, 6C, 6D:
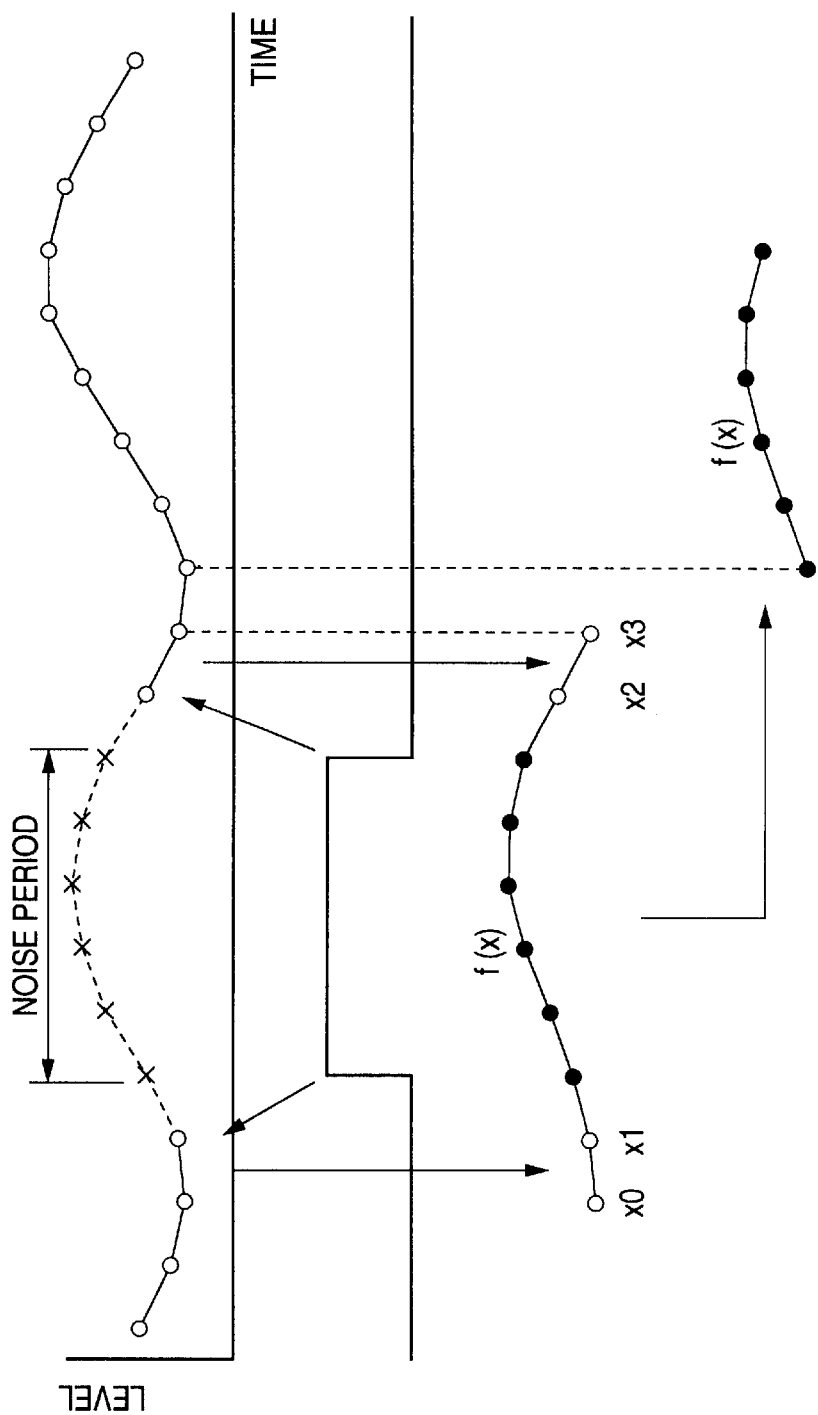
FIGS. 6A–6D are views showing an operation of the polynomial interpolation circuit in the embodiment 1.
Figure 8A:
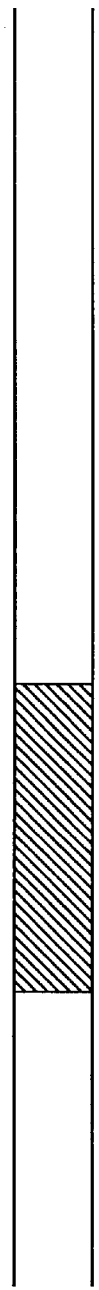
FIGS. 8A–8D are view showing an operation of a mute circuit in the embodiment 1.
Figure 8B:
Figure 8C:
Figure 8D:

FIG. 6 is a view showing an operation of the polynomial interpolation circuit 13. FIG. 6A shows an output of the LPF 12, and FIG. 6B shows the detection signal which is input from the noise detector circuit 11 to the polynomial interpolation circuit 13 to indicate the start point and the end point of the noise period. The preceding latch 13a holds the values y0, y1 at two preceding points x0, x1 based on the start point of the noise period. The succeeding latch 13b holds the values y2, y3 at two succeeding points x2, x3 based on the end point of the noise period. The arithmetic circuit 13c calculates values of the interpolation signal at respective points based on the Lagrange's cubic polynomial and then output them. FIG. 6C shows the interpolation signal. Since calculated results can be output in practice only after the time point x3, the interpolation signal is delayed to a position shown in FIG. 6D. However, in order to avoid an evil influence such that a delay amount is varied according to a length of the noise period, various countermeasures can be employed, e.g., the longest period which is treated as the noise period can be set as a fixed delay amount and then an input timing to the synthesizer circuit 13e is mated with such longest period, etc.

FIG. 7 is a view showing an operation of the synthesizer circuit 13e in the polynomial interpolation circuit 13. FIGS. 7A to 7C show an operation for forming the interpolation signal which has been explained with reference to FIGS. 6A to 6D. FIG. 7C shows the interpolated output signal output from the arithmetic circuit 13c, FIG. 7D shows the low frequency component of the audio signal which is mated with the timing shown in FIG. 7C by the delay circuit 13d, and FIG. 7E shows the low frequency component being output from the synthesizer circuit 13e. In this manner, the synthesized low frequency component shown in FIG. 7E can be derived by replacing the noise period shown in FIG. 7D with the interpolation signal shown in FIG. 7C.

In contrast, the audio signal is input into the HPF 14 shown in FIG. 1, and then the intermediate and high frequency components are extracted by the HPF 14. The mute circuit 15 applies a muting process to the noise period for the intermediate and high frequency components, based on the detection signal being input from the noise detector circuit 11.

FIG. 8 is a view showing an operation of the mute circuit 15. FIG. 8A shows an audio signal input wherein the noise period is given by a shaded area. FIG. 8B shows the noise period in the detection signal which is output from the noise detector circuit 11. FIG. 8C shows the intermediate and high frequency components containing the pulse-like noise, and FIG. 8D shows an output of the mute circuit 15.

Figure 9:
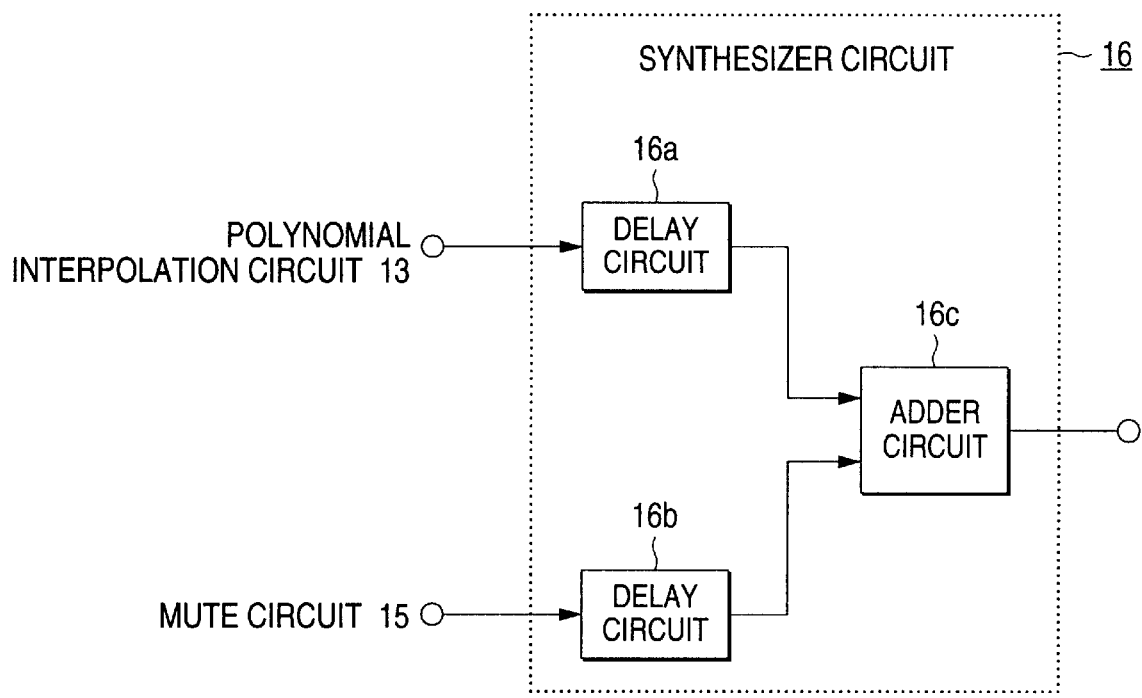
FIG. 9 is a block diagram showing an example of a configuration of the synthesizer circuit in the embodiment 1.

FIG. 9 is a block diagram showing an example of a configuration of the synthesizer circuit 16. Since discrepancy in time due to difference in the amount of delay exists between the low frequency component and the intermediate and high frequency components which are input into the synthesizer circuit 16, such components are added to be synthesized after such discrepancy in time has been corrected. The delay circuit 16a gives a delay to the low frequency component being input from the polynomial interpolation circuit 13. The delay circuit 16b provides a delay to the intermediate and high frequency components which are input from the mute circuit 15. In this case, since the amount of delay is set to coincide with the component which has the larger amount of delay, the delay becomes zero in the delay circuit which handles the frequency component with a larger amount of delay. The low frequency component and the intermediate and high frequency components are input into the adder circuit 16c at the same timing, and then synthesized therein.

Figure 10A:
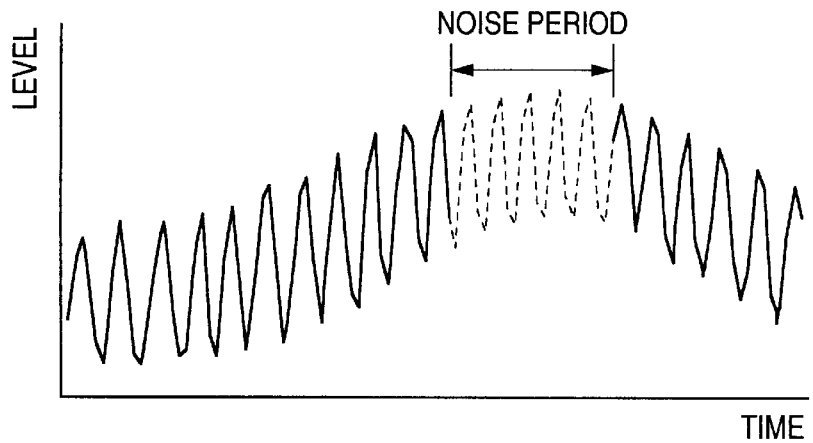
FIGS. 10A–10C are views showing results of the operation of the embodiment 1.
Figure 10B:
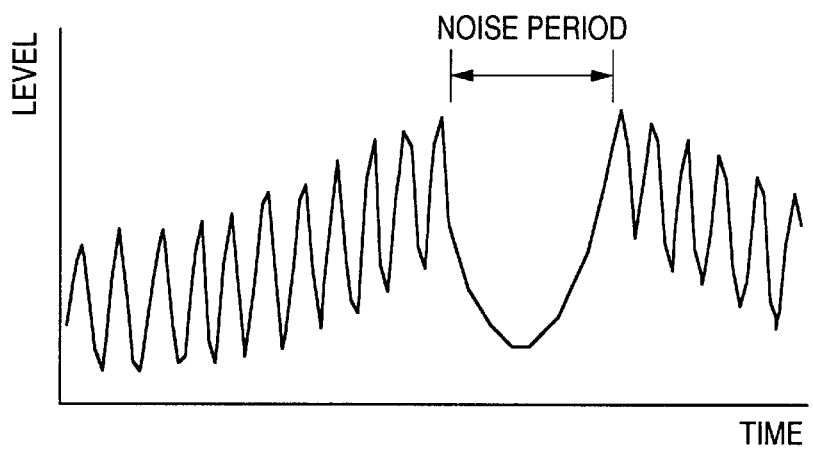
Figure 10C:
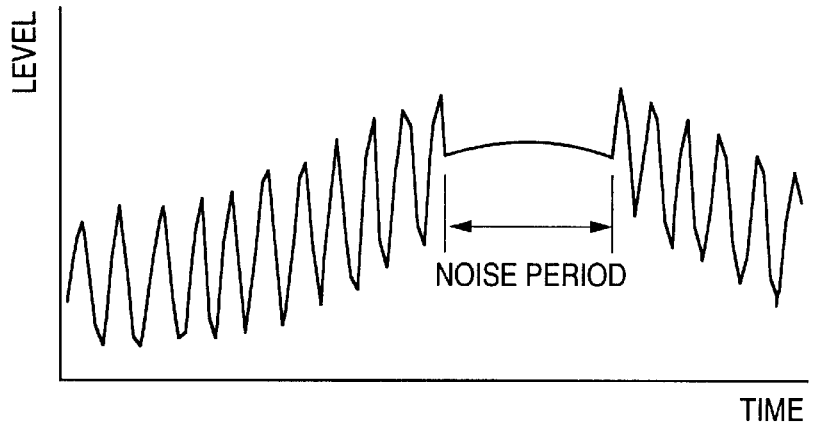

FIG. 10 is a view showing results of the operation of the embodiment 1. FIG. 10A shows the input audio signal wherein a portion indicated by a broken line shows the noise period. FIG. 10B shows the output audio signal in which the noise period is polynomial-interpolated in the state that the intermediate and high frequency components are not removed from the input audio signal. There are some cases where the noise period is given as the protruded interpolation, as shown, in FIG. 10B. FIG. 10C shows the case where the polynomial interpolation is applied to the low frequency component and the noise period for the intermediate and high frequency components is muted, and then resultant components are synthesized according to the embodiment 1. Thus, the pulse-like noise can be removed without damage of the low frequency component.

In the embodiment 1, the noise rejection for the FM stereo signal has been explained. But, in the case of monoral signals, an operation is totally similar to the above merely except that two outputs of the stereo demodulator circuit 5 become totally identical signals.

Similarly, as for the AM signal, as shown in FIG. 11, since there is no change in the process for the audio signal as an output of an AM detector circuit 19 and subsequent processes, a configuration of the noise rejection circuit 17 is identical to that shown in FIG. 1 and also an operation thereof is basically similar to that explained in FIG. 1.

In the embodiment 1, the example in which the noise detector circuit 11 is applied to the stereo-demodulated audio signal has been explained. In this case, even if the noise detector circuit is placed before the stereo demodulator circuit 5 to detect the noise, functions of the noise rejection circuit are not changed at all. This is also true of embodiments 2 to 10 described later.

EMBODIMENT 2

Figure 12:
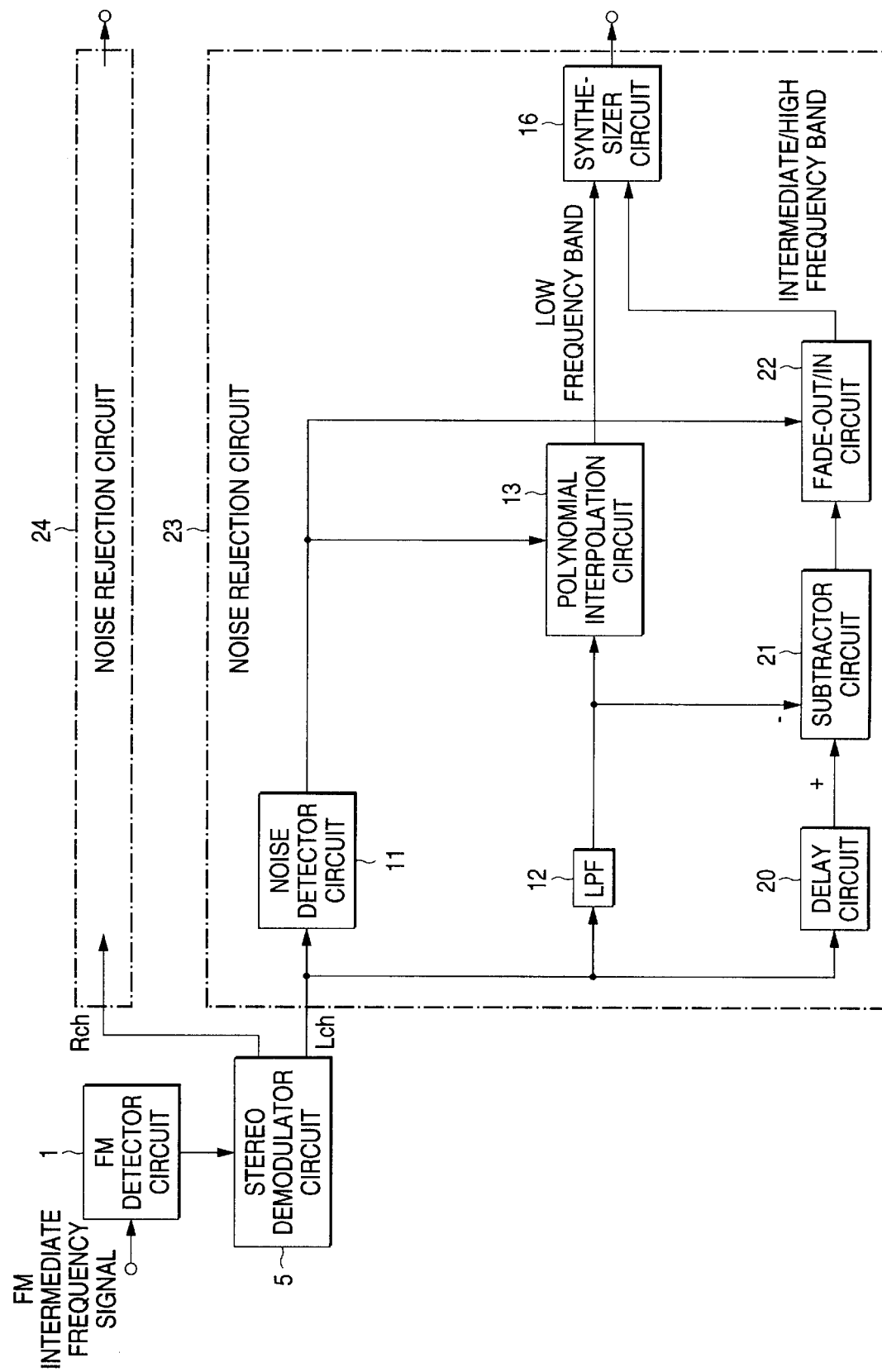
FIG. 12 is a block diagram showing a configuration of an embodiment 2 of the present invention.

FIG. 12 is a block diagram showing a configuration of a noise rejection circuit according to an embodiment 2 of the present invention. In FIG. 12, same references as those in FIG. 1 indicate the same or similar parts respectively. In FIG. 12, a reference 20 denotes a delay circuit; 21, a subtractor circuit; and 22, a fade-out/in circuit. A noise rejection circuit 23 for the audio signal which is input from the stereo demodulator circuit 5 over one channel is composed of the noise detector circuit 11 to the polynomial interpolation circuit 13, the synthesizer circuit 16, and the delay circuit 20 to the fade-out/in circuit 22. A reference 24 denotes a noise rejection circuit for the audio signal over the other channel. Since a configuration of the noise rejection circuit 24 is completely identical to the noise rejection circuit 23, its explanation will be omitted in this disclosure.

In this embodiment 2, the HPF 14 employed in the embodiment 1 is composed of the delay circuit 20 and the subtractor circuit 21.

Next, operations of parts which are different from those in the embodiment 1 will be explained hereunder.

The audio signal is input into the noise detector circuit 11 and the delay circuit 20, and is delayed by the delay circuit 20 by the same amount as a delay amount caused in the LPF 12. The subtractor circuit 21 subtracts an output of the LPF 12 from the delayed audio signal to pick out the intermediate and high frequency components from the audio signal. The fade-out/in circuit 22 executes level adjustment of the audio signal in such a manner that, based on the detection signal of the noise detector circuit 11, the audio signal can be linearly faded out immediately before the noise period of the intermediate and high frequency components and then linearly faded in immediately after the noise period.

FIG. 13 is a view showing an operation of the fade-out/in circuit 22. FIG. 13A shows the input audio signal wherein the noise period is indicated by oblique lines. FIG. 13B shows the noise period in the detection signal of the noise detector circuit 11. FIG. 13C shows the intermediate and high frequency components output from the subtractor circuit 21, which is delayed by an amount equivalent to the delay amount in the LPF 12. FIG. 13D shows the intermediate and high frequency components which are output from the fade-out/in circuit 22. Since the start point of the noise period is a clue in starting the fade-out, at least a time period corresponding to the fade-out period is needed as the delay amount in FIG. 13C.

Figure 14A:
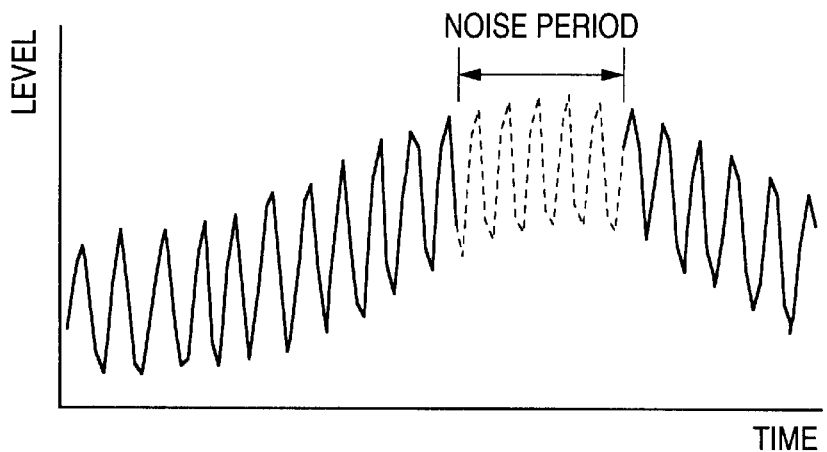
FIGS. 14A–14C are views showing results of the operation of the embodiment 2.
Figure 14B:
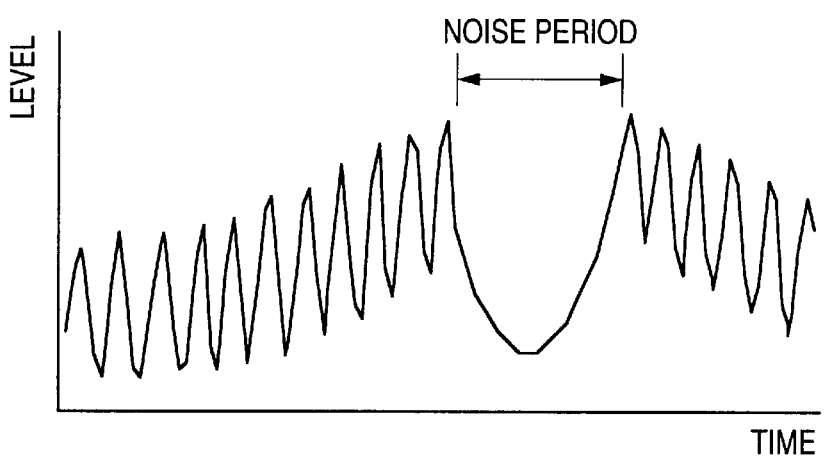
Figure 14C:
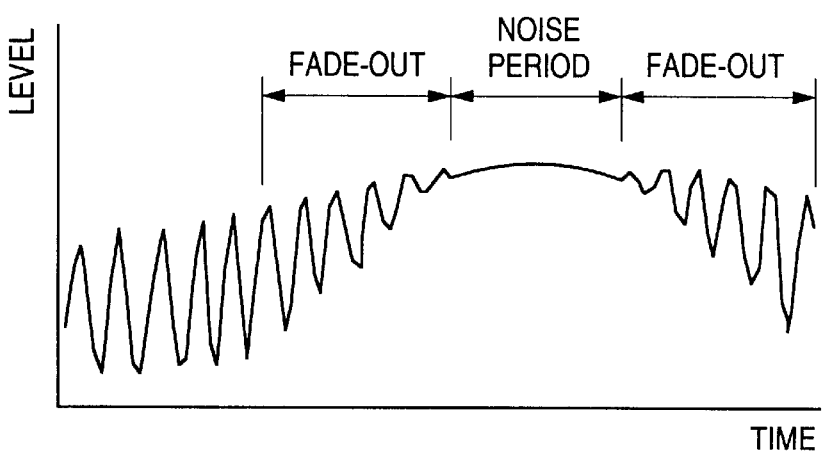

FIG. 14 is a view showing results of the operation of the embodiment 2. FIG. 14A shows the input audio signal wherein a broken-line portion shows the noise period. FIG. 14B shows an output audio signal detected when the noise period is polynomial-interpolated in the situation that the intermediate and high frequency components are not removed from the input audio signal. In some times, the interpolated noise period protrudes as shown in FIG. 14B. FIG. 14C shows the case where, in the embodiment 2, the polynomial interpolation is applied to the low frequency component and also the fade-out/in is applied to the noise period for the intermediate and high frequency components, and then these components are synthesized. In FIG. 14C, the pulse-like noise can be removed without damage of the low frequency component.

In the embodiment 2, the noise rejection for the FM stereo signal has been explained. In the case of a monoral signal, two outputs of the FM demodulator circuit 5 are the totally same signals, but the operation is completely identical.

Figure 15:
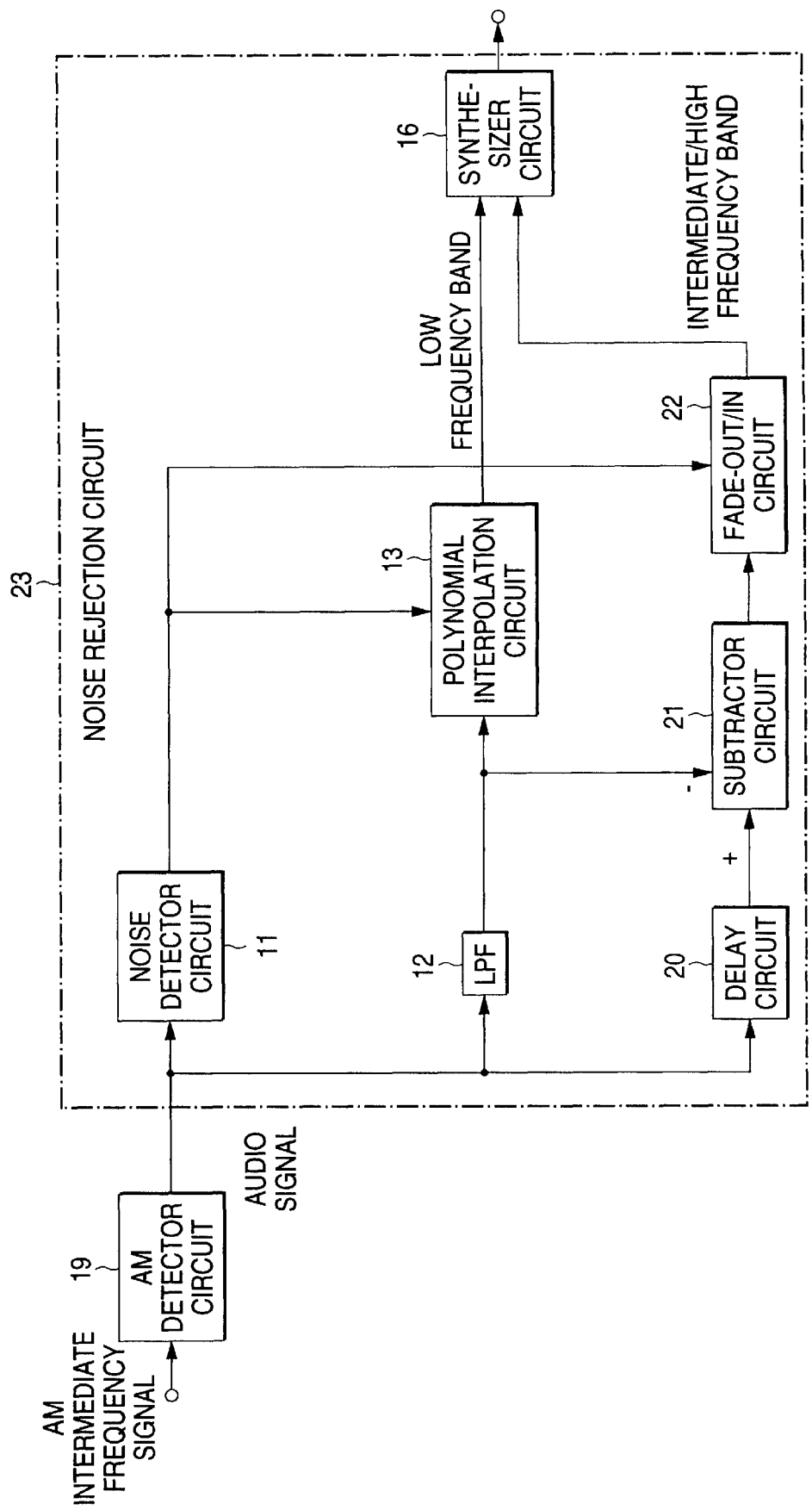
FIG. 15 is a block diagram showing another configuration of the embodiment 2.

Similarly, as for the AM signal, as shown in FIG. 15, since there is no change in the process for the audio signal as an output of an AM detector circuit 19 and subsequent processes, a configuration of the noise rejection circuit 23 is identical to that shown in FIG. 12 and also an operation thereof is basically similar to that explained in FIG. 12.

EMBODIMENT 3

Figure 16:
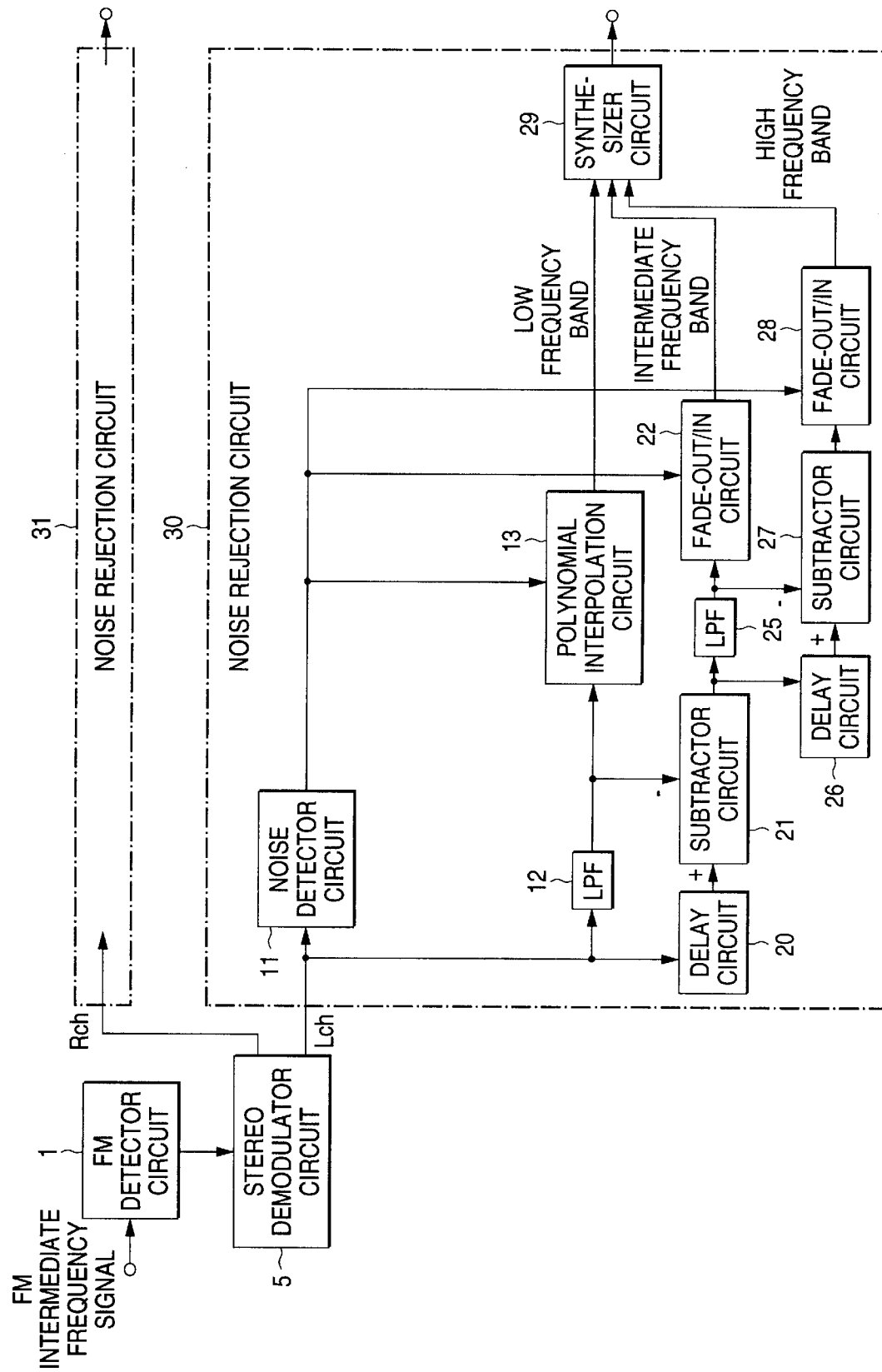
FIG. 16 is a block diagram showing a configuration of an embodiment 3 of the present invention.

FIG. 16 is a block diagram showing a configuration of a noise rejection circuit according to an embodiment 3 of the present invention. In FIG. 16, same references as those in FIG. 12 indicate the same or similar parts respectively. In FIG. 16, a reference 25 denotes an LPF; 26, a delay circuit; 27, a subtractor circuit; 28, a fade-out/in circuit; and 29, a synthesizer circuit. A noise rejection circuit 30 for the audio signal which is input from the stereo demodulator circuit 5 over one channel is composed of the noise detector circuit 11 to the polynomial interpolation circuit 13, the delay circuit 20 to the fade-out/in circuit 22, and the delay circuit 26 to the synthesizer circuit 29. A reference 31 denotes a noise rejection circuit for the audio signal over the other channel. Since a configuration of the noise rejection circuit 31 is completely identical to the noise rejection circuit 30, its explanation will be omitted in this disclosure.

This embodiment 3 is different from the embodiment 2 in the following respects. That is, the second LPF 25, which has a higher cut-off frequency than the LPF 12, extracts the intermediate frequency component from the intermediate and high frequency components which are extracted by the subtractor circuit 21 in the embodiment 2, and then the fade-out/in circuit 22 applies the fade-out immediately before the noise period and the fade-in immediately after the noise period. While, the delay circuit 26 delays the intermediate and high frequency components by the same amount as a delay amount in the LPF 25, then the subtractor circuit 27 subtracts the intermediate frequency component from the intermediate and high frequency components to extract the high frequency component, and then the fade-out/in circuit 28 applies the fade-out immediately before the noise period and the fade-in immediately after the noise period. Then, the synthesizer circuit 29 synthesizes the low frequency component whose noise period has been polynomial-interpolated, the intermediate frequency component whose noise period has been subjected to the fade-out/in, and the high frequency component whose noise period has been subjected to the fade-out/in.

Next, operations of different parts from those in the embodiment 2 will be explained hereunder. The intermediate and high frequency components being output from the subtractor circuit 21 are input into the LPF 25 in which the intermediate frequency component is extracted and then input into the fade-out/in circuit 22. The fade-out/in circuit 22 applies the fade-out and the fade-in to the intermediate frequency component immediately before the noise period and immediately after the noise period respectively based on the detection signal of the noise detector circuit 11. The operation of the fade-out/in circuit 22 is identical to that in the embodiment 2 and therefore its explanation will be omitted.

Meanwhile, the intermediate and high frequency components being output from the subtractor circuit 21 are delayed by the delay circuit 26 by the delay amount such that they coincide in timing with the intermediate frequency component being output from the LPF 25, and then are input into the subtractor circuit 27. The subtractor circuit 27 subtracts the intermediate frequency component from the intermediate and high frequency components to extract the high frequency component, and then outputs it to the fade-out/in circuit 28. The fade-out/in circuit 28 applies the fade-out and the fade-in to the high frequency component immediately before the noise period and immediately after the noise period respectively based on the detection signal of the noise detection circuit 11. Then, the synthesizer circuit 29 synthesizes the low frequency component which has been polynomial-interpolated, the intermediate frequency component which has been subjected to the fade-out/in, and the high frequency component which has been subjected to the fade-out/in to then output the audio signal.

FIG. 17 is a view showing an operation to apply the fade-out/in separately after the intermediate and high frequency components in the embodiment 3 are separated into the intermediate frequency component and the high frequency component. In this manner, in the event that the noise period is cut off and then the fade-out/in is executed before and after the noise period respectively, feeling of interruption of the signal is enhanced if the fade-out/in periods becomes long, and an effect achieved by the fade-out/in is reduced if the fade-out/in periods becomes short. Thus, beat sounds caused by repetition of discontinuity of the cut-off and the pass of the signal in synchronous with the pulse noise become prominent. Therefore, the fade-out/in periods must be set to an appropriate value respectively. Also, since such appropriate value is different according to a signal frequency, the fade-out/in periods for the intermediate frequency component is set long, as shown in FIG. 17C, and the fade-out/in periods for the high frequency component is set short, as shown in FIG. 17D.

Figure 18:
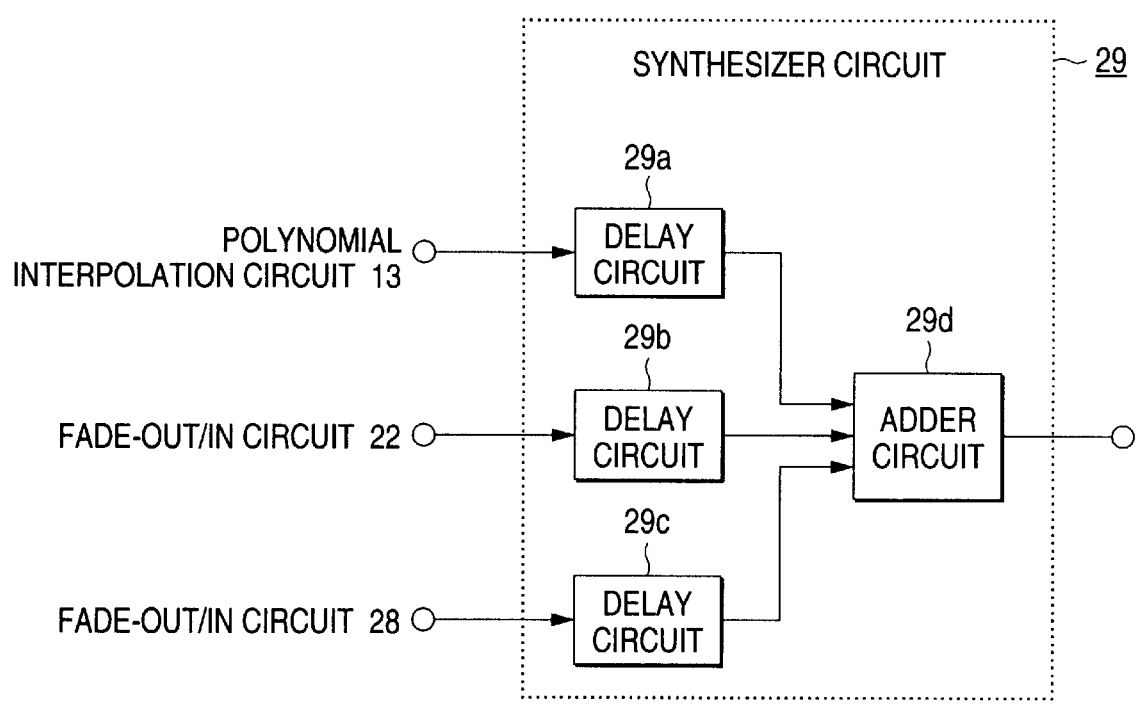
FIG. 18 is a block diagram showing an example of a configuration of a synthesizer circuit in the embodiment 3.

FIG. 18 is a block diagram showing an example of a configuration of the synthesizer circuit 28. Time discrepancy due to difference in their delay amounts exists among the low frequency component, the intermediate frequency component, and the high frequency component, which are input into the synthesizer circuit 29. Therefore, these components are added and synthesized after such time discrepancy has been corrected. A delay circuit 29a gives a delay to the low frequency component which is input from the polynomial interpolation circuit 13. A delay circuit 29b gives a delay to the intermediate frequency component which is input from the fade-out/in circuit 22. A delay circuit 29c gives a delay to the high frequency component delays which is input from the fade-out/in circuit 28. In this case, since the delay amount is set to coincide with that of the mostly delayed component, no delay is given by the delay circuit into which the mostly delayed component is input. An adder circuit 29d receives the low frequency component, the intermediate frequency component, and the high frequency component at the same timing respectively and then synthesizes them.

In the embodiment 3, the noise rejection for the FM stereo signal has been explained. In the case of a monoral signal, two outputs of the FM demodulator circuit 5 are the totally same signals, but the operation is completely identical.

Figure 19:
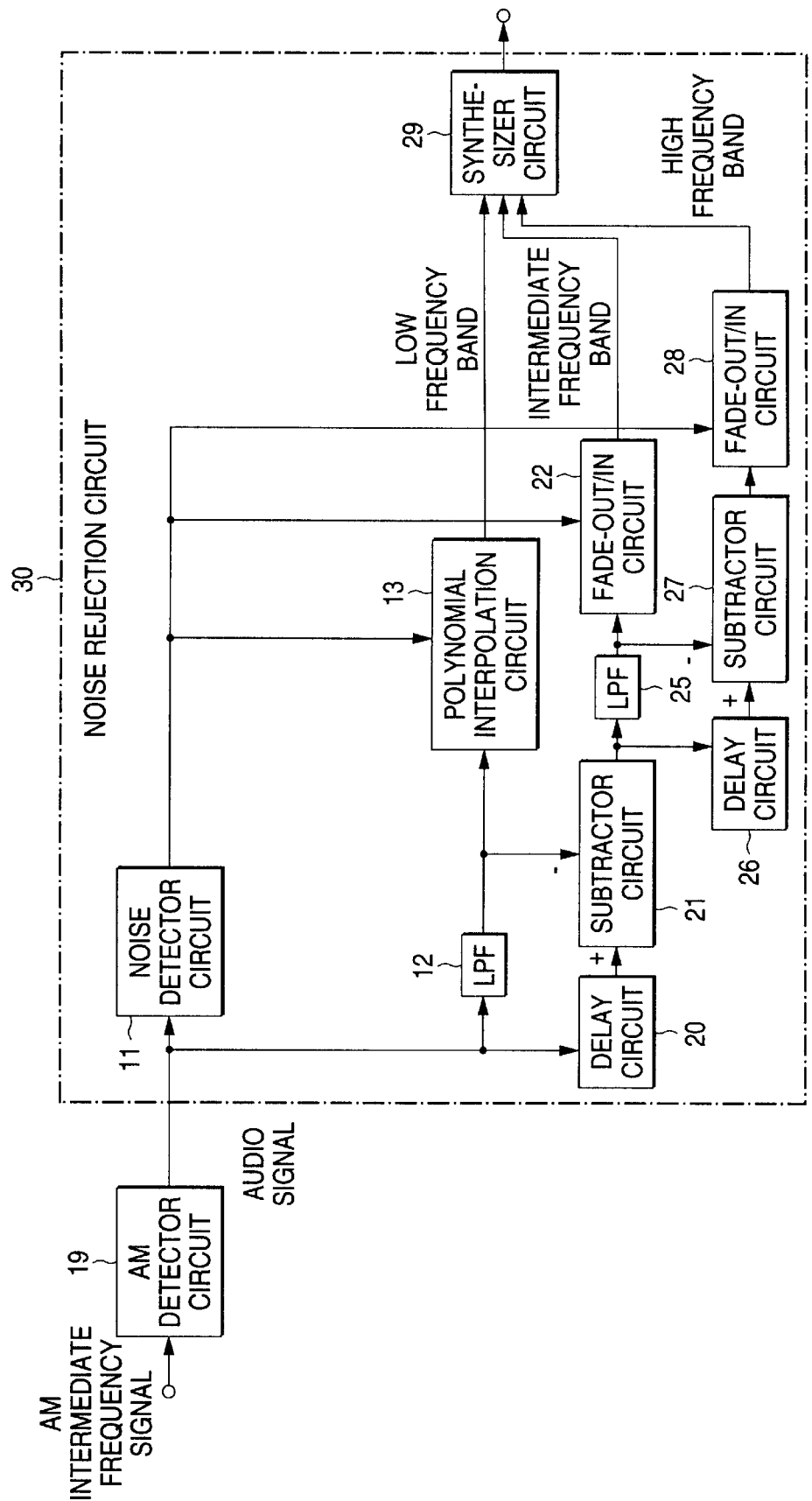
FIG. 19 is a block diagram showing another configuration of the embodiment 3.

Similarly, as for the AM signal, as shown in FIG. 19, since there is no change in the process for the audio signal as an output of an AM detector circuit 19 and subsequent processes, a configuration of the noise rejection circuit 30 is identical to that shown in FIG. 16 and also an operation thereof is basically similar to that explained in FIG. 16.

EMBODIMENT 4

Figure 20:
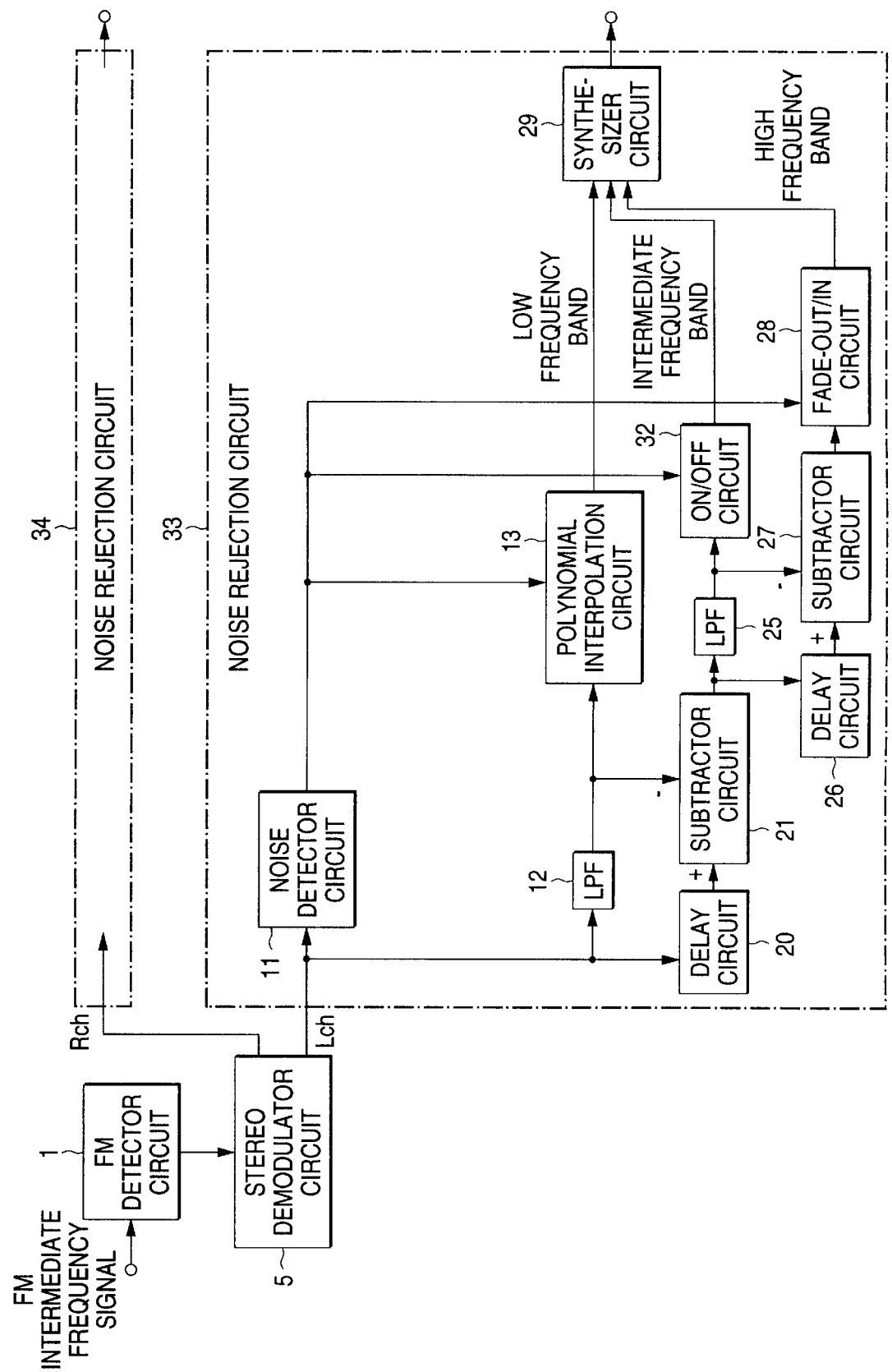
FIG. 20 is a block diagram showing a configuration of an embodiment 4 of the present invention.

FIG. 20 is a block diagram showing a configuration of a noise rejection circuit according to an embodiment 4 of the present invention. In FIG. 20, same references as those in FIG. 16 indicate the same or similar parts respectively. In FIG. 20, a reference 32 denotes an ON/OFF circuit. A noise rejection circuit 33 for the audio signal which is input from the stereo demodulator circuit 5 over one channel is composed of the noise detector circuit 11 to the polynomial interpolation circuit 13, the delay circuit 20, the subtractor circuit 21, the LPF 25 to the synthesizer circuit 29, and the ON/OFF circuit 32. A reference 34 denotes a noise rejection circuit for the audio signal over the other channel. Since a configuration of the noise rejection circuit 34 is completely identical to the noise rejection circuit 33, its explanation will be omitted in this disclosure.

The embodiment 4 is different from the embodiment 3 in that the intermediate frequency component being extracted by the LPF 25 is ON/OFFed by the ON/OFF circuit 32 to cut off the pulse-like noise.

Figure 21:
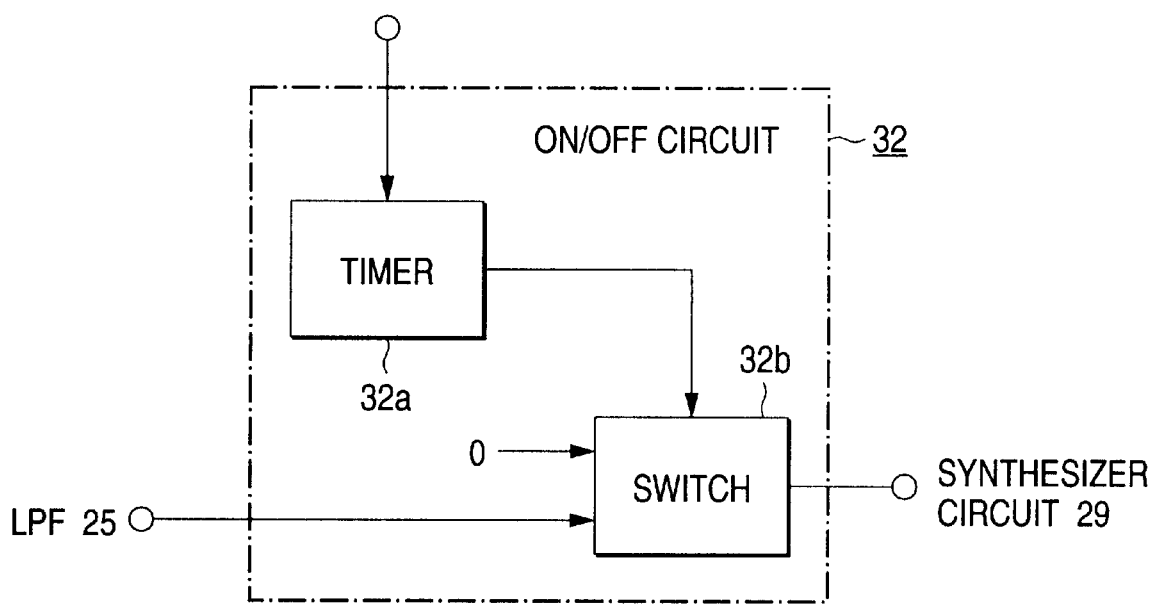
FIG. 21 is a block diagram showing an example of a configuration of an ON/OFF circuit in the embodiment 4.

FIG. 21 is a block diagram showing an example of a configuration of the ON/OFF circuit 32. A timer 32a receives the detection signal from the noise detector circuit 11, and then a switch 32b is controlled by an output of the timer 32a to turn an output of the LPF 25 ON/OFF.

Figure 22:
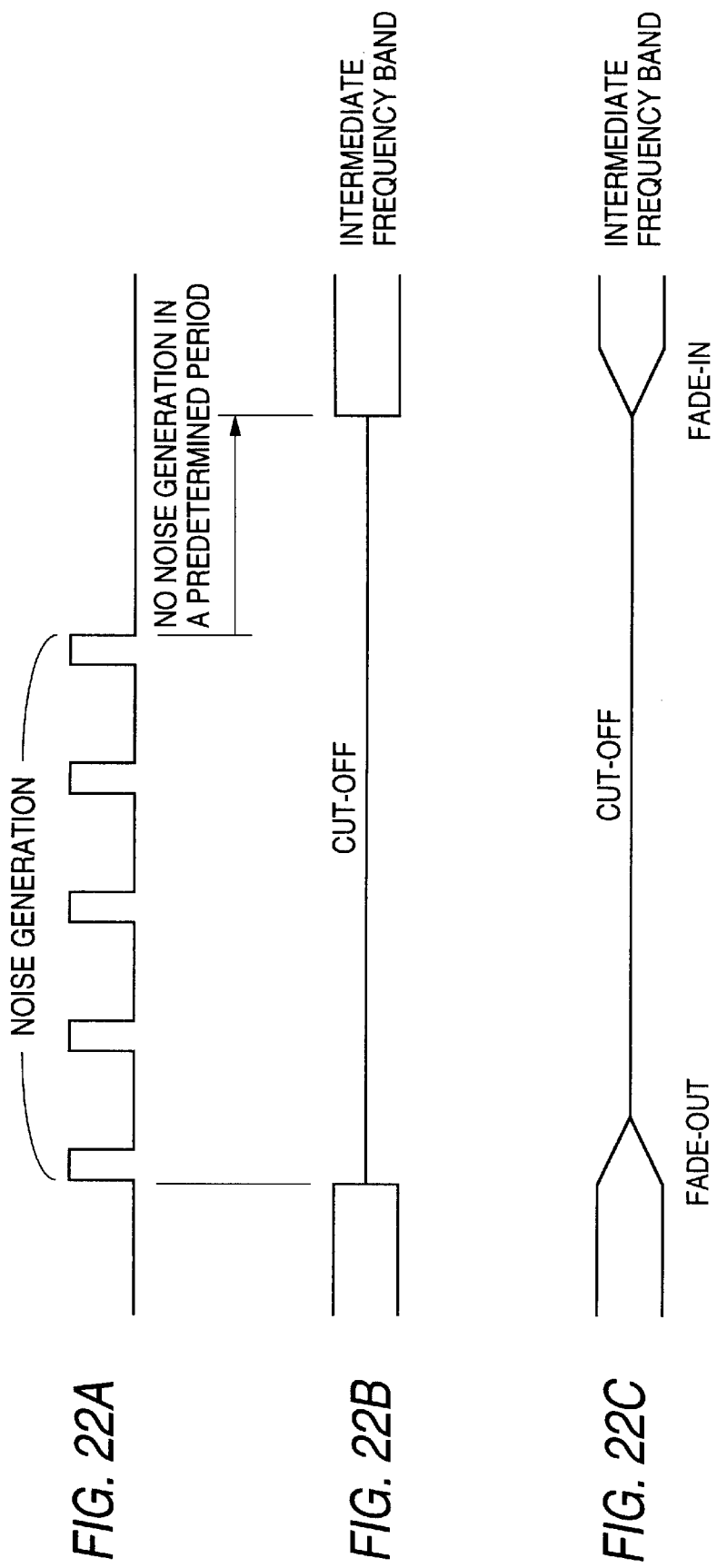
FIGS. 22A–22C are views showing an operation of the ON/OFF circuit in the embodiment 4.

FIG. 22 is a view showing an operation of the ON/OFF circuit 32. FIG. 22A shows the noise detection signal being output from the noise detector circuit 11, and FIGS. 22B and 22C shows the intermediate frequency component being output from the ON/OFF circuit 32. When the detection signal is input from the noise detector circuit 11 to the timer 32a, the ON/OFF circuit 32 operates to cut off the intermediate frequency component being input from the LPF 25 and then restore to the output of the LPF 25 unless the pulse-like noise is generated for a predetermined period after the noise period has been lapsed. In this case, as shown in FIG. 22C, the fade-out/fade-in of the intermediate frequency component may be carried out at boundaries of the cut-off operation.

In the embodiment 4, the noise rejection for the FM stereo signal has been explained. In the case of the monoral signal, two outputs of the FM demodulator circuit 5 are the totally same signals, but the operation is completely identical.

Figure 23:
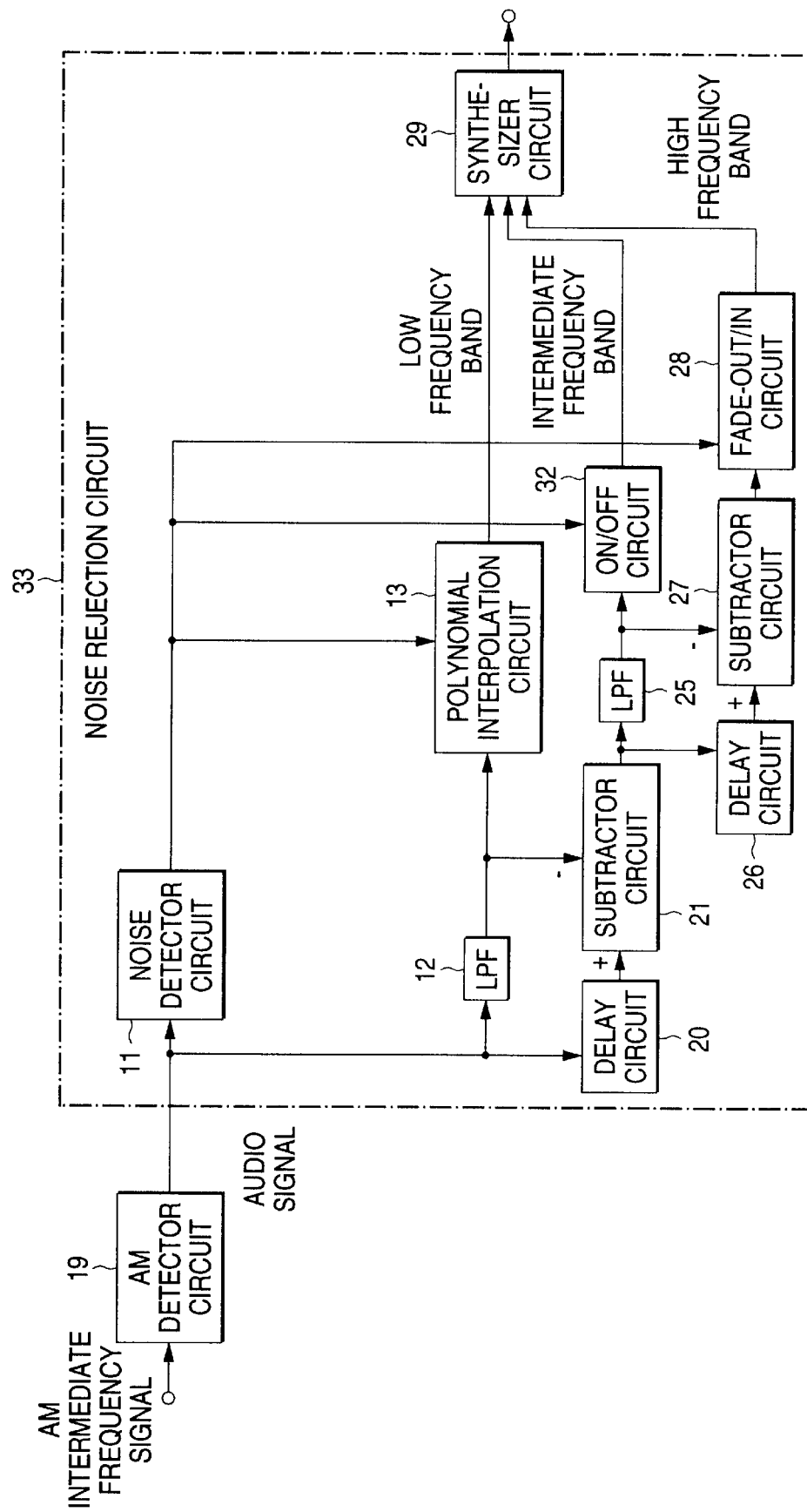
FIG. 23 is a block diagram showing another example of the configuration of the embodiment 4.

Similarly, as for the AM signal, as shown in FIG. 23, since there is no change in the process for the audio signal as an output of an AM detector circuit 19 and subsequent processes, a configuration of the noise rejection circuit 33 is identical to that shown in FIG. 20 and also an operation thereof is basically similar to that explained in FIG. 20.

EMBODIMENT 5

Figure 24:
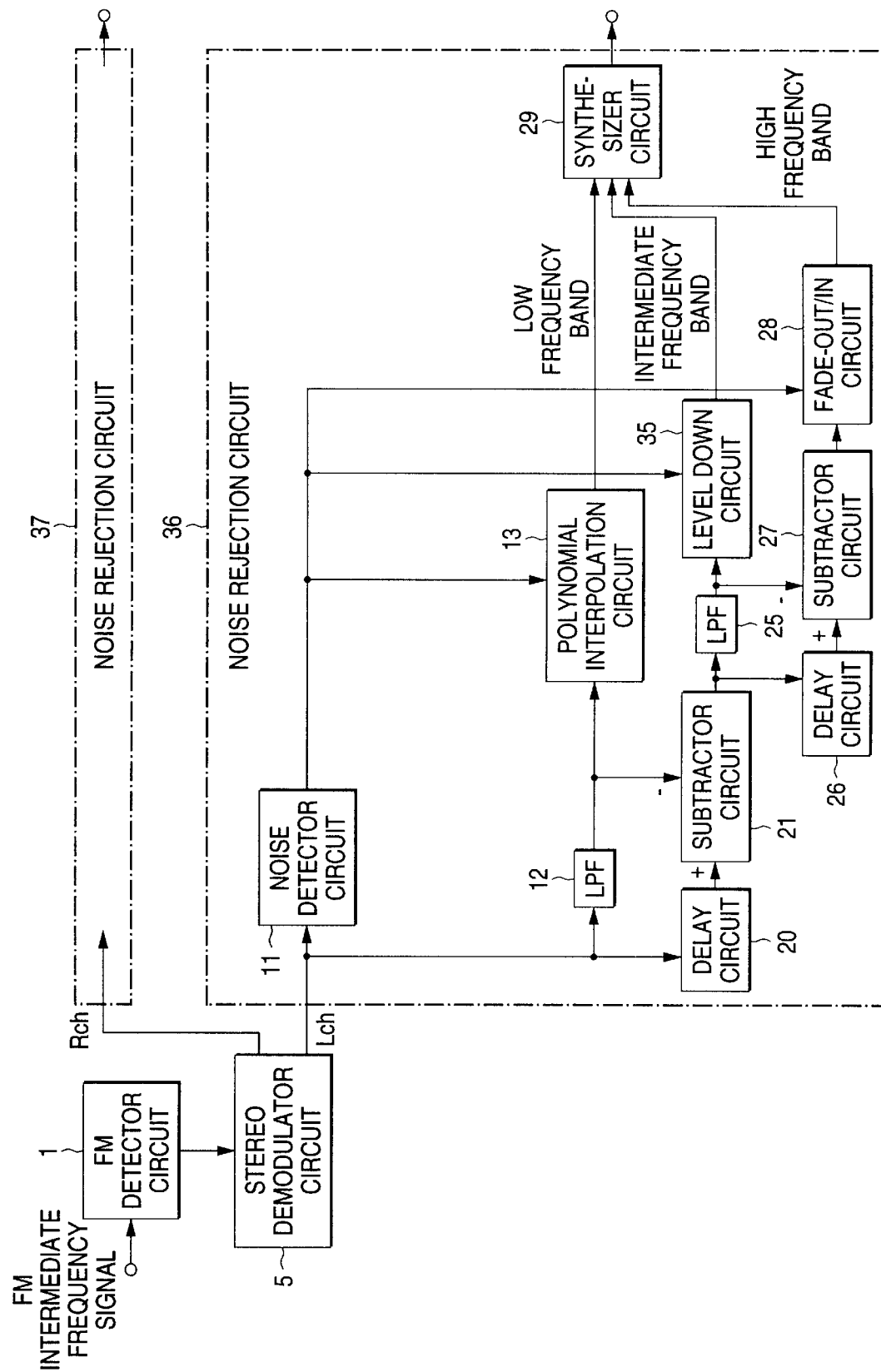
FIG. 24 is a block diagram showing a configuration of an embodiment 5 of the present invention.

FIG. 24 is a block diagram showing a configuration of a noise rejection circuit according to an embodiment 5 of the present invention. In FIG. 24, same references as those in FIG. 16 indicate the same or similar parts respectively. In FIG. 24, a reference 35 denotes a level down circuit. A noise rejection circuit 36 for the audio signal which is input from the stereo demodulator circuit 5 over one channel is composed of the noise detector circuit 11 to the polynomial interpolation circuit. 13, the delay circuit 20, the subtractor circuit 21, the LPF 25 to the synthesizer circuit 29, and the level down circuit 35. A reference 37 denotes a noise rejection circuit for the audio signal over the other channel. Since a configuration of the noise rejection circuit 37 is completely identical to the noise rejection circuit 36, its explanation will be omitted in this disclosure.

The embodiment 5 differs from the embodiment 4 in that a level of the noise period in the intermediate frequency component being extracted by the LPF 25 is lowered by the level down circuit 35.

Figure 25:
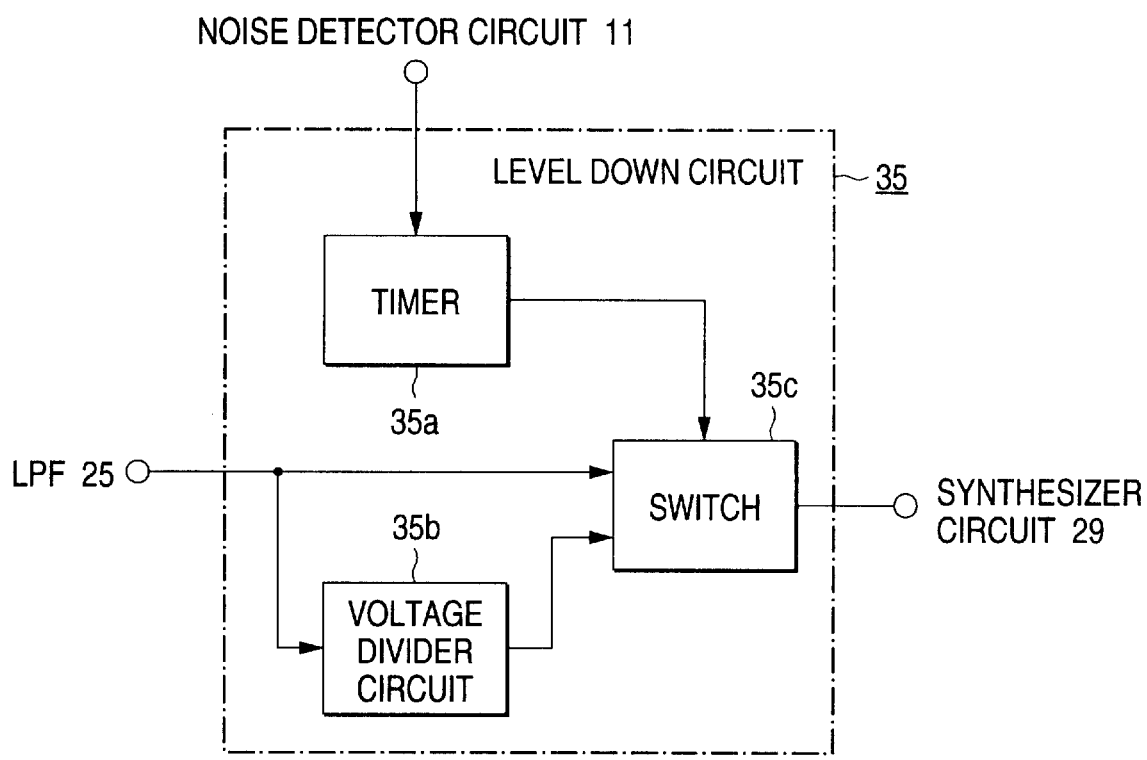
FIG. 25 is a block diagram showing an example of a configuration of a level down circuit in the embodiment 5.

FIG. 25 is a block diagram showing an example of a configuration of the level down circuit 35. A timer 35a receives an output of the noise detector circuit 11, and then a switch 35c switches an output of the LPF 25 and an output of a voltage divider circuit 35b, which divides the output of the LPF 25 to reduce a level, according to an output of the timer 35a.

Figure 26:
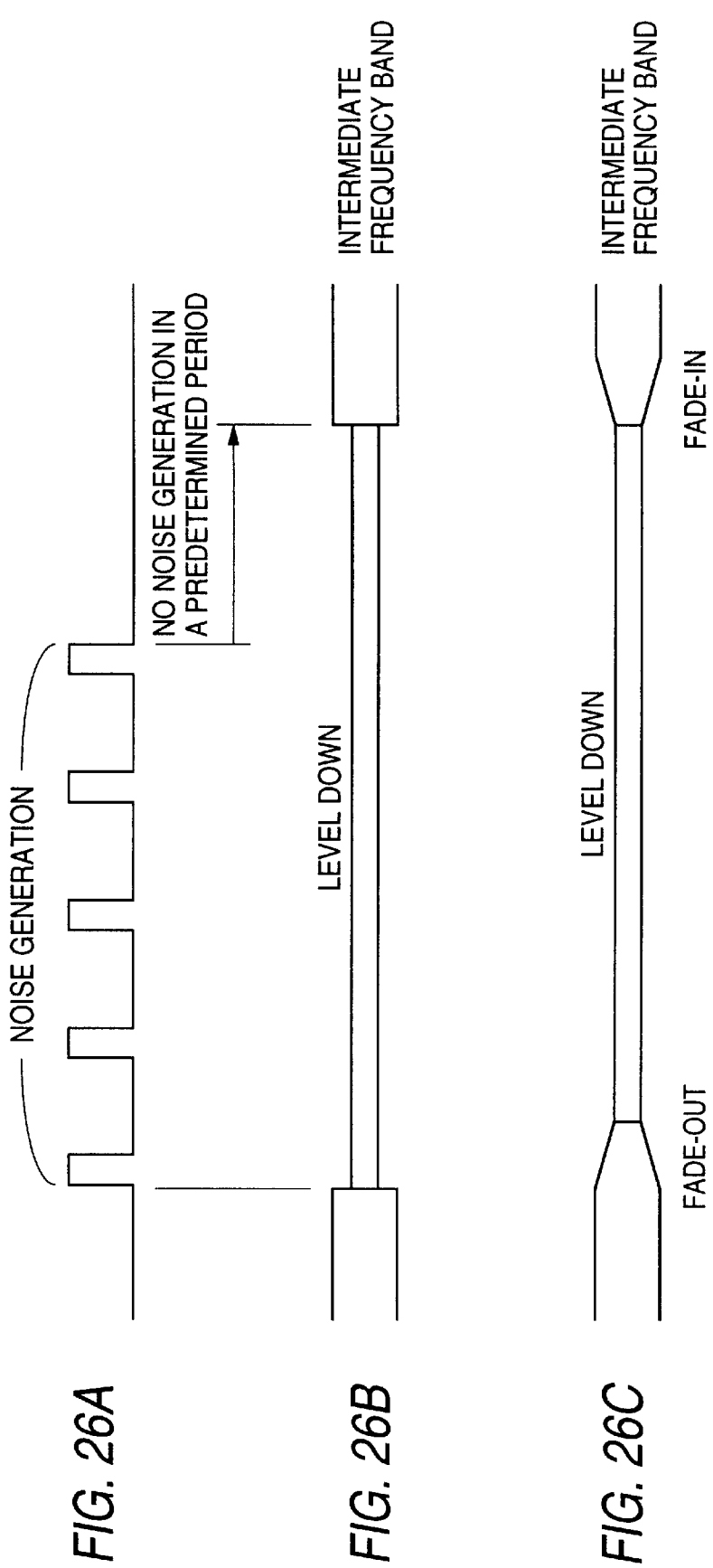
FIGS. 26A–26C are views showing an operation of the level down circuit in the embodiment 5.

FIG. 26 is a view showing an operation of the level down circuit 35. FIG. 26A shows the noise detection signal being output from the noise detection circuit 11. FIG. 26B and FIG. 26C show outputs of the level down circuit 35 respectively. When the detection signal is input from the noise detection circuit 11 to the timer circuit 35a, the Level down circuit 35 operates to switch its input into the intermediate frequency component, which is input from the voltage divider circuit 35b, to lower a level of the intermediate frequency band, as shown in FIG. 26B, and then restore to the output of the LPF 25 unless the pulse-like noise is generated for a predetermined period after the noise period has been lapsed. In this case, as shown in FIG. 26C, the fade-out/fade-in of the intermediate frequency component may be carried out at boundaries of the level lowering operation.

In the embodiment 5, the noise rejection for the FM stereo signal has been explained. In the case of the monoral signal, two outputs of the FM demodulator circuit 5 are the totally same signals, but the operation is completely identical.

Figure 27:
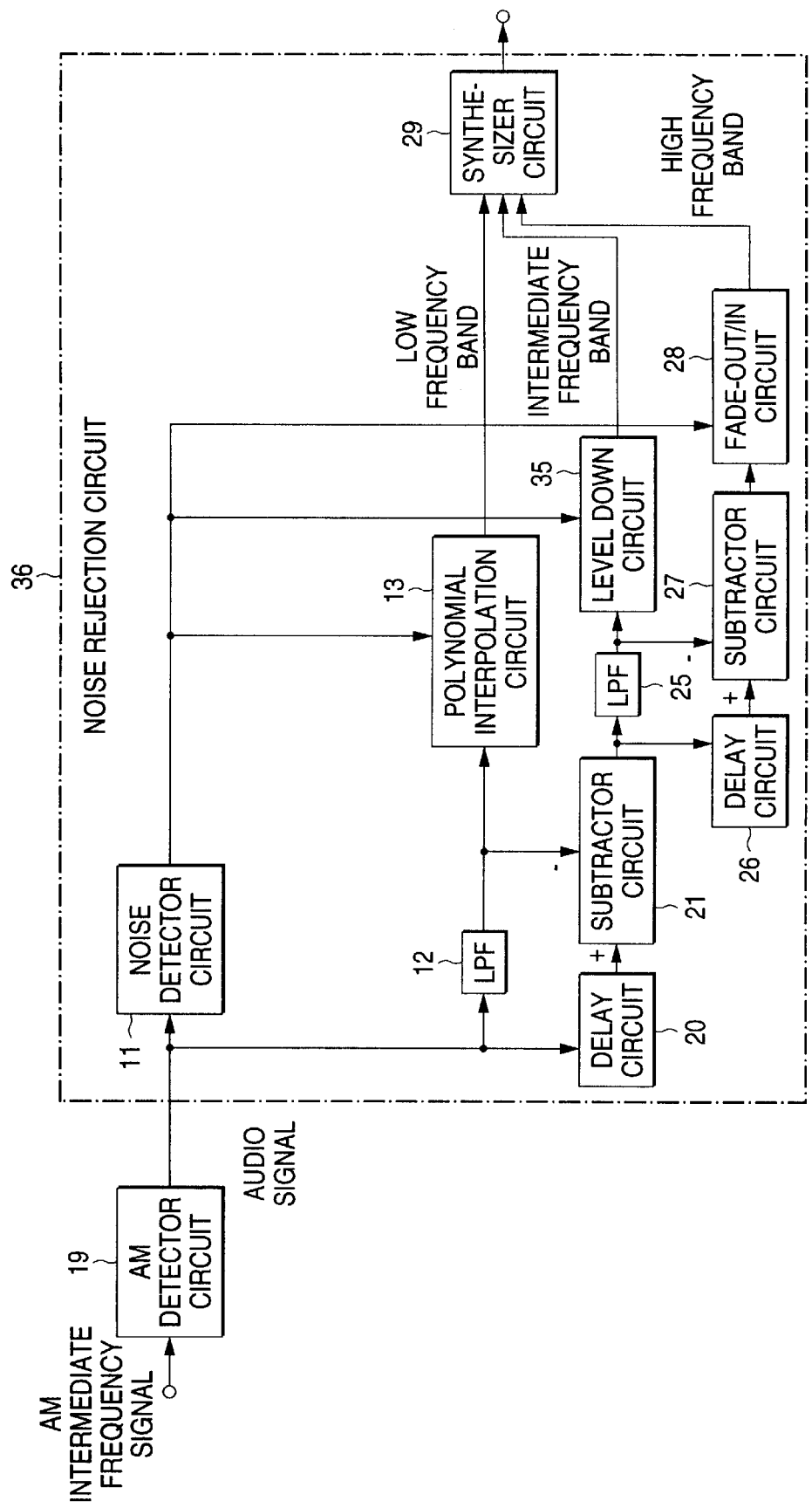
FIG. 27 is a block diagram showing another configuration of the embodiment 5.

Similarly, as for the AM signal, as shown in FIG. 27, since there is no change in the process for the audio signal as an output of the AM detector circuit 19 and subsequent processes, a configuration of the noise rejection circuit 36 is identical to that shown in FIG. 24 and also an operation thereof is basically similar to that explained in FIG. 24.

EMBODIMENT 6

Since a configuration of a noise rejection circuit according to an embodiment 6 of the present invention is the same as those in FIGS. 12, 16, 20 and 24 and only operational characteristics of the fade-out/in circuits 22 and 28 are different, its explanation of the configuration will be omitted in this disclosure.

Figure 28:
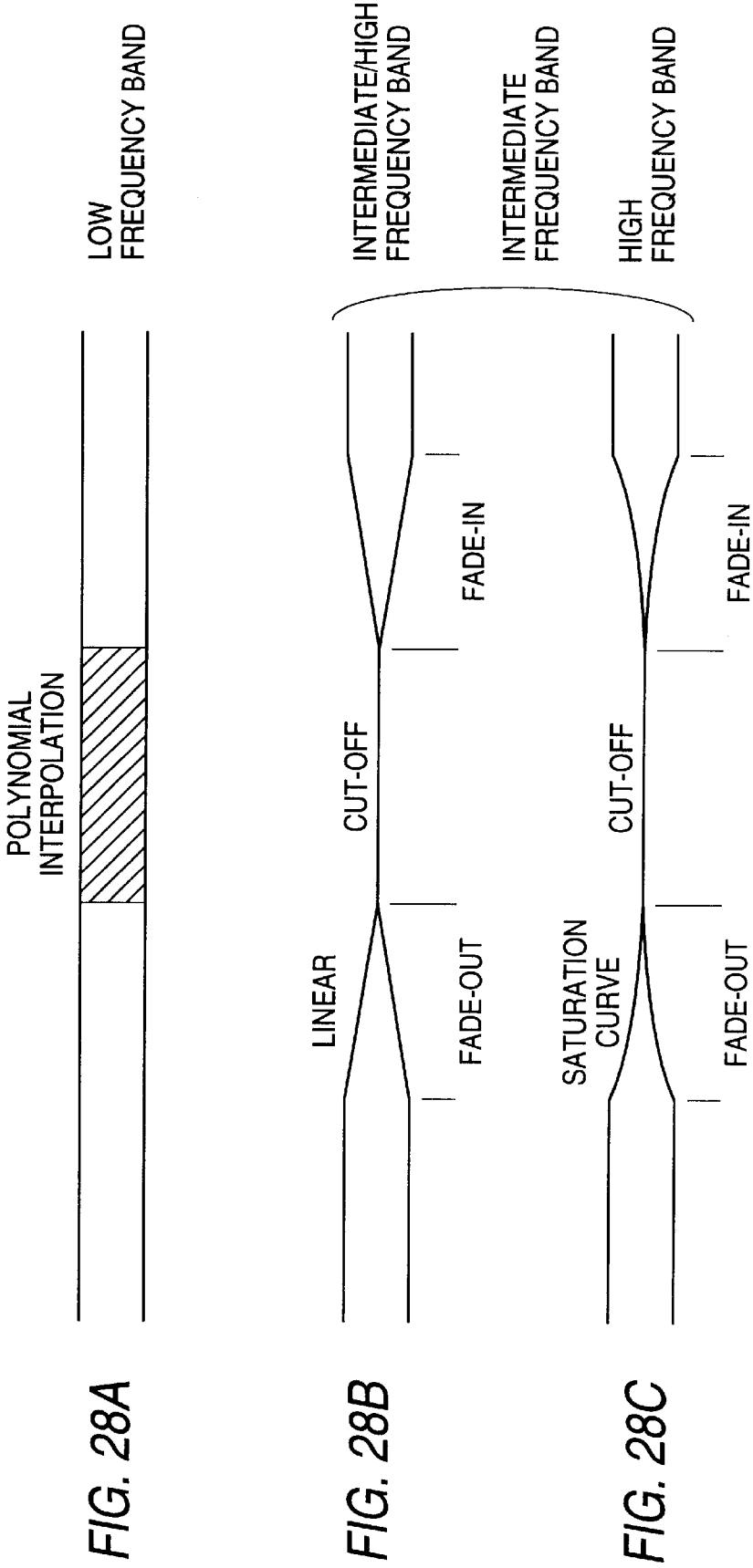
FIG. 28 is a view showing an operation a fade-out/in circuit in an embodiment 6 of the present invention.

FIG. 28 is a view showing fade-out/in characteristics of the fade-out/in circuits in the embodiment 6. FIG. 28A shows the low frequency component which is polynomial-interpolated. FIG. 28B shows the fade-out/in characteristics in the embodiments 2 to 5. FIG. 28C shows a fade-out/in characteristic in the embodiment 6.

In the fade-out/in characteristics in the embodiments 2 to 5 shown in FIG. 28B, the fade-out/in operation is executed as a linear characteristic. On the contrary, in the fade-out/in characteristic in the embodiment 6 shown in FIG. 28C, the fade-out/in operation is executed like a saturation curve which is saturated from the passing region toward the cut-off region. According to this way, connections between the noise period and the signal becomes smooth.

Figure 29:
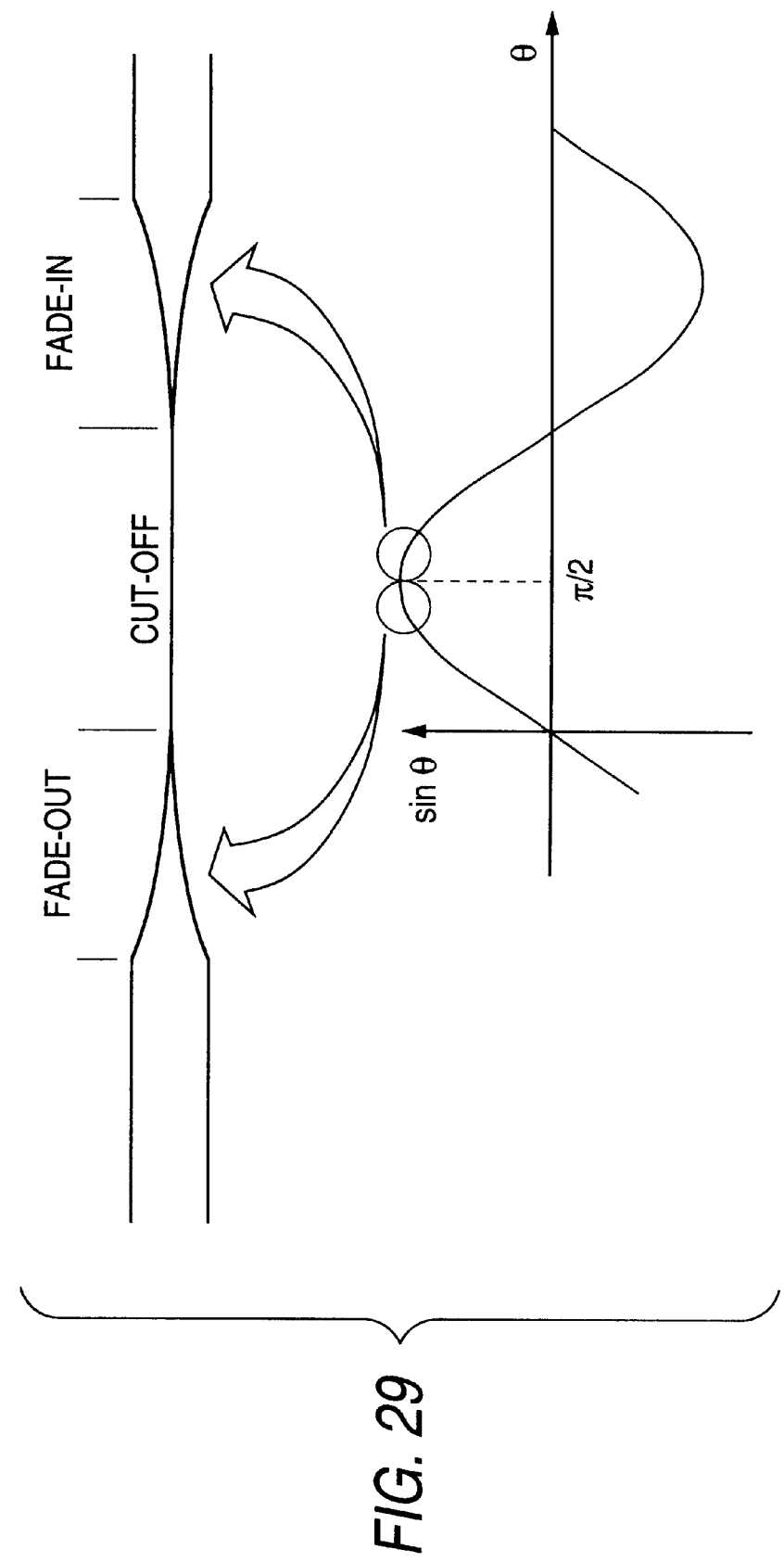
FIG. 29 is a view showing a saturation curve in the a fade-out/in circuit in the embodiment 6.
Figure 30:
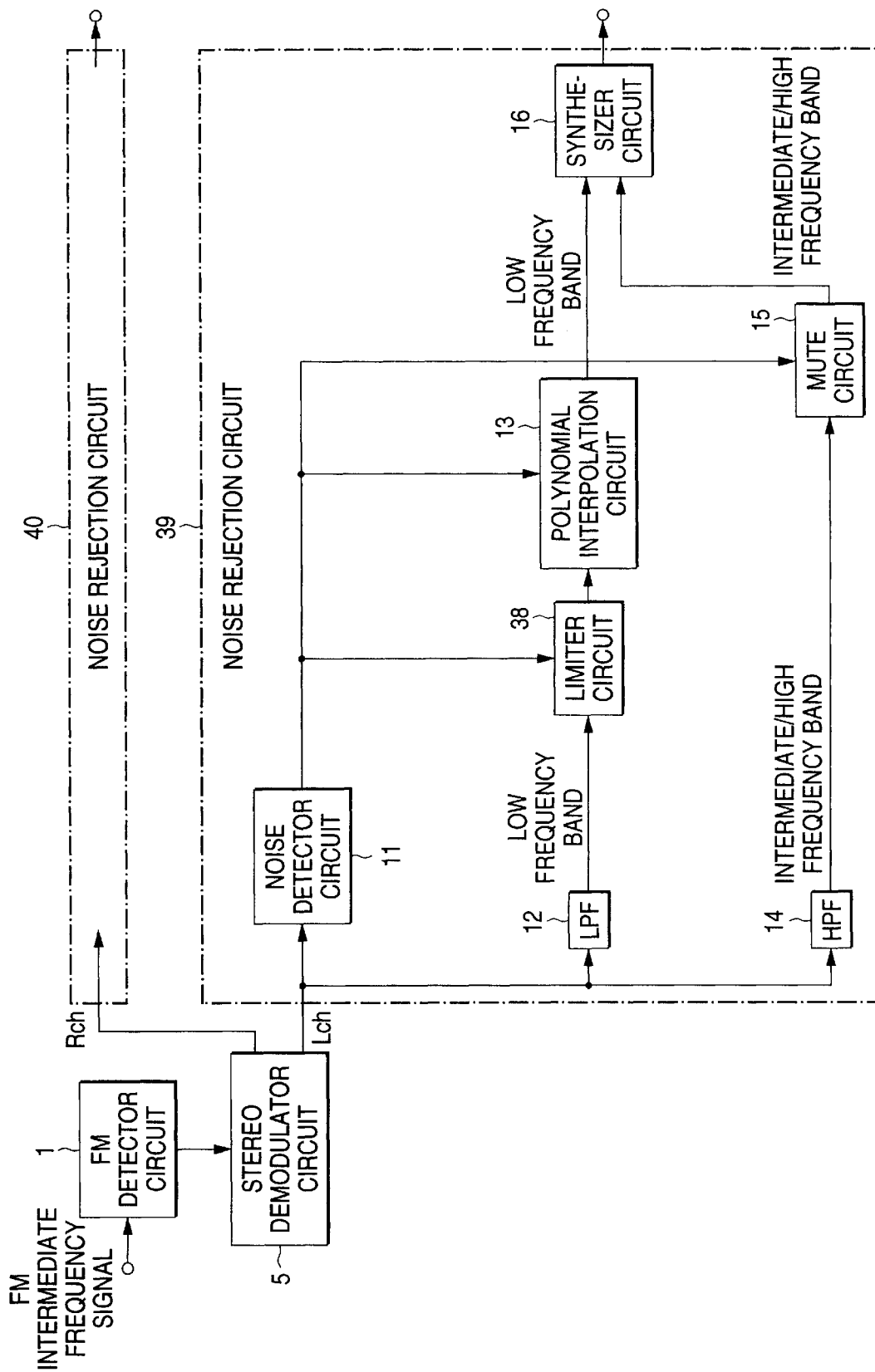
FIG. 30 is a first block diagram showing a configuration of an embodiment 7 of the present invention.
Figure 31:
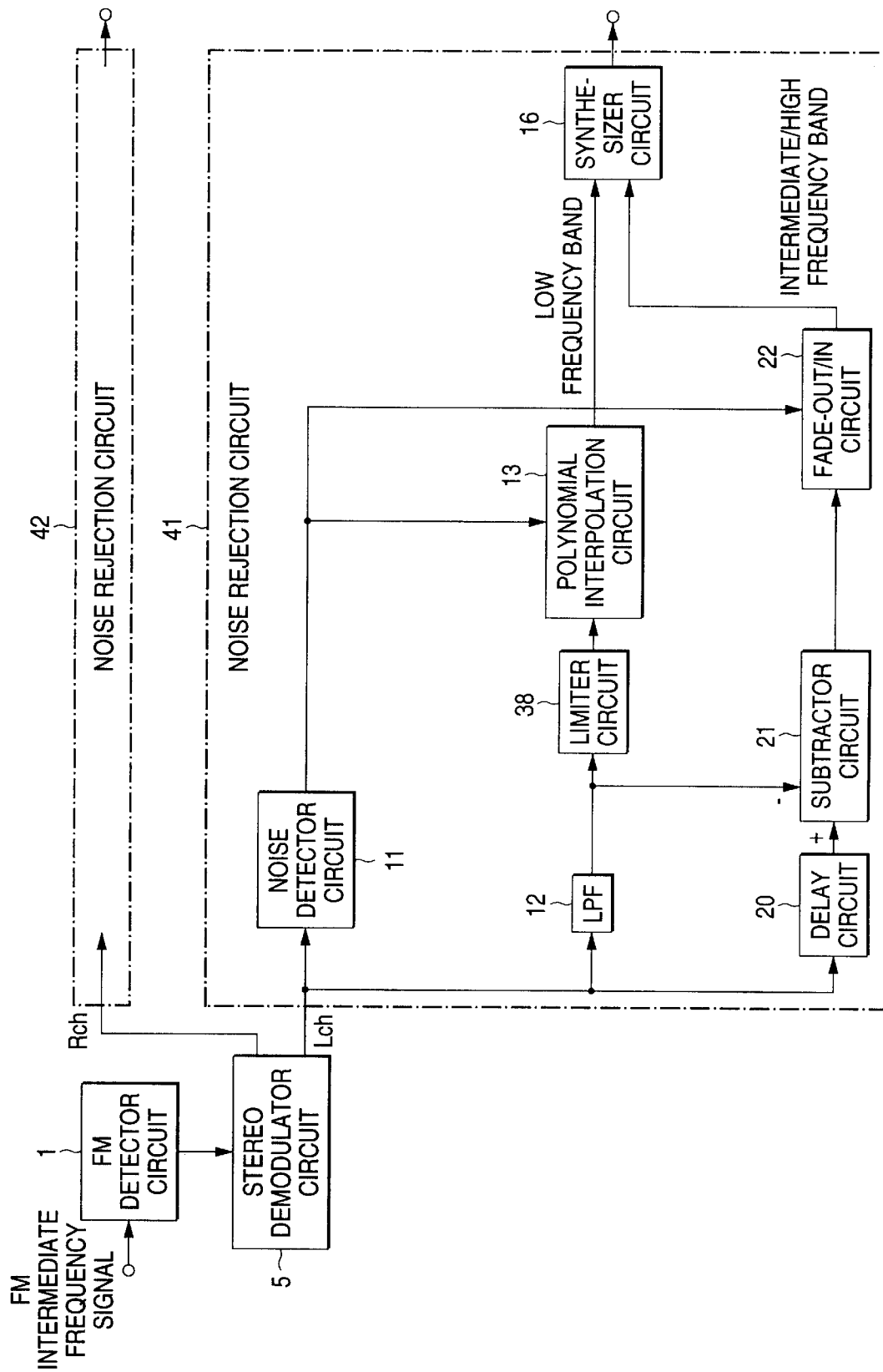
FIG. 31 is a second block diagram showing a configuration of the embodiment 7 of the present invention.
Figure 32:
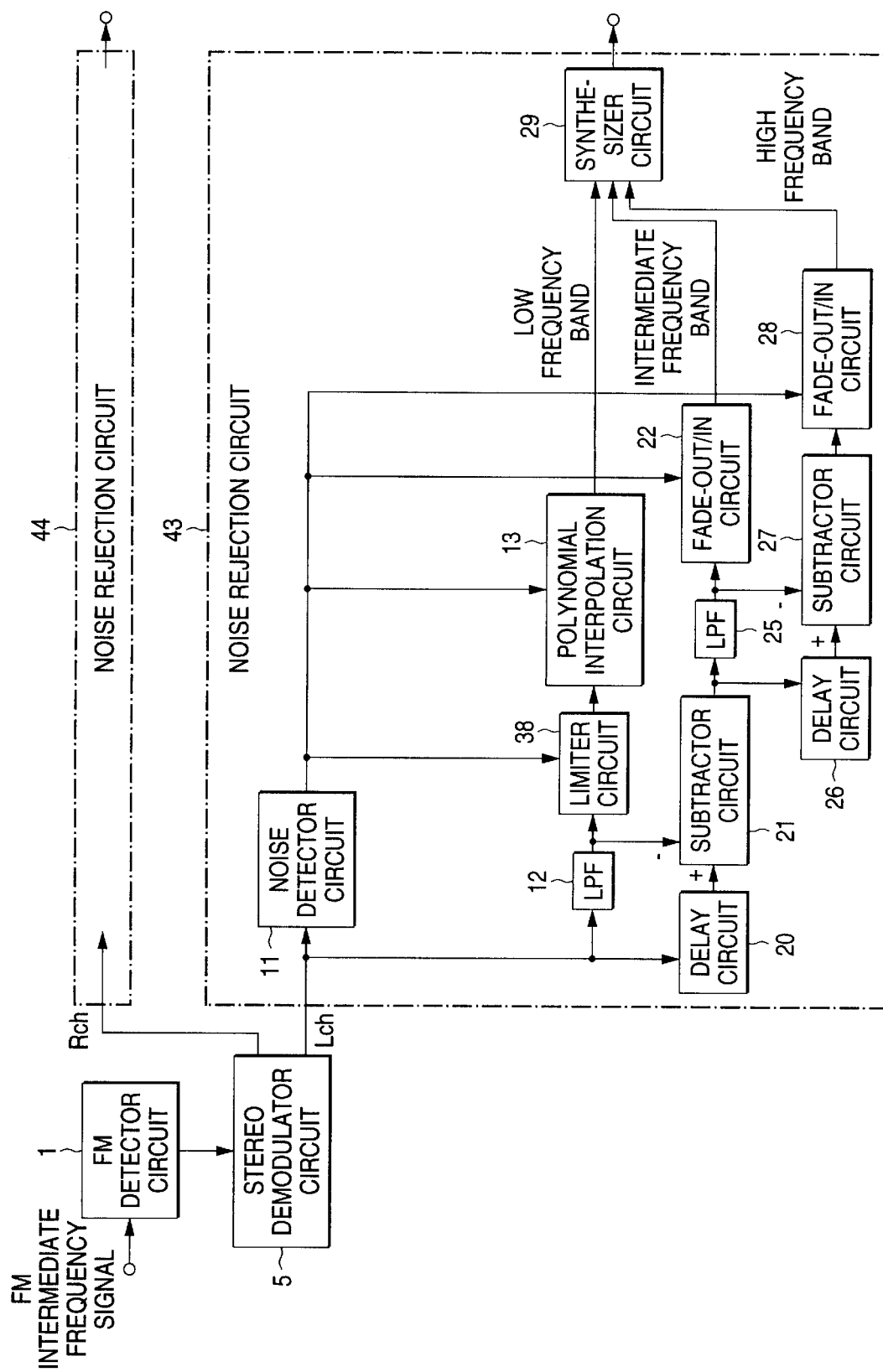
FIG. 32 is a third block diagram showing a configuration of the embodiment 7 of the present invention.
Figure 33:
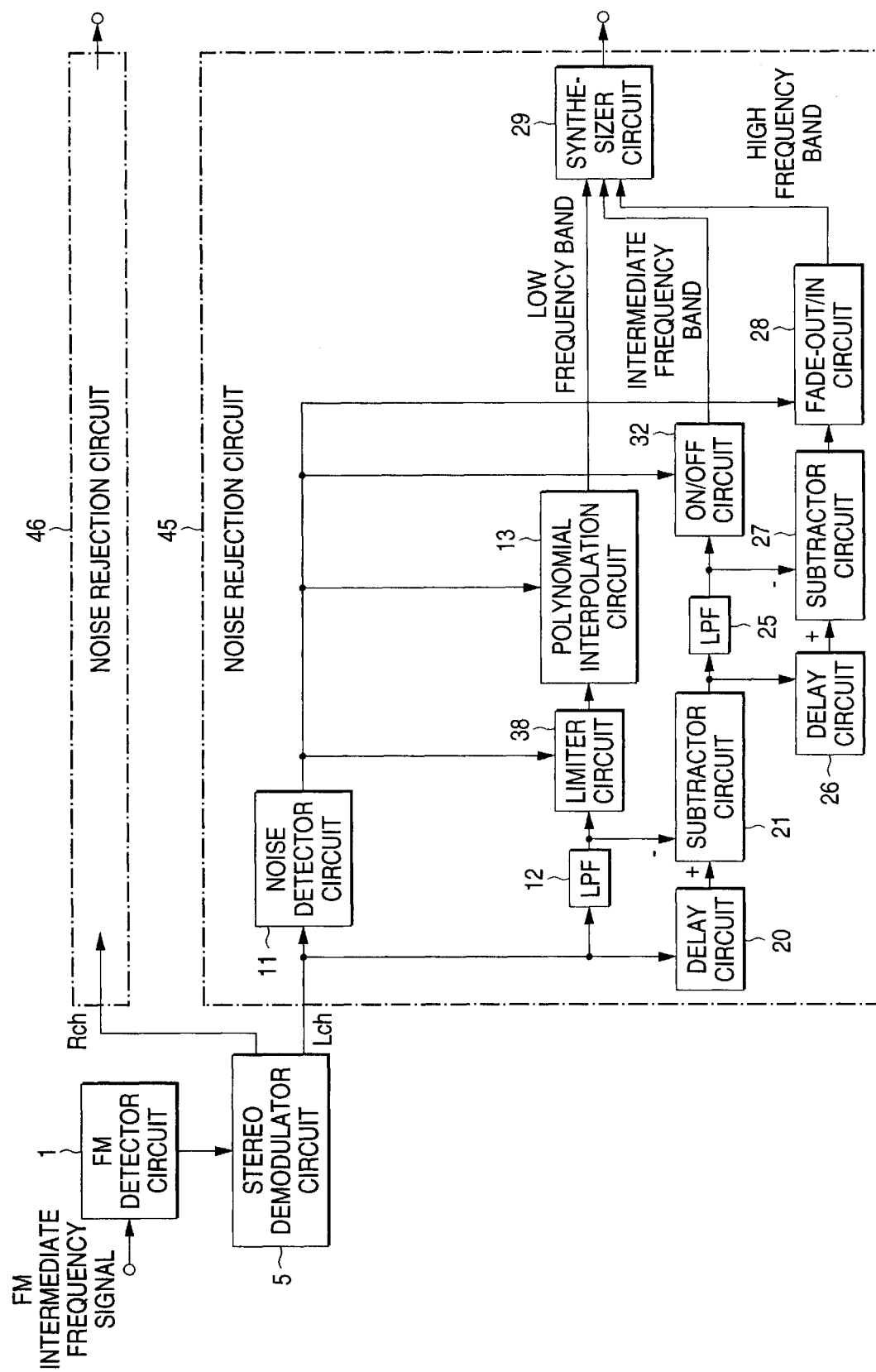
FIG. 33 is a fourth block diagram showing a configuration of the embodiment 7 of the present invention.
Figure 34:
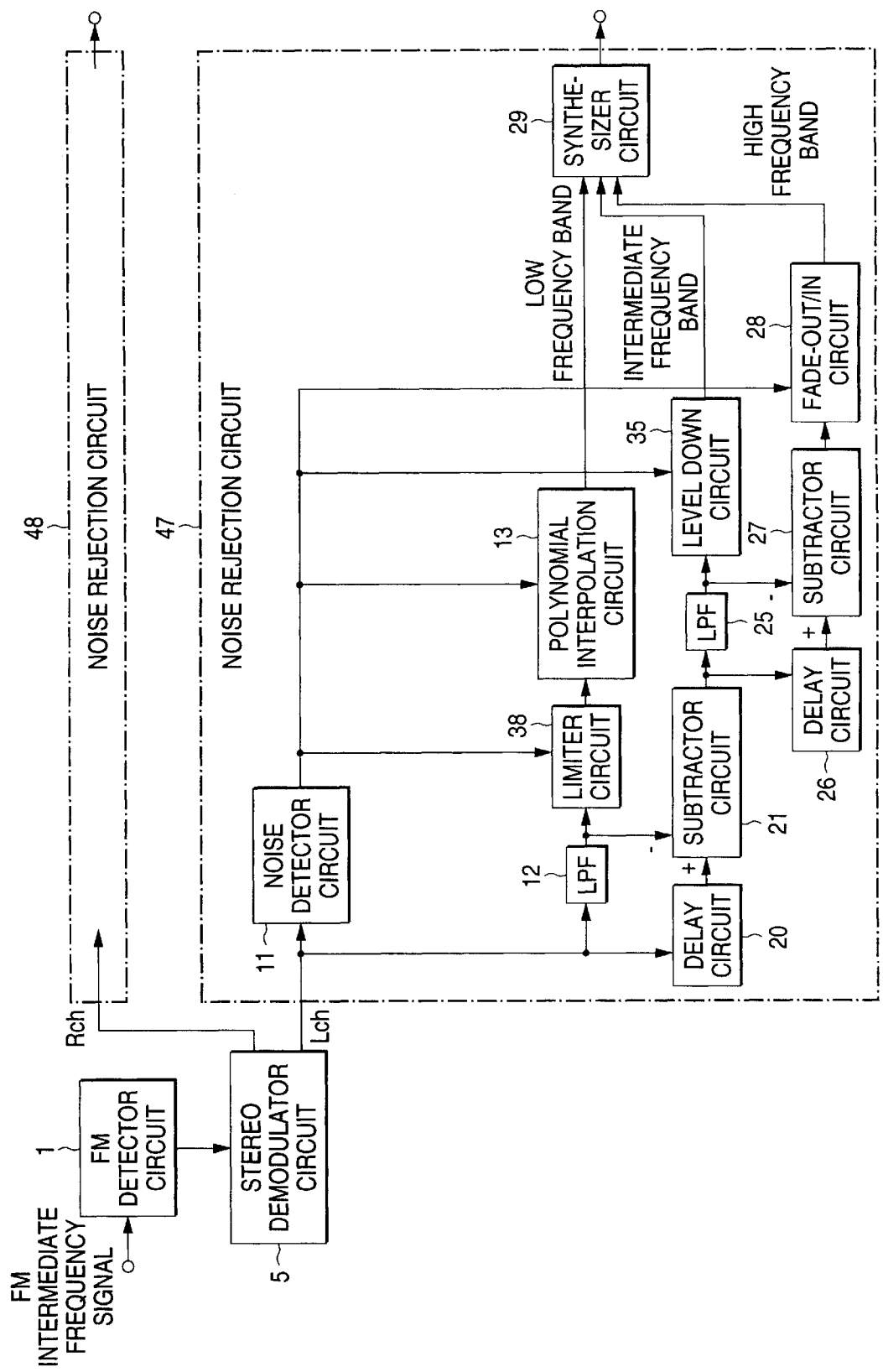
FIG. 34 is a fifth block diagram showing a configuration of the embodiment 7 of the present invention.
Figure 37:
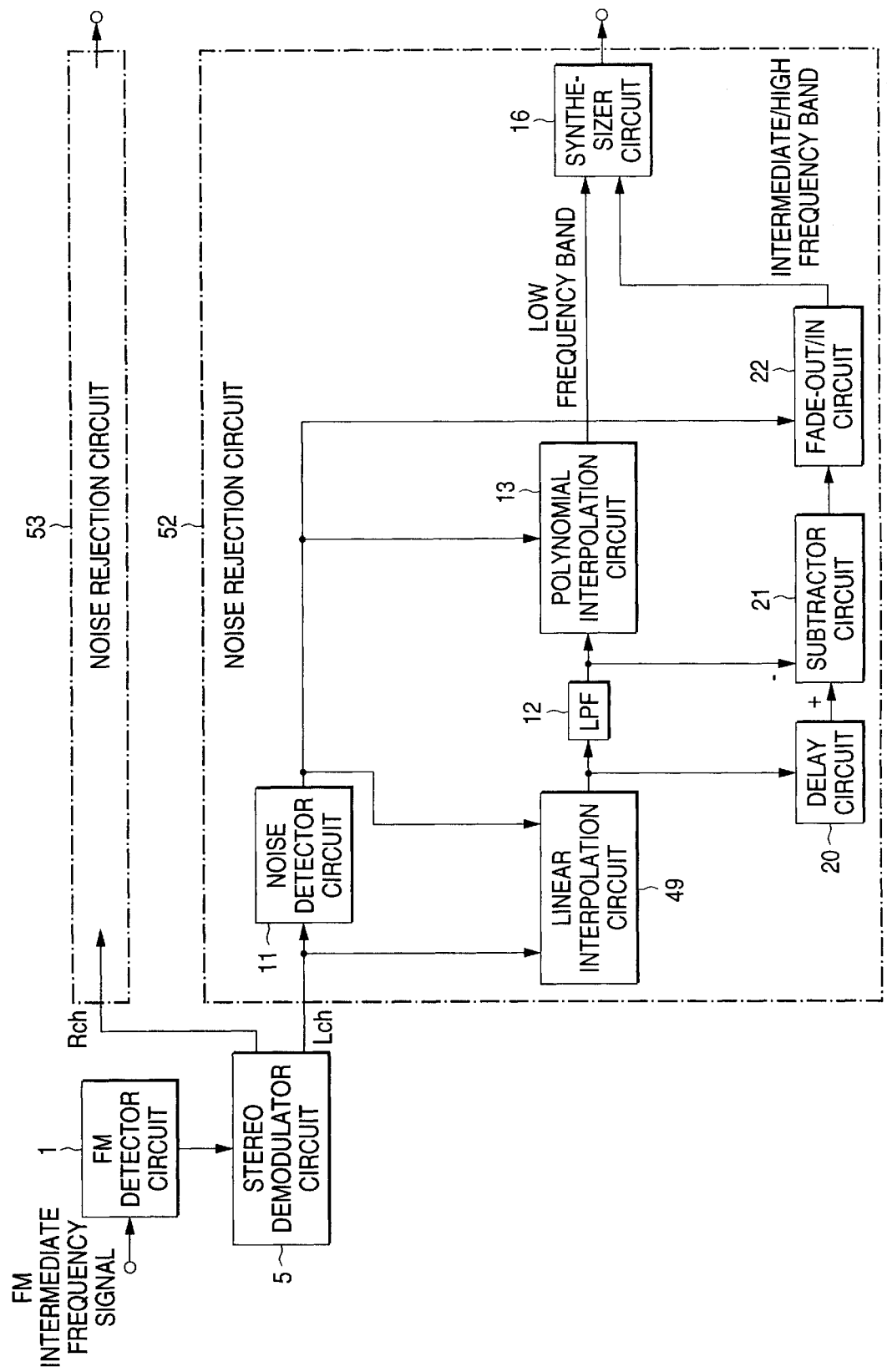
FIG. 37 is a second block diagram showing a configuration of the embodiment 8 of the present invention.
Figure 38:
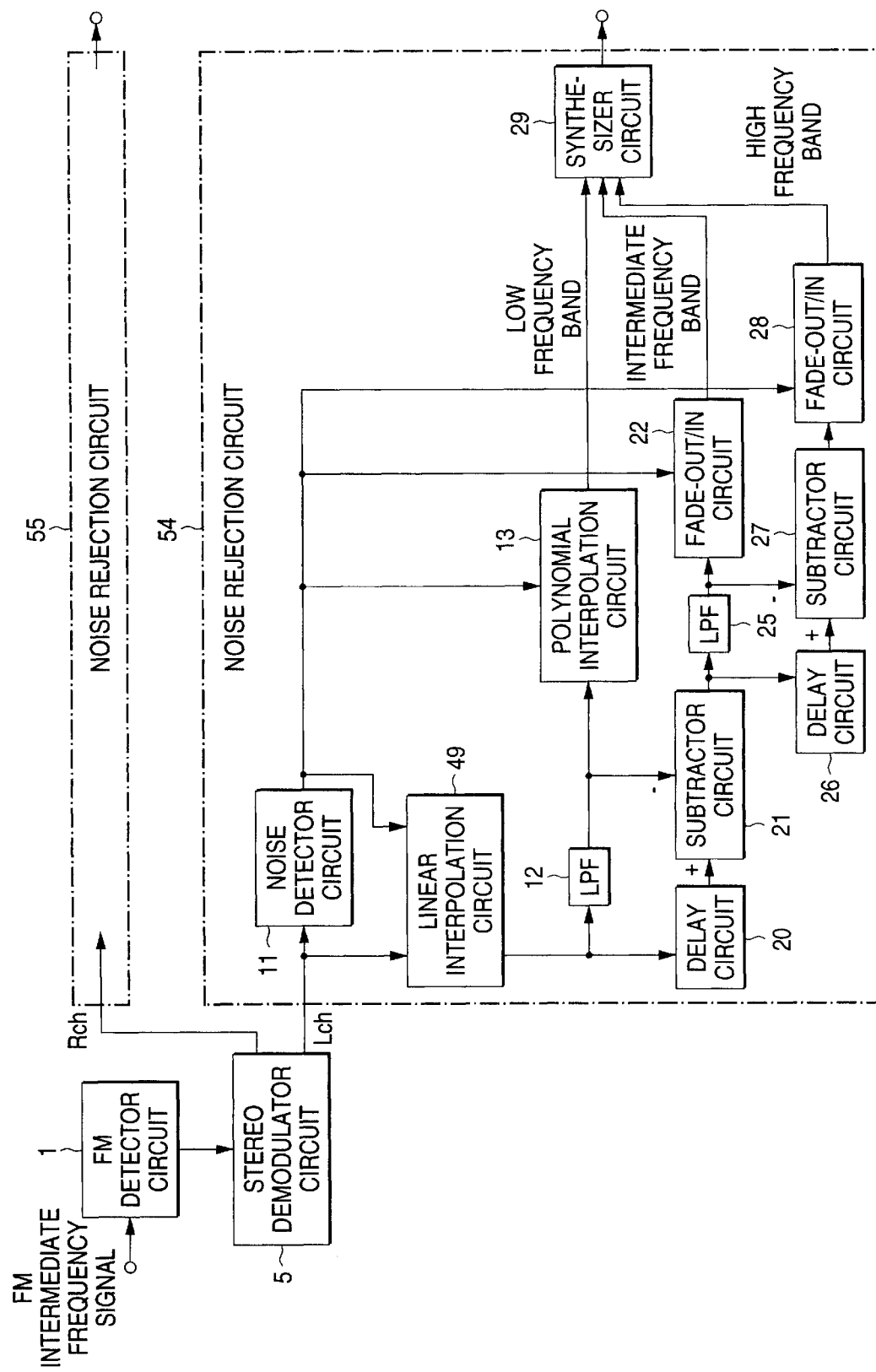
FIG. 38 is a third block diagram showing a configuration of the embodiment 8 of the present invention.
Figure 39:
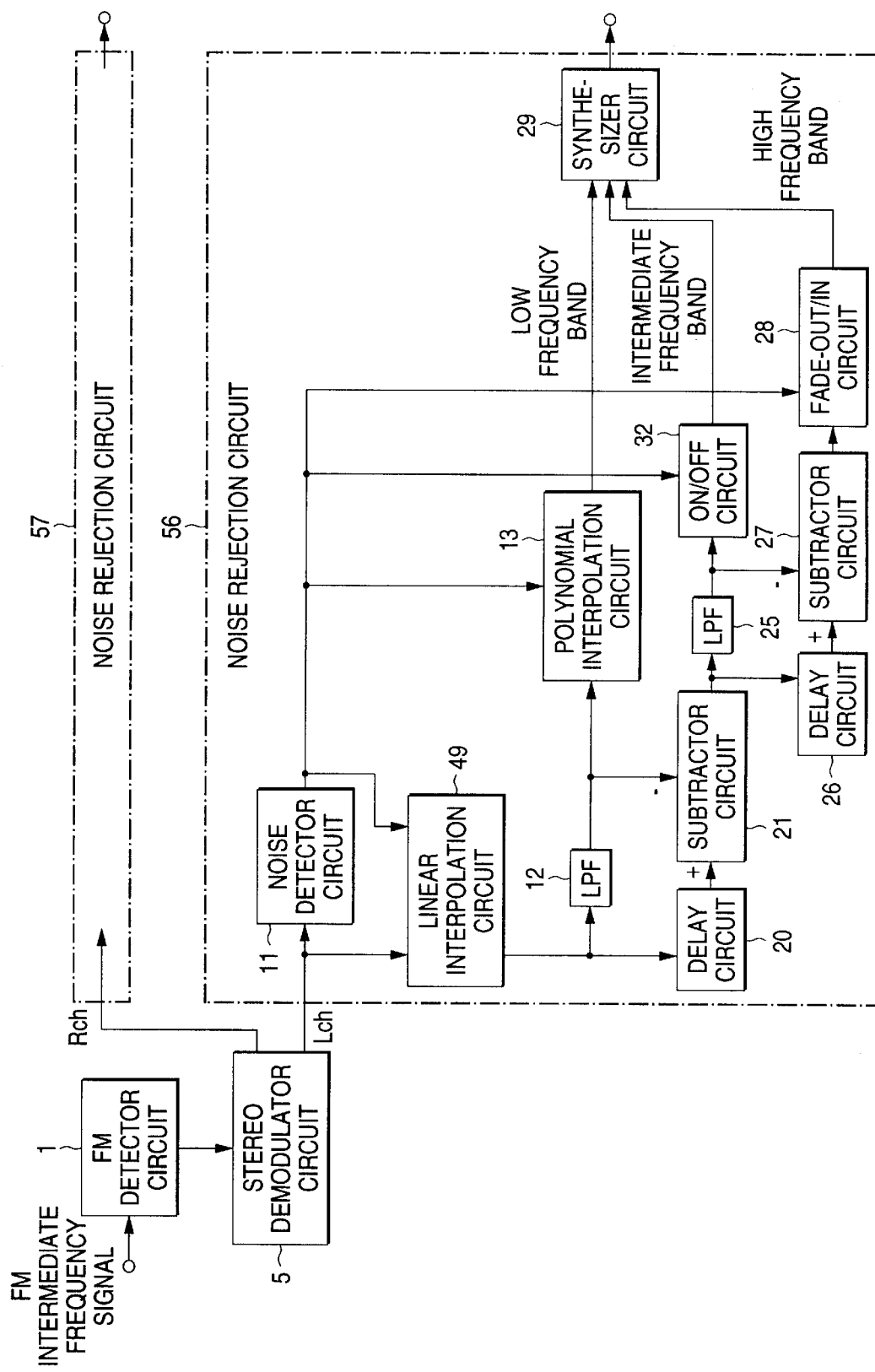
FIG. 39 is a fourth block diagram showing a configuration of the embodiment 8 of the present invention.
Figure 40:
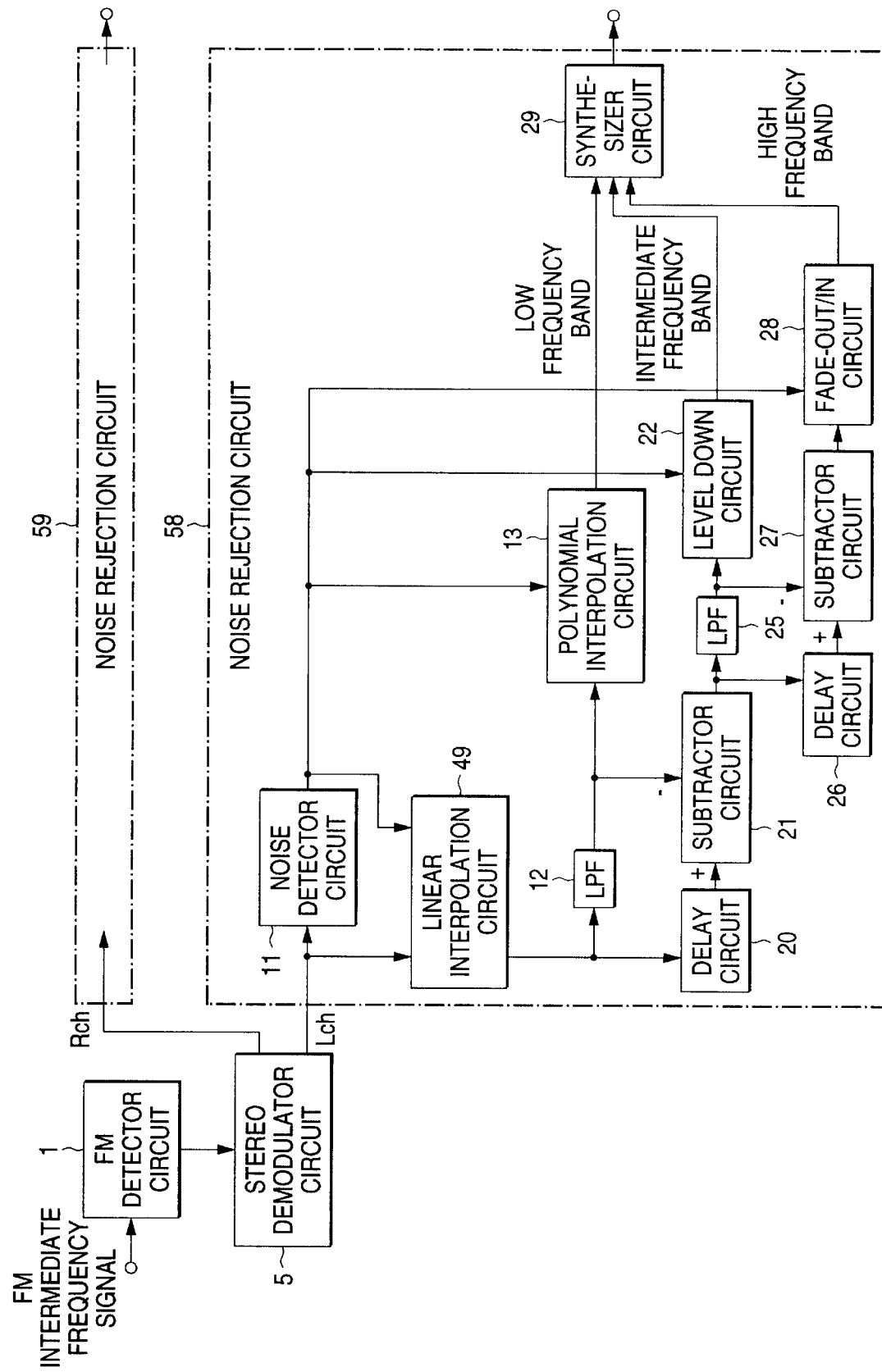
FIG. 40 is a fifth block diagram showing a configuration of the embodiment 8 of the present invention.
Figure 41:
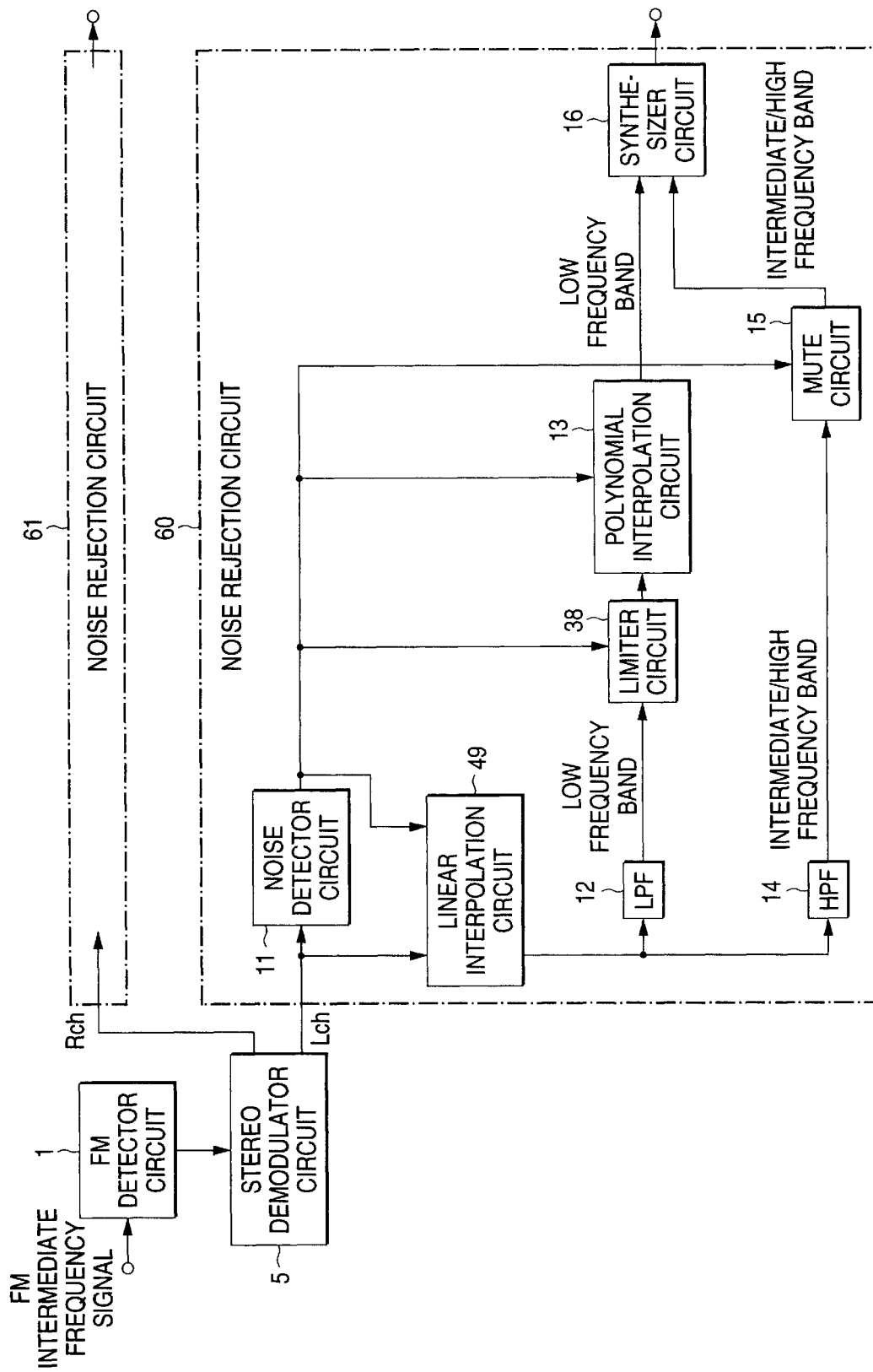
FIG. 41 is a first block diagram showing a configuration of an embodiment 9 of the present invention.
Figure 42:
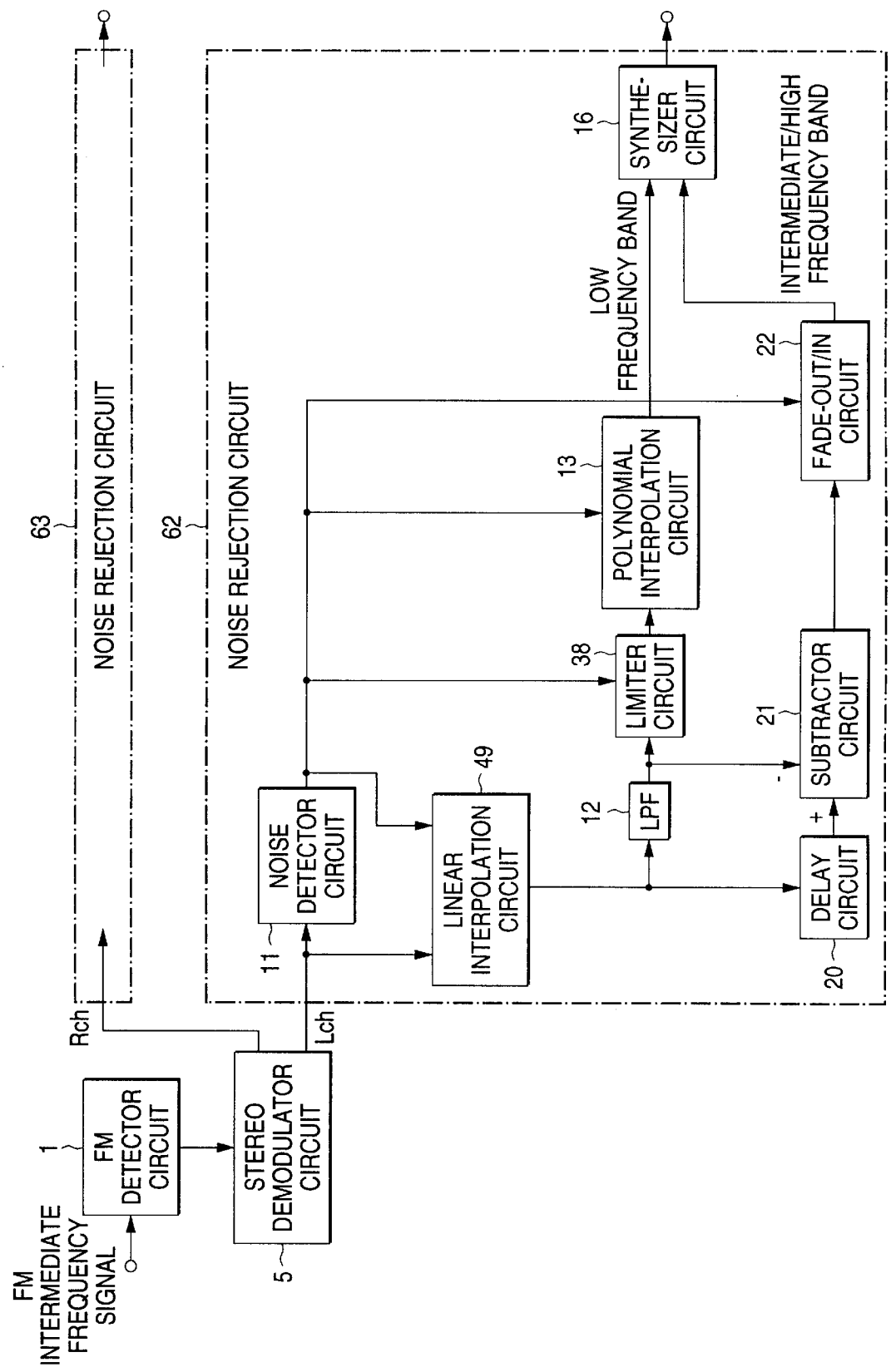
FIG. 42 is a second block diagram showing a configuration of the embodiment 9 of the present invention.
Figure 43:
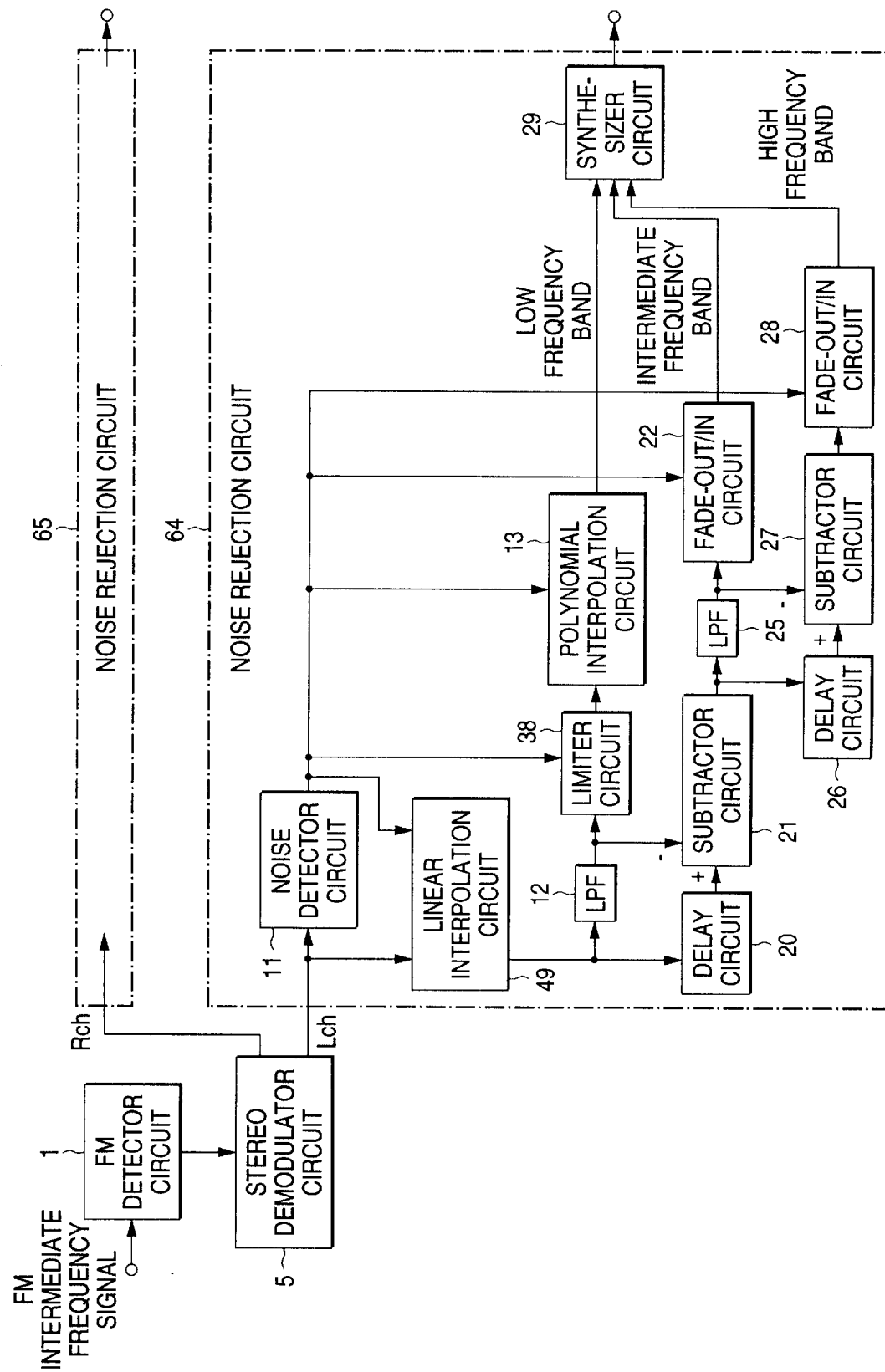
FIG. 43 is a third block diagram showing a configuration of the embodiment 9 of the present invention.
Figure 44:
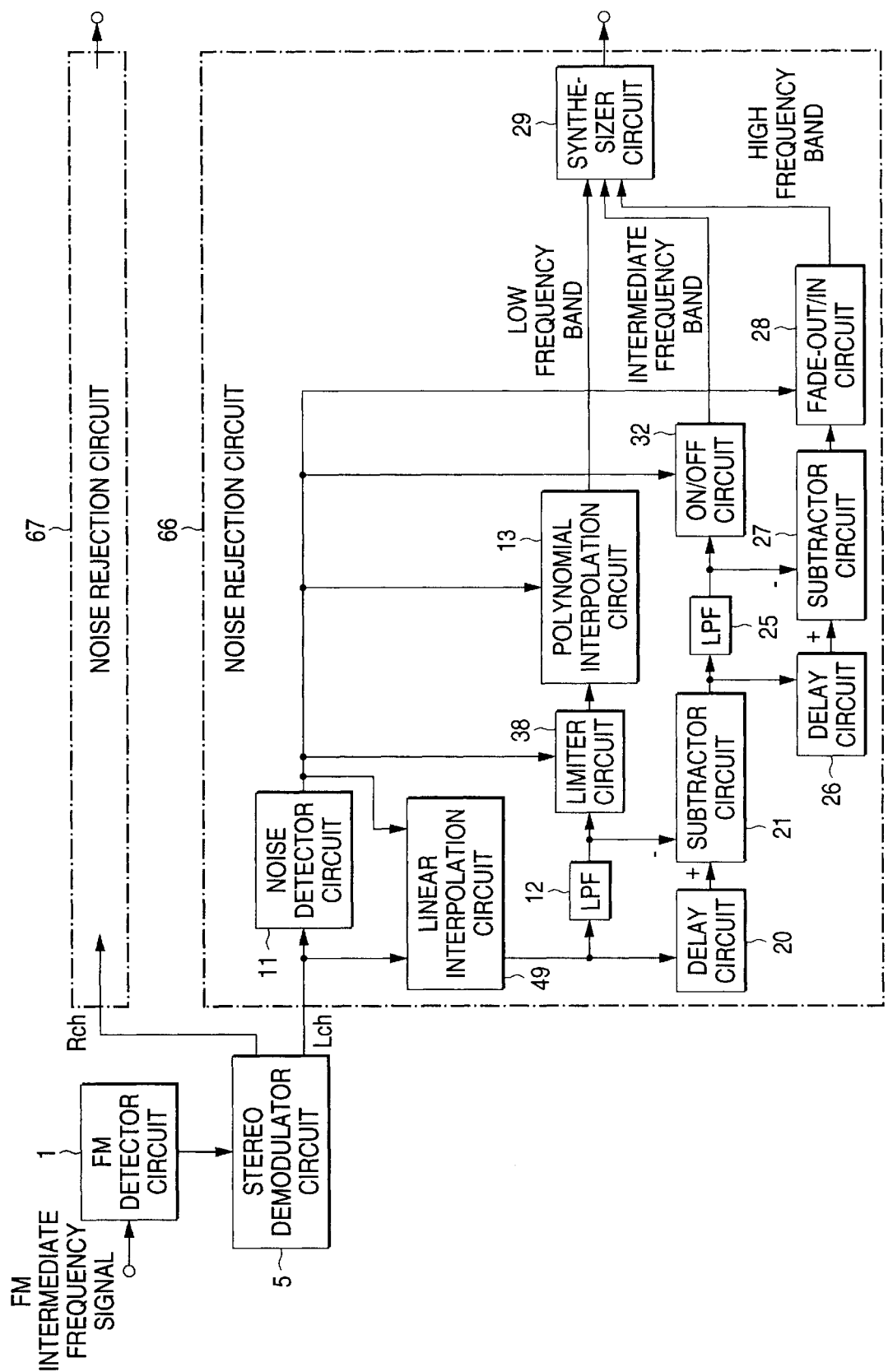
FIG. 44 is a fourth block diagram showing a configuration of the embodiment 9 of the present invention.
Figure 45:
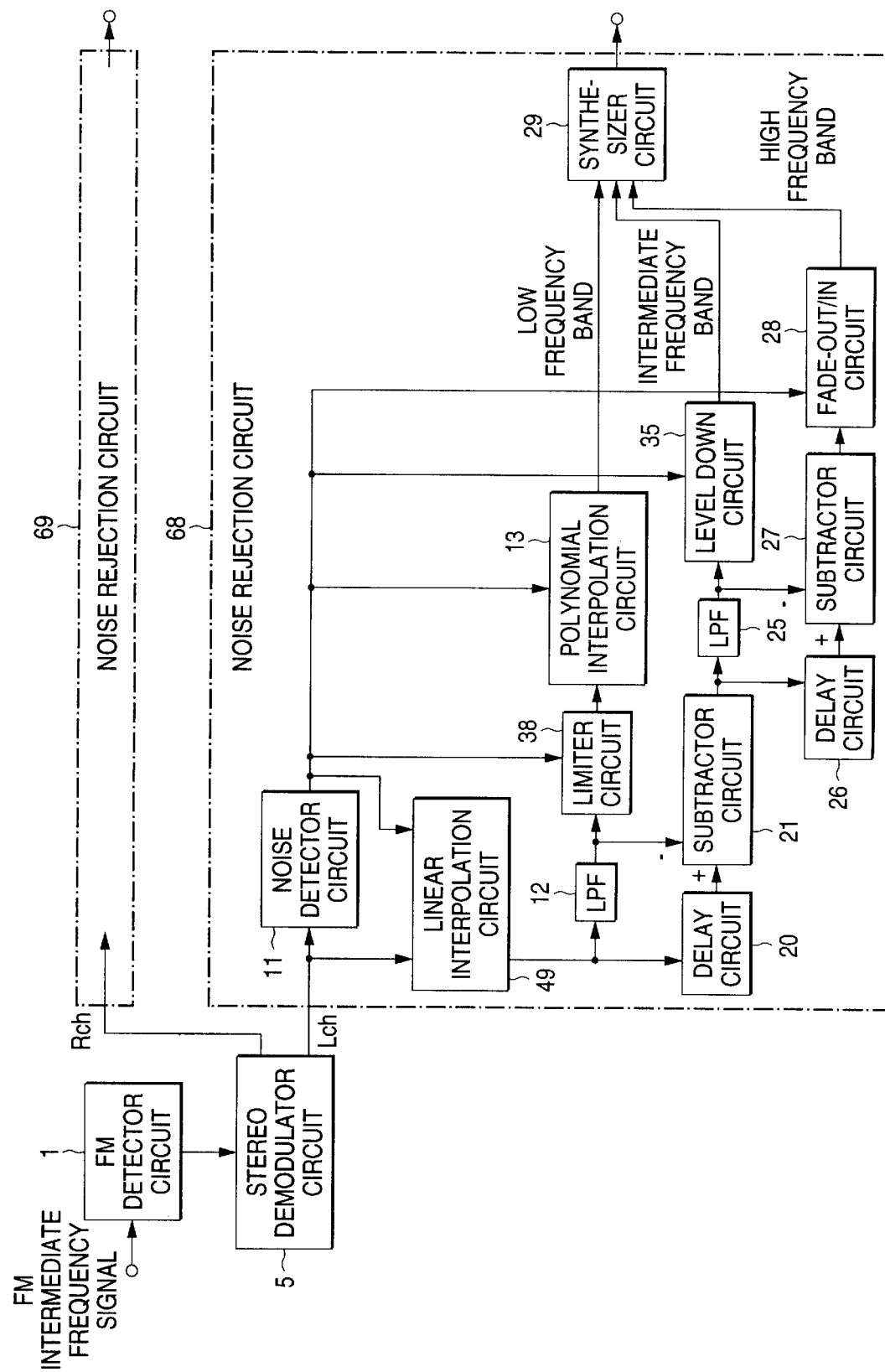
FIG. 45 is a fifth block diagram showing a configuration of the embodiment 9 of the present invention.
Figure 47:
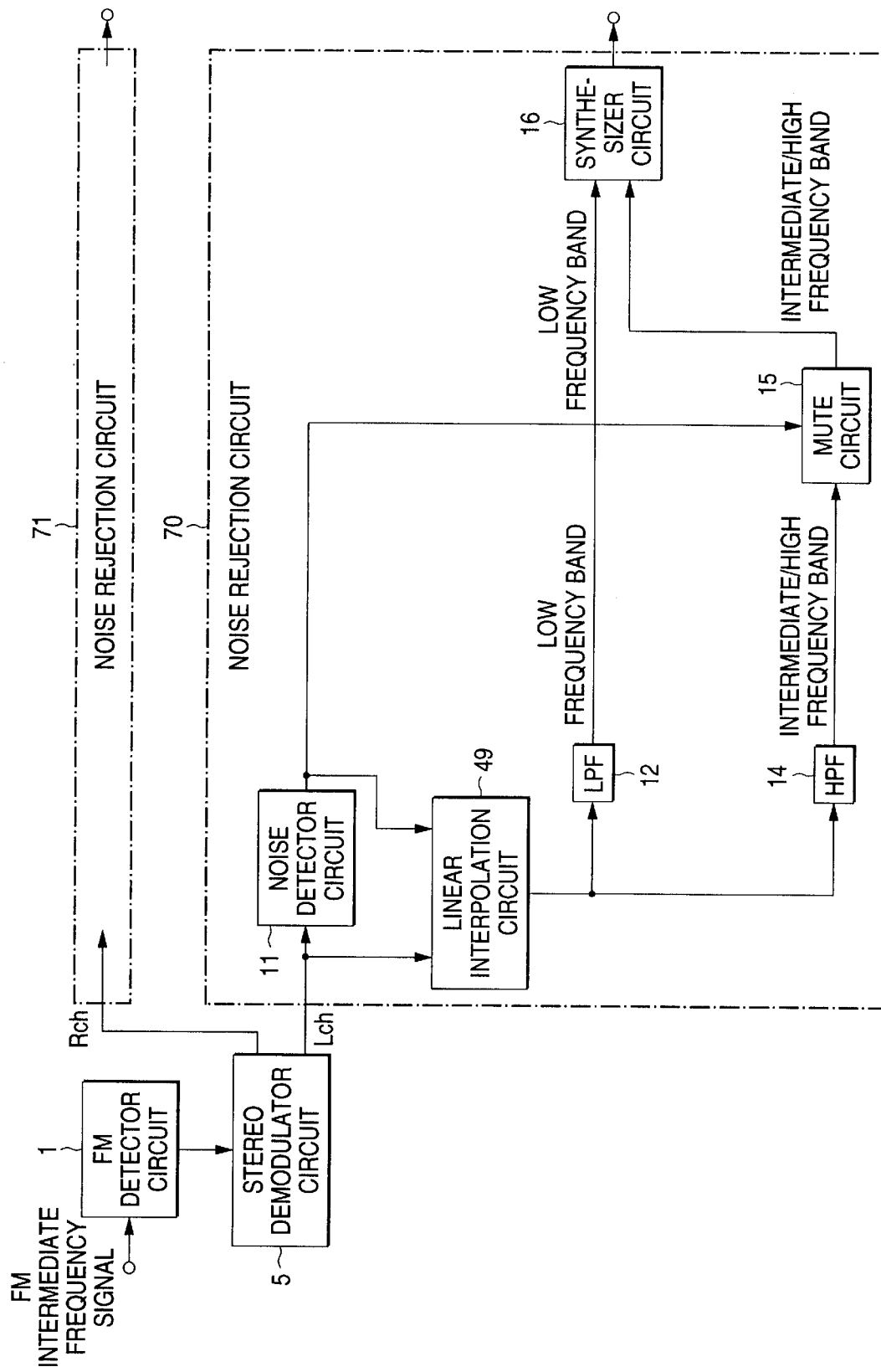
FIG. 47 is a first block diagram showing a configuration of an embodiment 10 of the present invention.
Figure 48:
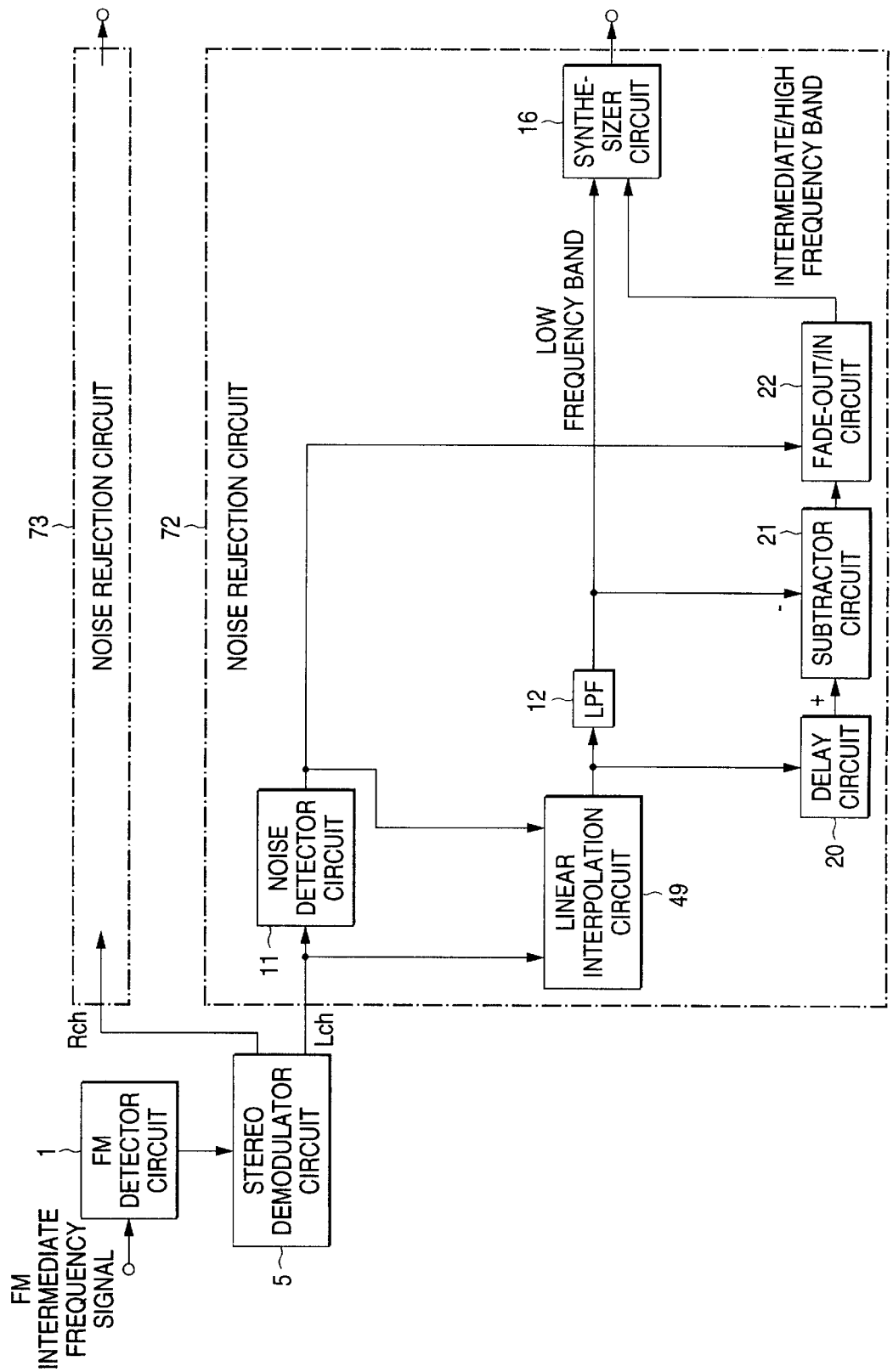
FIG. 48 is a second block diagram showing a configuration of the embodiment 10 of the present invention.
Figure 49:
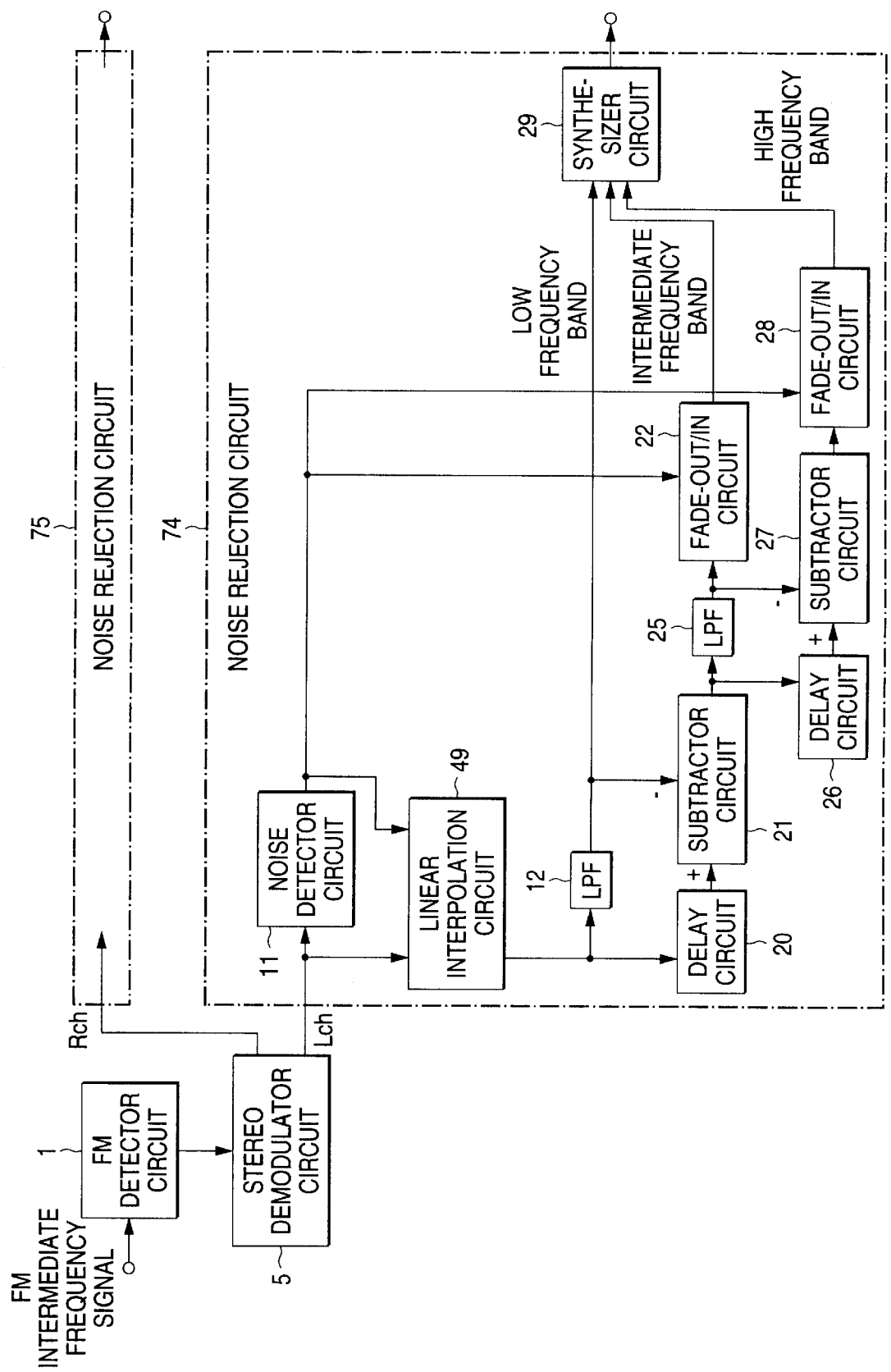
FIG. 49 is a third block diagram showing a configuration of the embodiment 10 of the present invention.
Figure 50:
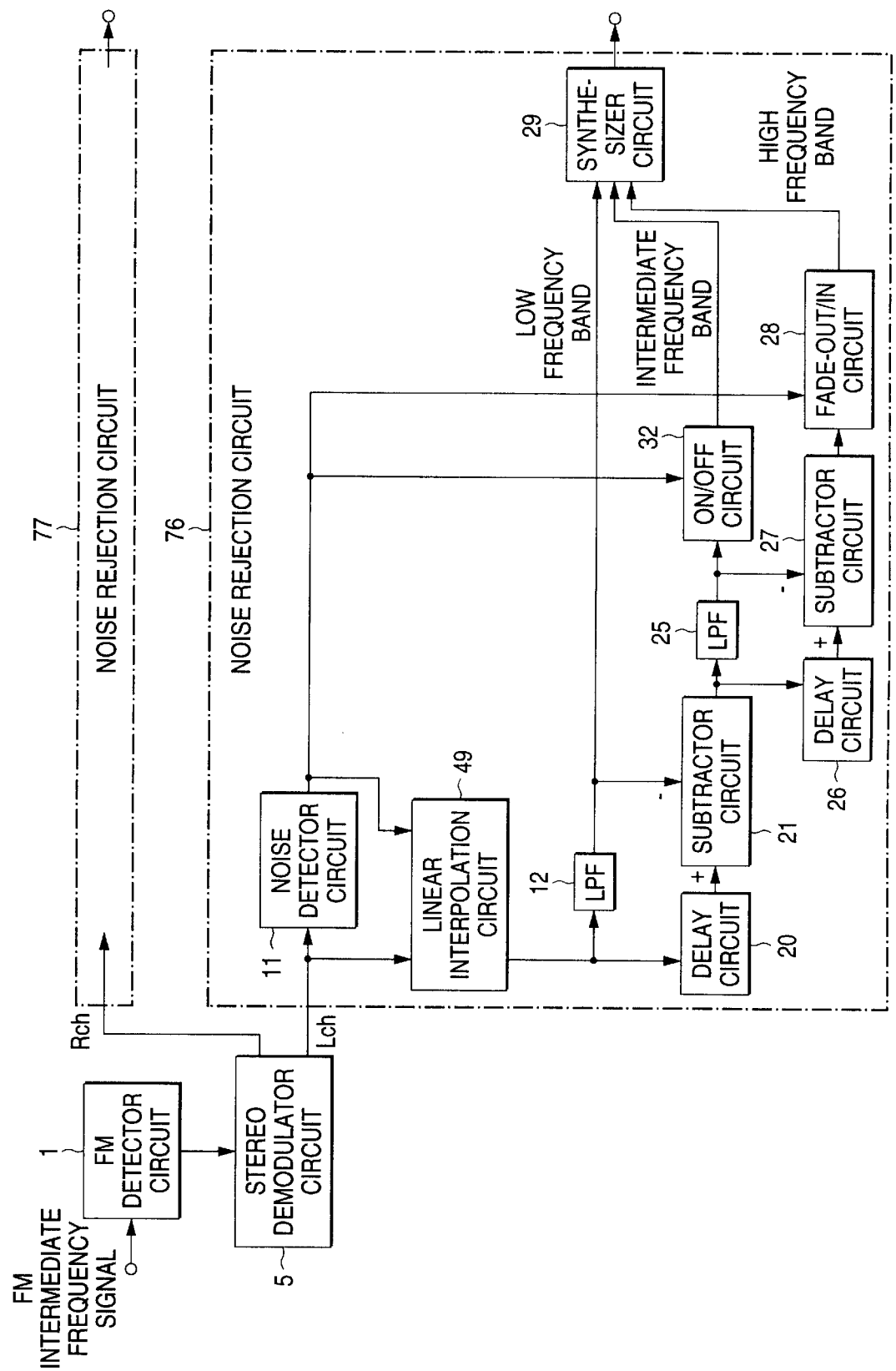
FIG. 50 is a fourth block diagram showing a configuration of the embodiment 10 of the present invention.
Figure 51:
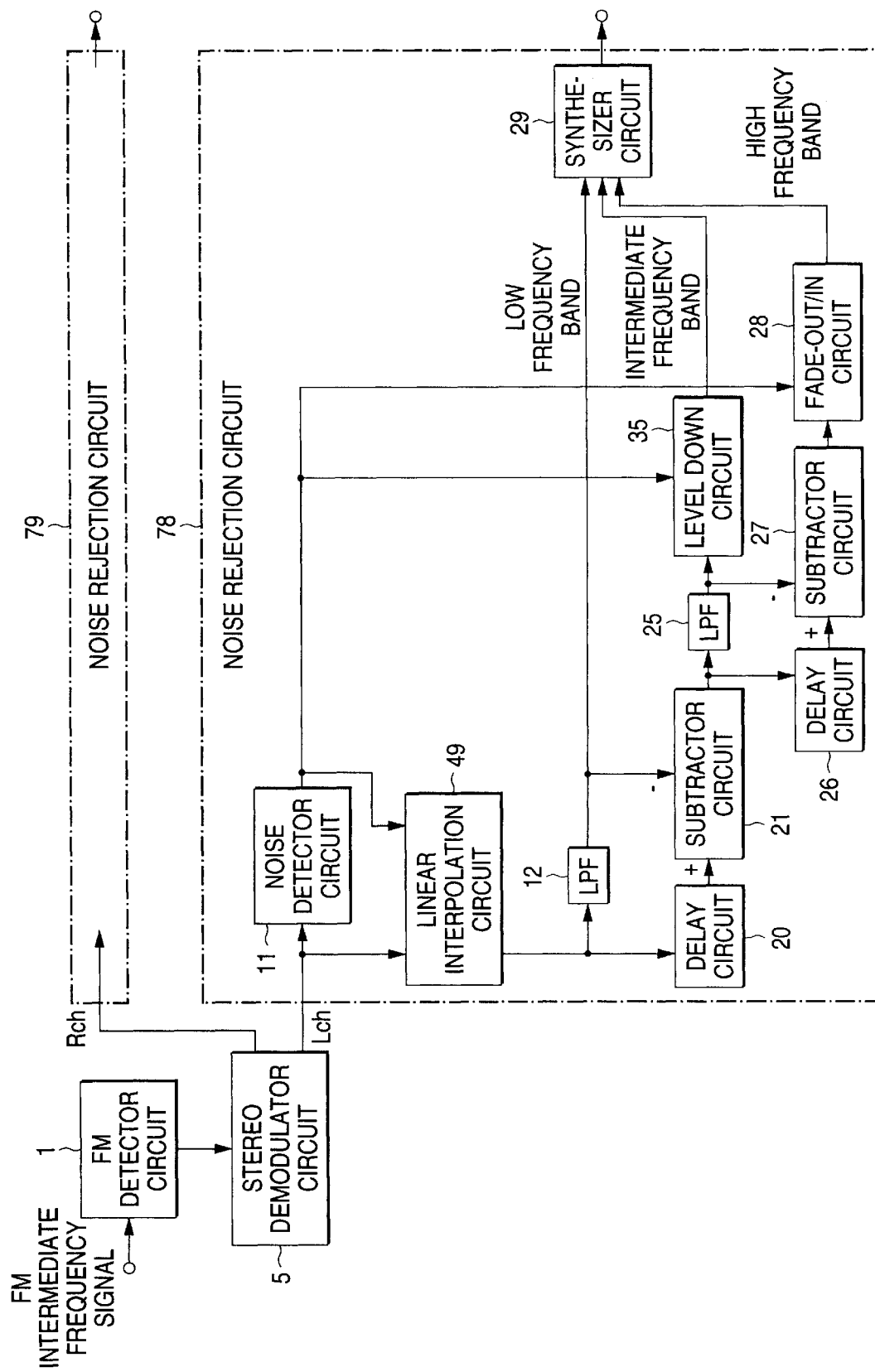
FIG. 51 is a fifth block diagram showing a configuration of the embodiment 10 of the present invention.

As shown in FIG. 29, for example, a method in which almost $\theta=\pi/2$ in $\sin \theta$ is employed as a coefficient, and others may be considered as the characteristic of the saturation curve in the fade-out/in circuits 22, 28.

EMBODIMENT 7

FIGS. 30 to 34 are first to fifth block diagrams showing noise rejection circuits according to an embodiment 7 of the present invention respectively. References 39 to 48 are the noise rejection circuits. In the embodiment 7, a limiter circuit 38 is inserted before the polynomial interpolation circuit 13 shown in FIGS. 1, 12, 16, 20, and 24 which shows the configurations of the embodiments 1 to 5. An operation of the embodiment 7 is completely similar to those of the embodiments 1 to 5 other than operations of the limiter circuit 38 and the polynomial interpolation circuit 13, and therefore its explanation will be omitted in this disclosure.

In general, if the cut-off characteristic of the LPF 12 is set to be steep, the number of tap in the filter must be increased, so that the configuration becomes complicated and is not available in practical use. If the configuration is constructed to compromise with the practical configuration, the cut-off characteristic can be made gentle, so that the intermediate and high frequency components still remains in the output of the LPF 12. Therefore, in the embodiment 7, reduction of this influence will be achieved by providing the limiter circuit 38.

FIG. 35 is a view showing an operation of the limiter circuit 38. FIG. 35A shows the audio signal which is input into the LPF 12, wherein a broken line portion is the noise period. FIG. 35B shows the case where the pulse-like noise period in the low frequency component being output from the LPF 12, whose cut-off characteristic is gentle, is interpolated by the polynomial interpolation circuit 13. In this case, because the intermediate and high frequency components still remain in the signal, an inclination of a segment which is defined by two both end points (see FIG. 2) serving as start points of the polynomial interpolation is enhanced, so that protruded interpolation is obtained. When receives the detection signal of the noise detector circuit 11, the limiter circuit 38 limits the inclination of the segment defined by two both end points serving as start points of the polynomial interpolation such that a degree of such inclination of the segment does not exceed a predetermined value. FIG. 35C shows the low frequency component being output from the polynomial interpolation circuit 13 when the limiter circuit 38 is provided in the embodiment 7, wherein the protrusion caused by the polynomial interpolation can be suppressed.

EMBODIMENT 8

FIGS. 36 to 40 are block diagrams showing noise rejection circuits according to an embodiment 8 of the present invention. References 50 to 69 denote the noise rejection circuits respectively. In this embodiment 8, a linear interpolation circuit 49 is inserted before the LPF 12 shown in FIGS. 1, 12, 16, 20 and 24, which show the embodiments 1 to 5 respectively. Thus, after linear interpolation is applied to a period during when the pulse-like noise is detected by the noise detector circuit 11, the audio signal is then input into the LPF 12 and the delay circuit 20.

FIG. 46 is a view showing an operation of the linear interpolation circuit 49. FIG. 46A shows the audio signal being input into the LPF 12 when the linear interpolation circuit 49 is not employed. FIG. 46B shows the audio signal being input into the LPF 12 when linear interpolation is applied by the linear interpolation circuit 49 is not employed. Two circles depicted in the middle of FIG. 46 represent the outputs of the LPF 12 which are derived in respective cases in FIGS. 46A and 46B. Arrows depicted in both circles indicate the inclination of the segment defined by two points on boundaries between the noise period and the signal, i.e., two points acting as the start points when the polynomial interpolation is executed by the polynomial interpolation circuit 13 at the succeeding stage respectively. In order to effect the interpolation of the low frequency component well, an influence of the noise period must be reduced small.

In the case of FIG. 46A, since the signal is passed through the LPF 12 under the condition that the pulse-like noise which has a higher amplitude than the signal is superposed, the influence on boundaries of the noise period becomes large rather than the case where no pulse-like noise is superposed. Thus, the low frequency component being output from the LPF 12 is deformed at such boundaries. In contrast, in the case of FIG. 46B, since the linear interpolation is also applied to the noise portion, the low frequency component being output from the LPF 12 is also deformed in contrast to the case where no pulse-like noise is superposed. However, an extent of such deformation can be reduced small rather than FIG. 46A.

According to the embodiment 8, an extent of the deformation of the inclination of the segment defined by two respective preceding and succeeding points, which serve as the start points of the linear interpolation for the low frequency component, is made small rather than the case where the low frequency component in which the pulse-like noise is still contained is extracted by the LPF 12. Hence, the protruded interpolation signal is not formed and thus the audio signal never becomes remarkably discontinuous at the start and the end of the noise period.

EMBODIMENT 9

FIGS. 41 to 45 are block diagrams showing noise rejection circuits according to an embodiment 9 of the present invention. References 50 to 69 denote the noise rejection circuits respectively. In this embodiment 9, the linear interpolation circuit 49 is inserted immediately before the LPF 12 in FIGS. 30 to 34 which show the configuration of the embodiment 7. Thus, the linear interpolation is applied to the period during when the pulse-like noise is detected by the noise detector circuit 11, then the audio signal is input into the LPF 12 and the delay circuit 20, and then the noise period of the low frequency component which is output from the LPF 12 is limited by the limiter circuit 38 the such that a degree of the inclination of the segment defined by two both ends serving as the start points of the polynomial interpolation does not exceed a predetermined value, whereby protrusion caused by the polynomial interpolation can be suppressed.

According to the embodiment 9, since effects achieved by the embodiments 7 and 8 can be obtained, continuity of the audio signal before and after the noise period can be improved much more.

EMBODIMENT 10

FIGS. 47 to 51 are block diagrams showing a noise rejection circuit according to an embodiment 10 of the present invention. References 70 to 79 denotes the noise rejection circuit respectively. In this embodiment 10, the polynomial interpolation circuit 13 which is shown in FIGS. 36 to 40 to indicate the configuration of the embodiment 8 is removed. In the embodiment 10, after the audio signal is linear-interpolated, the low frequency component extracted by the LPF 12 and the intermediate and high frequency components are synthesized by the synthesizer circuit 16 or 29.

FIG. 52 is a view showing an operation for processing the low frequency component which is common in FIGS. 47 to 51. FIG. 52A shows the audio signal which is input into the linear interpolation circuit 49. FIG. 52B shows an output signal of the linear interpolation circuit 49. FIG. 52C shows the low frequency component which is output from the LPF 12. For the purpose of comparison, FIG. 52D shows the low frequency component which is output from the polynomial interpolation circuit 13 in FIG. 36.

Figure 52A:
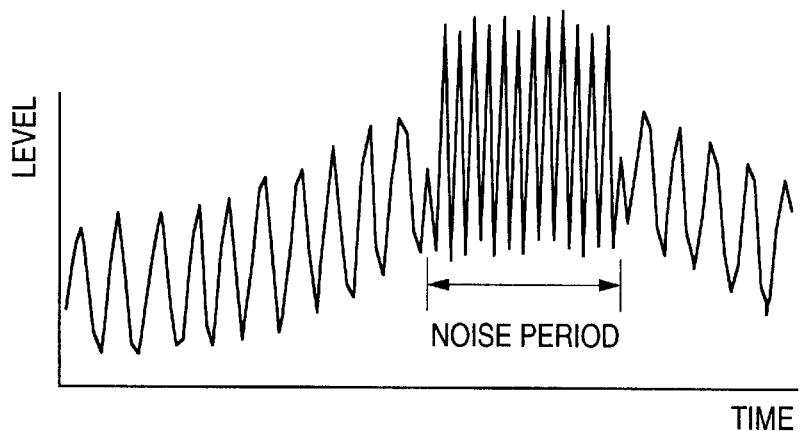
FIGS. 52A–52D are views showing an operation for processing a low frequency component in the embodiment 9.
Figure 52B:
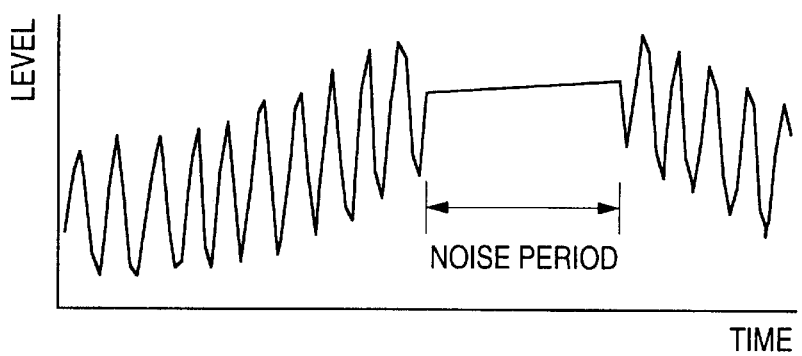
Figure 52C:
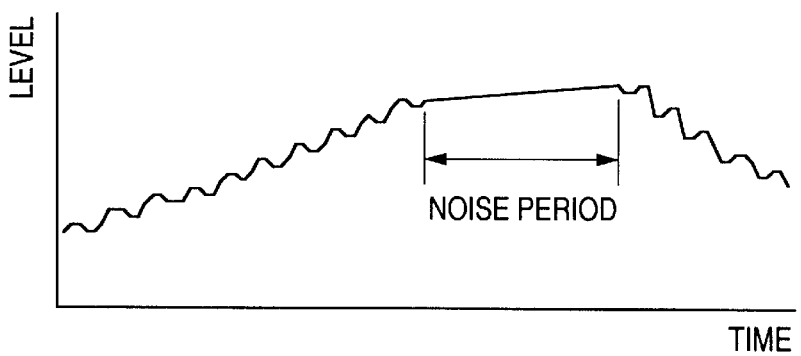
Figure 52D:
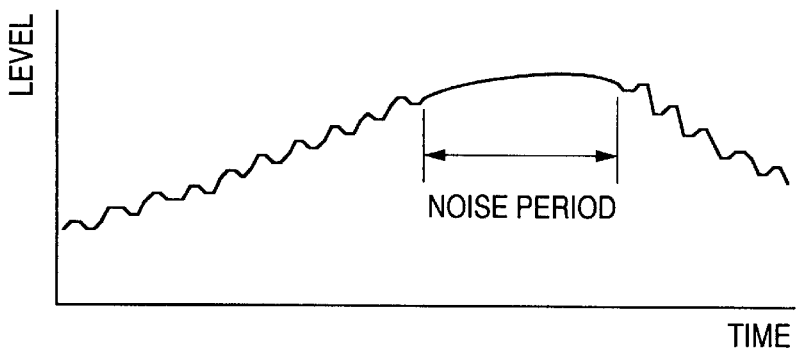

In the embodiment 10, since the low frequency component is linear-interpolated as shown in FIG. 52C and then extracted by the LPF 12, the noise period becomes linear rather than the case where the polynomial interpolation is executed as shown in FIG. 52D. For this reason, the embodiment 10 is inferior in smoothness of the connection between the start and end points of the noise period and the signal, nevertheless the configuration can be simplified because of omission of the polynomial interpolation circuit 13.

EMBODIMENT 11

Figure 57:
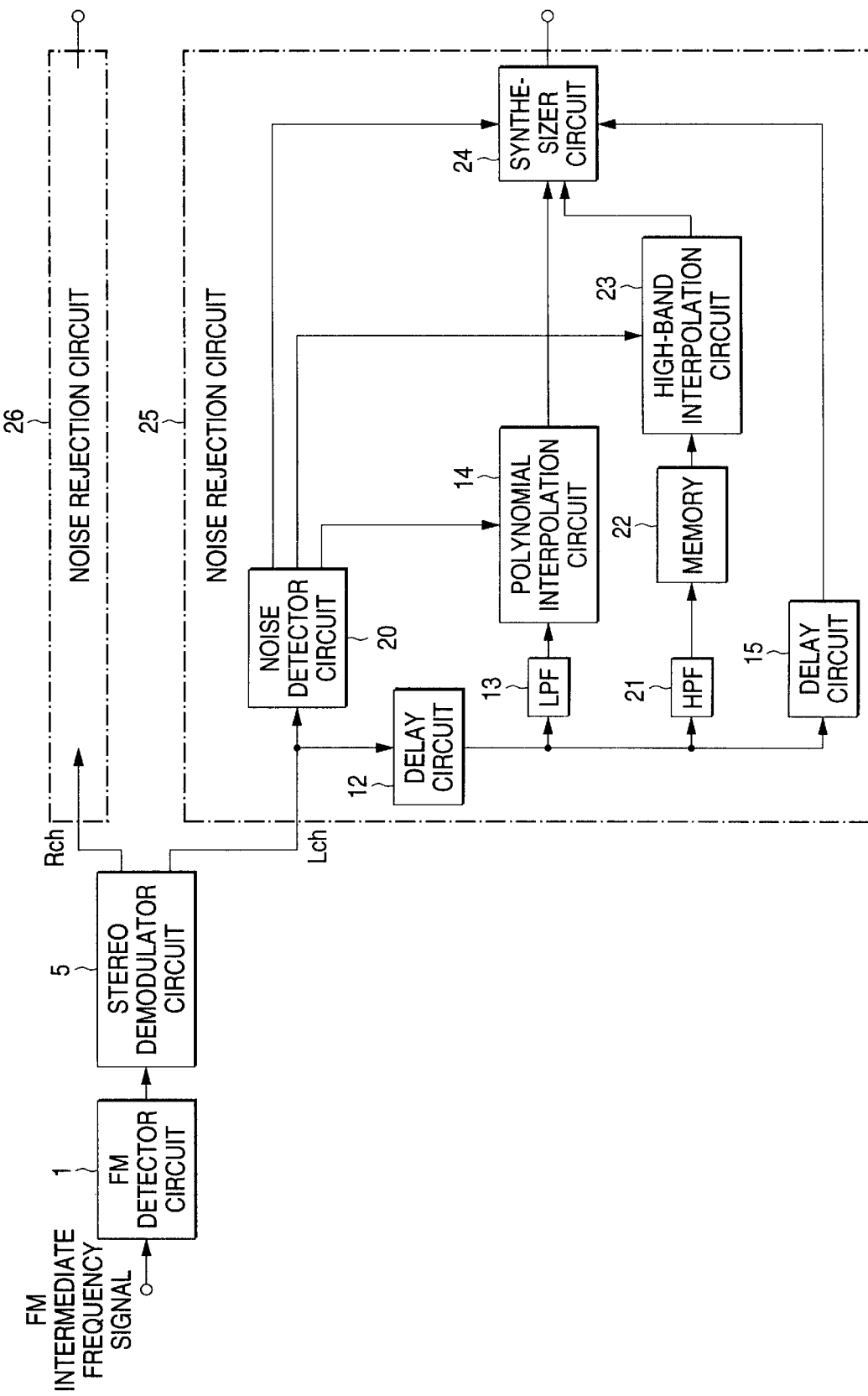
FIG. 57 is a block circuit diagram showing a noise noise reduction system according to an embodiment 11.

FIG. 57 is a block circuit diagram showing a noise noise reduction system according to an embodiment 11 of the present invention. In FIG. 57, a reference 1 denotes an FM detector circuit; 5, a stereo demodulator circuit; 12, a delay circuit; 13, an LPF; 14, a polynomial interpolation circuit; 15, a delay circuit; 20, a noise detector circuit; 21, a high-pass filter (referred to as "HPF" hereinafter); 22, a memory; 23, a high frequency band interpolation circuit; and 24, a synthesizer circuit. A noise rejection circuit 25 for the audio signal output from the stereo demodulator circuit 5 over one channel is composed of these constituent elements. A reference 26 denotes another noise rejection circuit. Since a configuration of the noise rejection circuit 26 is identical to that of the noise rejection circuit 25, its explanation will be omitted in this disclosure.

Since operations of the parts which are overlapped with those in the previous embodiments, i.e., the FM detector circuit 1, the stereo demodulator circuit 5, the delay circuit 12, the LPF 13, the polynomial interpolation circuit 14 are totally similar, their explanation will be omitted in this disclosure.

An output of the delay circuit 12 is input into the HPF 21 in which the low frequency component is then removed. The audio signal from which the low frequency component is removed by the HPF 21 is input into the memory 22 to be stored therein sequentially. Thus, a certain amount of the audio signal, from which the low frequency component is removed immediately before a certain point of time, are always stored in the memory 22. The high frequency band interpolation circuit 23 picks out the preceding signal from the memory 22 as the high frequency band interpolation signal over the period, over which the pulse-like signal is detected from the output of the noise detector circuit 20, by an amount to compensate the period.

Figure 58A:
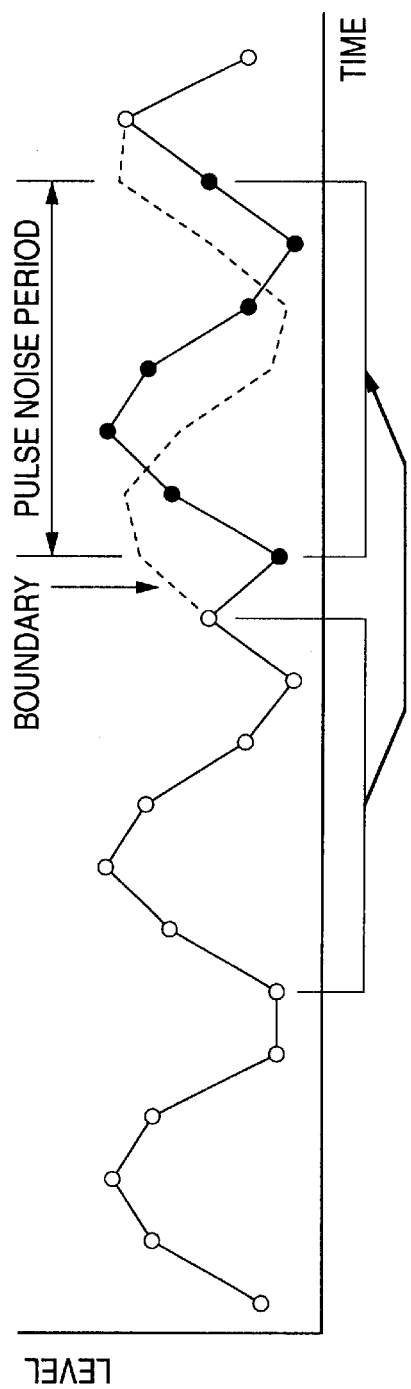
FIG. 58 is a view showing an example of operations of the high frequency band interpolation.
Figure 58B:
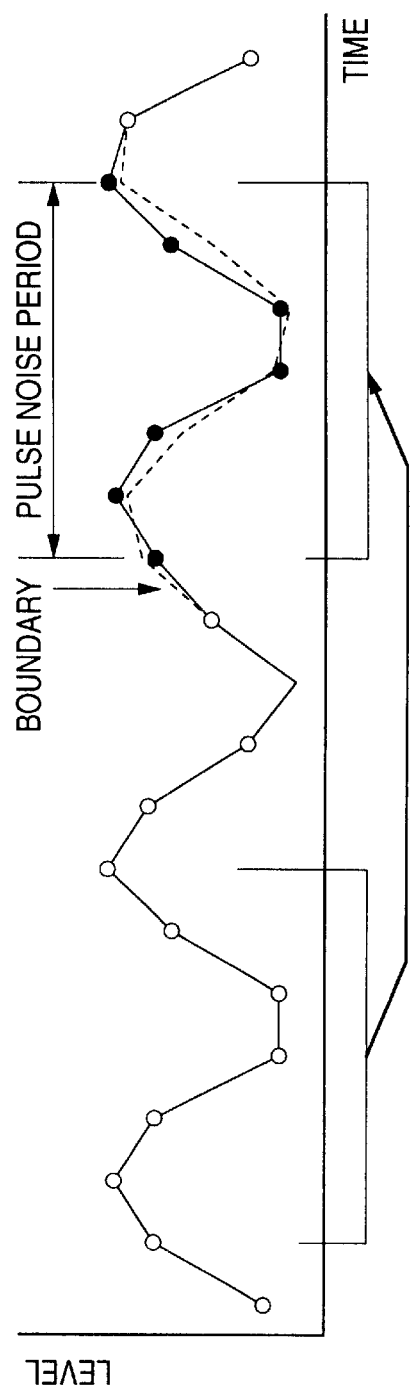

FIG. 58 is a view showing an example of operations of the high frequency band interpolation circuit 23 and the memory 22. In FIG. 58, a broken line denotes an original signal which is omitted due to the pulse-like noise. If the preceding signal is picked out simply and fixedly from the memory 22 by the high frequency band interpolation circuit 23 over the period from which the pulse-like signal is detected, there is a possibility that discontinuity is caused at boundaries, as shown in FIG. 58A. Therefore, as shown in FIG. 58B, such a method is employed that the preceding signal can be picked out until it is shifted to a location not to cause the discontinuity at the boundaries.

Figure 59A:
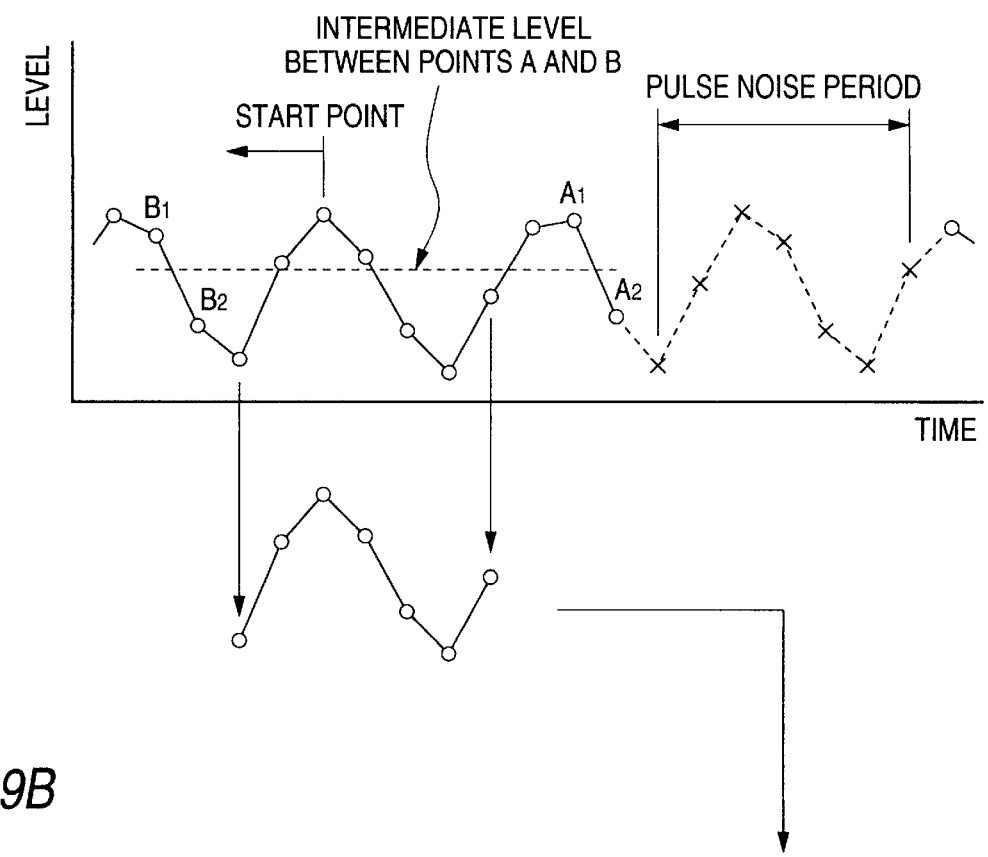
FIG. 59 is a view showing an example of phase matching.
Figure 59B:
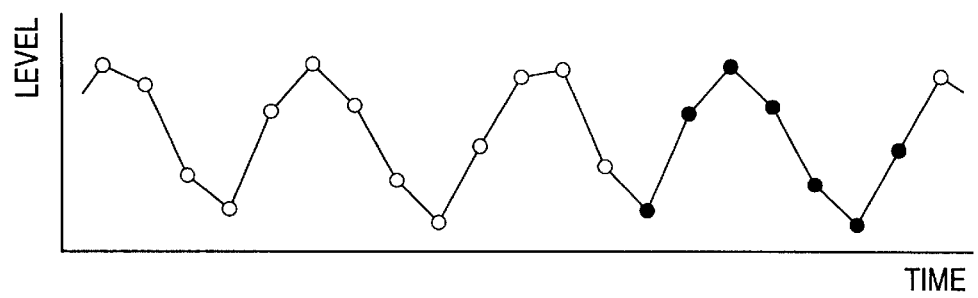

FIG. 59 is a view showing an example of particular methods. With regard to the signal in the preceding region of the pulse-like noise period stored in the memory 22, while using a location relationship of two points A1, A2 immediately before the pulse-like noise period, i.e., an inclination relationship of a straight line connecting both points, and the level of an intermediate point, a time is returned to a location which goes up from the point A2 by the same period as the pulse-like noise period as a start point, then two points B1, B2 which oppose to each other with the same inclination to put the level of the intermediate point between them are detected, and then the signal corresponding to the pulse-like noise period is picked out from the succeeding region of the point B2.

Figure 60:
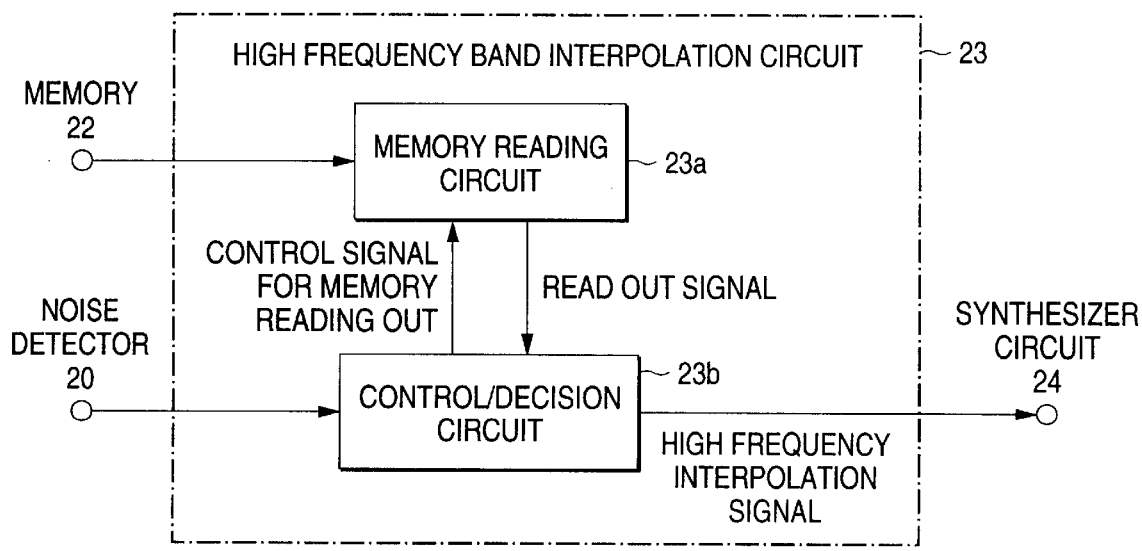
FIG. 60 is a view showing an example of concrete configuration of the high frequency band interpolation circuit.

FIG. 60 is a view showing an example of a concrete configuration of the high frequency band interpolation circuit 23. This high frequency band interpolation circuit 23 is composed of a memory reading circuit 23a and a control/decision circuit 23b. Based on a noise detecting location of an output of the noise detector circuit 20 toward the high frequency band interpolation circuit 23 and a width of the noise, the control/decision circuit 23b instructs the memory reading circuit 23a to receive a start point of reading the signal from the memory 22 and to read the signal. Then, in answer to the results read from the memory reading circuit 23a, the control/decision circuit 23b goes up in the memory space along the time direction while executing the decision described in FIG. 59, then reads the signal corresponding to the pulse-like noise period immediately after a detected point, and then outputs the signal to be common in phase with an output of the polynomial interpolation circuit 14, which is synthesized in the synthesizer circuit 24.

While, an output of the delay circuit 12 is delayed by the delay circuit 15 by an amount to coincide in timing with an output of the polynomial interpolation circuit 14 and an output of the high frequency band interpolation circuit 19. An output of the audio signal of the delay circuit 15, an output of the low frequency band interpolation signal of the polynomial interpolation circuit 14, and an output of the high frequency band interpolation circuit 23 are input into the synthesizer circuit 24. Then, according to the results of noise detection in the output of the noise detector circuit 20 toward the synthesizer circuit 24, the synthesizer circuit 24 exchanges the noise portion of the audio signal with the interpolation signal to output a synthesized signal.

Figure 61:
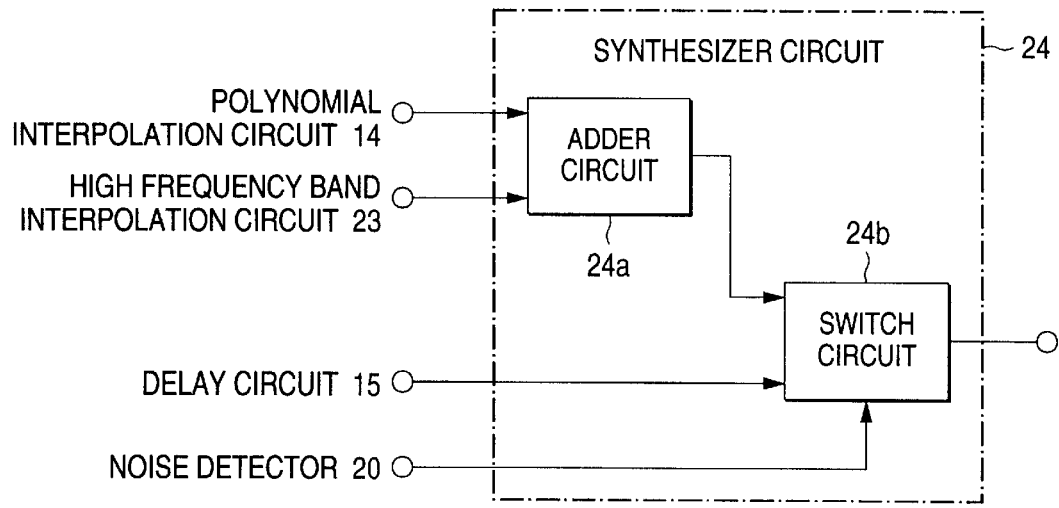
FIG. 61 is a view showing an example of a concrete configuration of the synthesizer circuit.

FIG. 61 is a view showing an example of a concrete configuration of the synthesizer circuit 24. This synthesizer circuit 24 is composed of an adder circuit 24a and a switch circuit 24a. The low frequency band interpolation signal as an output of the polynomial interpolation circuit 14 and the high frequency band interpolation signal as an output of the high frequency band interpolation circuit 23 are added by the adder circuit 24a. The switch circuit 24b exchanges an output of the delay circuit 15 with an output of the adder circuit 24a according to an output of the noise detector circuit 20 to then output the synthesized signal.

Figure 62:
FIG. 62 is a view showing timings of the interpolation operation.
Figure 62:
Figure 62:
Figure 62:
Figure 62:
Figure 62:
Figure 62:
Figure 62:
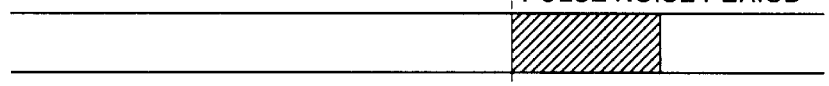
Figure 62:
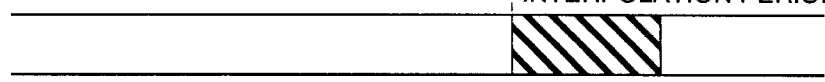

FIG. 62 is a view showing timings of the polynomial interpolation circuit 14, the high frequency band interpolation circuit 23, and the delay circuit 15. FIG. 62A shows the result of noise detection by the noise detector circuit 20. FIG. 62B shows an output of the delay circuit 12. FIG. 62C shows an output of the noise detector circuit 20 directed toward the polynomial interpolation circuit 14. FIG. 62D shows an output of the LPF 13 and an output of the low frequency band interpolation signal of the polynomial interpolation circuit 14. FIG. 62E shows an output of the noise detector circuit 20 directed toward the high frequency band interpolation circuit 23. FIG. 62F shows an output of the HPF 21 and an output of the high frequency band interpolation signal of the high frequency band interpolation circuit 23. FIG. 62G shows an output of the noise detector circuit 20 directed toward the synthesizer circuit 24. FIG. 62H shows an output of the delay circuit 15. FIG. 62I shows an output of the synthesizer circuit 24. Normally, the LPF has a larger delay amount that the HPF and thus the output of the polynomial interpolation circuit 14 is output at a mostly delayed timing in time. Accordingly, the output of the high frequency band interpolation circuit 23 and the output of the delay circuit 15 operate in synchronous with the output of the polynomial interpolation circuit 14 in timing. The noise detector circuit 20 outputs its output at timings defined fixedly according to respective connected destinations, i.e., timings which are defined by the delay by caused the LPF 13, the delay caused by the HPF 21, and a time required to output the low frequency band interpolation signal to the output of the polynomial interpolation circuit 14.

Figure 63A:
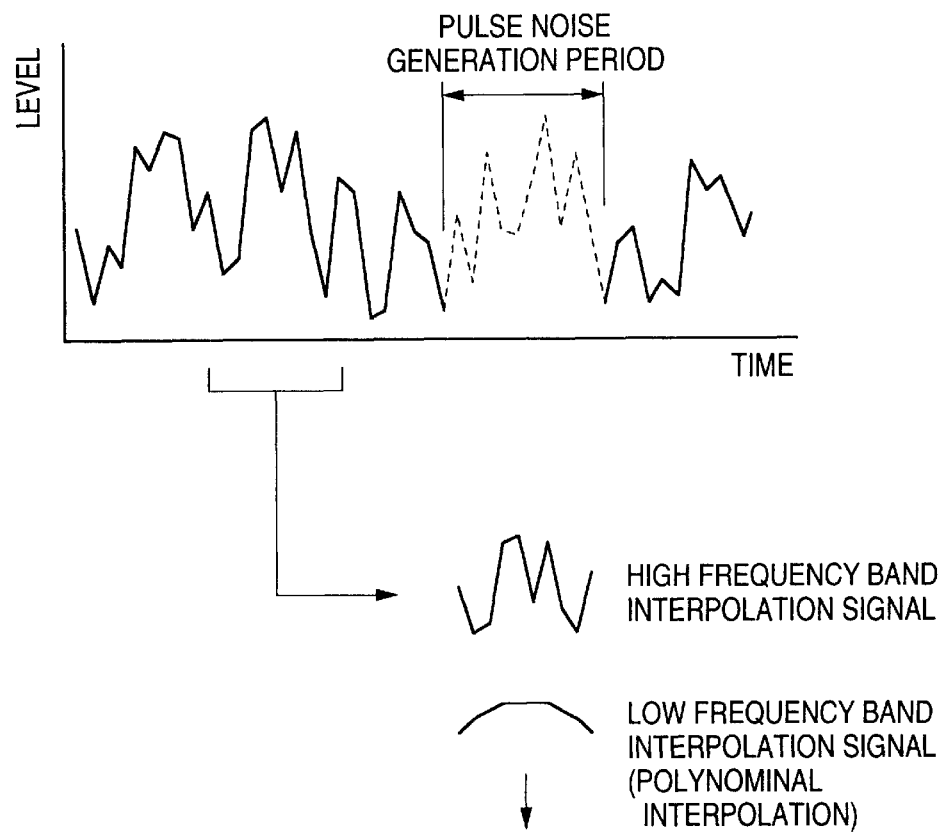
FIG. 63 is a view showing operation of the embodiment 11.
Figure 63B:
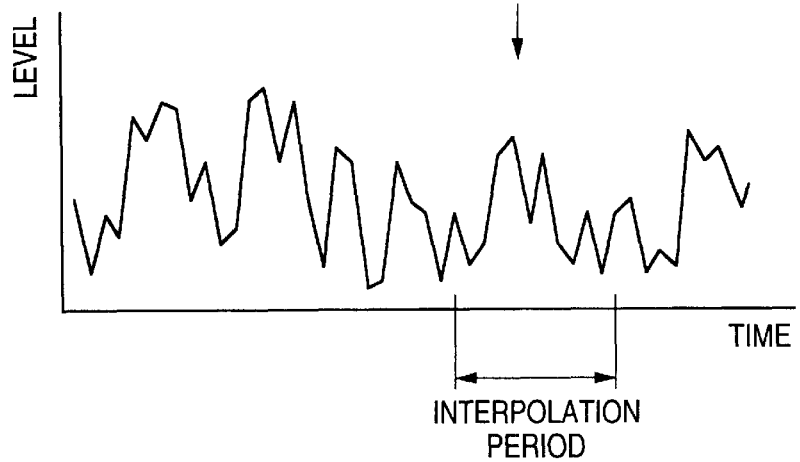

FIG. 63 is a view showing the result of operation of the embodiment 11. FIG. 63A shows an original signal wherein a broken line portion indicates the pulse-like noise generation period. FIG. 63B shows the result of operation of the embodiment 11. The low frequency band interpolation signal which is polynomial-interpolated after the high frequency component has been removed and the high frequency band interpolation signal from which the high frequency component is picked out in the region immediately before the pulse-like noise generation period are synthesized, and then the synthesized signal is exchanged with the noise portion of the audio signal.

Figure 64:
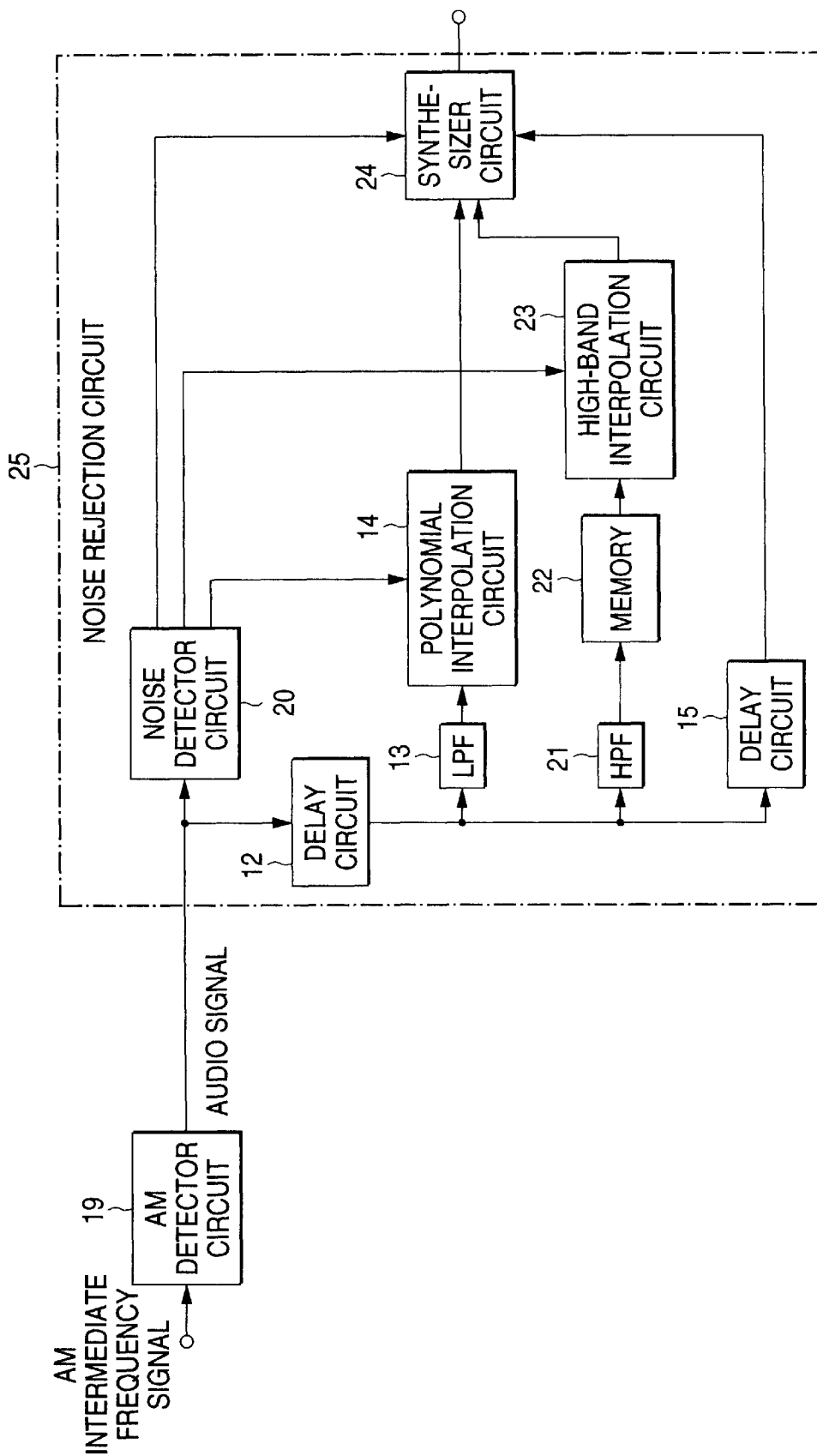
FIG. 64 is a view showing another example of the embodiment 11.

In the embodiment 11, the noise rejection for the FM stereo signal has been explained. In the case of the monoral signal, two outputs of the FM demodulator circuit 5 are the totally same signals, but the operation is completely identical. Similarly, as for the AM signal, as shown in FIG. 64, since there is no change in the process for the audio signal as an output of the AM detector circuit 19 and subsequent processes, a configuration and an operation of the noise rejection circuit 25 are basically identical.

EMBODIMENT 12

Figure 65:
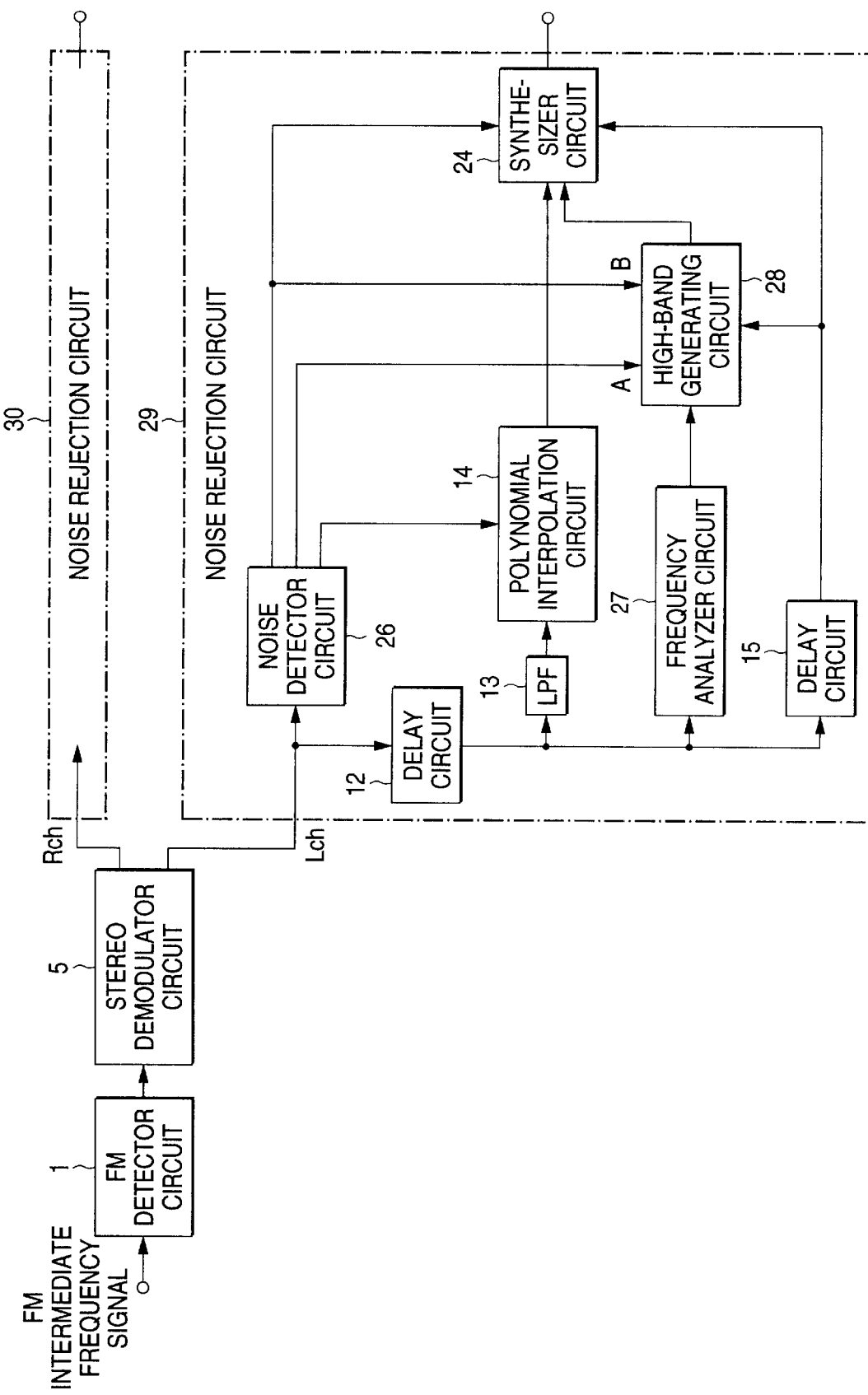
FIG. 65 is a block circuit diagram showing a pulse-noise noise reduction system according to the embodiment 12.

FIG. 65 is a block circuit diagram showing a pulse-like noise noise reduction system according to an embodiment 12 of the present invention. In FIG. 65, the same references as those in FIG. 57 denote the same or similar parts respectively. In FIG. 65, a reference 1 denotes an FM detector circuit; 5, a stereo demodulator circuit; 12, a delay circuit; 13, an LPF; 14, a polynomial interpolation circuit; 15, a delay circuit; 24, a synthesizer circuit; 26, a noise rejection circuit; 27, a frequency analyzer circuit; and 28, a high frequency band generating circuit. A noise rejection circuit 29 for the audio signal output from the stereo demodulator circuit 5 over one channel is composed of these constituent elements. A reference 30 denotes another noise rejection circuit. Since a configuration of the noise rejection circuit 30 is identical to that of the noise rejection circuit 29, its explanation will be omitted in this disclosure.

Since operations of the parts which are overlapped with those in the previous embodiment, i.e., the FM detector circuit 1, the stereo demodulator circuit 5, the delay circuit 12, the LPF 13, and the polynomial interpolation circuit 14 are totally similar, their explanation will be omitted in this disclosure.

More particularly, for example, FFT (Fast Fourier Transform), MDCT (Modified Discrete Cosine Transform), SBF (Sub Band Filter), etc. may be employed as the frequency analyzer circuit 27 which detects a frequency distribution by virtue of calculation.

The output of the delay circuit 12 is input into the frequency analyzer circuit 27 in which the frequency distribution of the audio signal is detected. Then, a single prominent frequency or a plurality of prominent frequencies are detected within the frequency range cut off by the LPF 13 and below the Nyquist frequency and then output. The high frequency band generating circuit 28 receives the output of the frequency analyzer circuit 27, then generates the sine wave of a corresponding frequency, and then outputs it so as to mate in phase with the output of the delay circuit 15 immediately before the noise generation period.

Figure 66A:
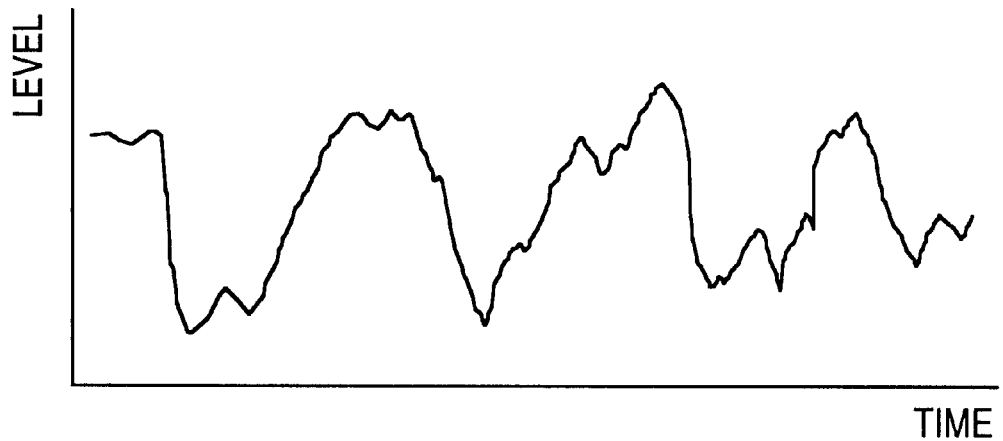
FIG. 66 is a view showing an operation of frequency analyzer circuit.
Figure 66B:
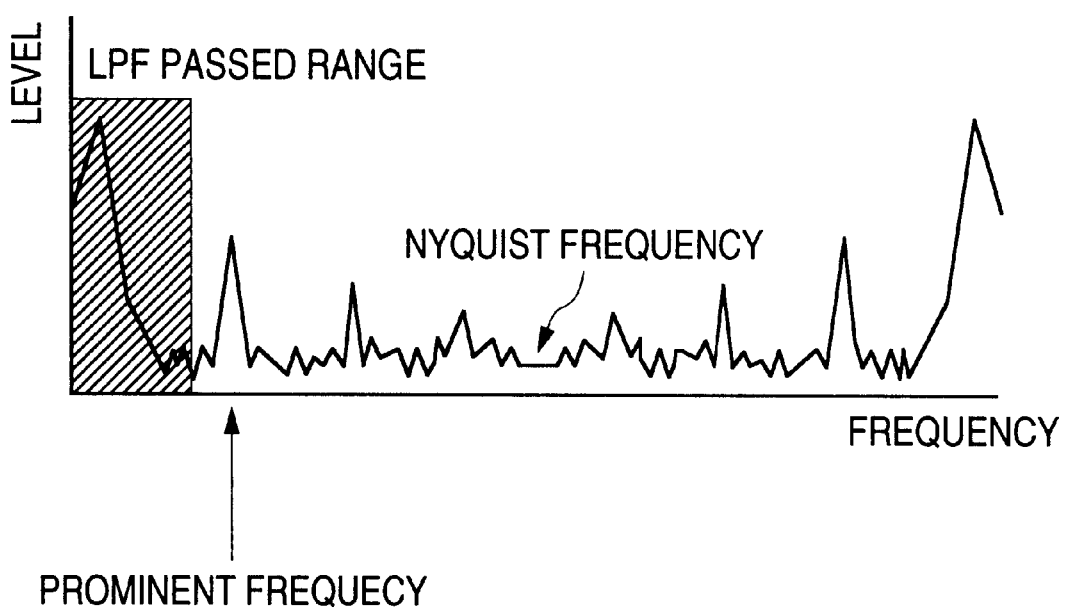

FIG. 66 is a view showing an operation of the frequency analyzer circuit 27. FIG. 66A shows an input of the frequency analyzer circuit 27. FIG. 66B shows a frequency distribution detected by the frequency analysis. The value of the prominent frequency which is out of the frequency range being passed by the LPF 13 shown in FIG. 66 and below the Nyquist frequency is output. When receives this value, the high frequency band generating circuit 28 generates a single sine wave or a plurality of sine waves and then output it or them. If a plurality of sine waves are output, they are synthesized and then output.

Figure 67:
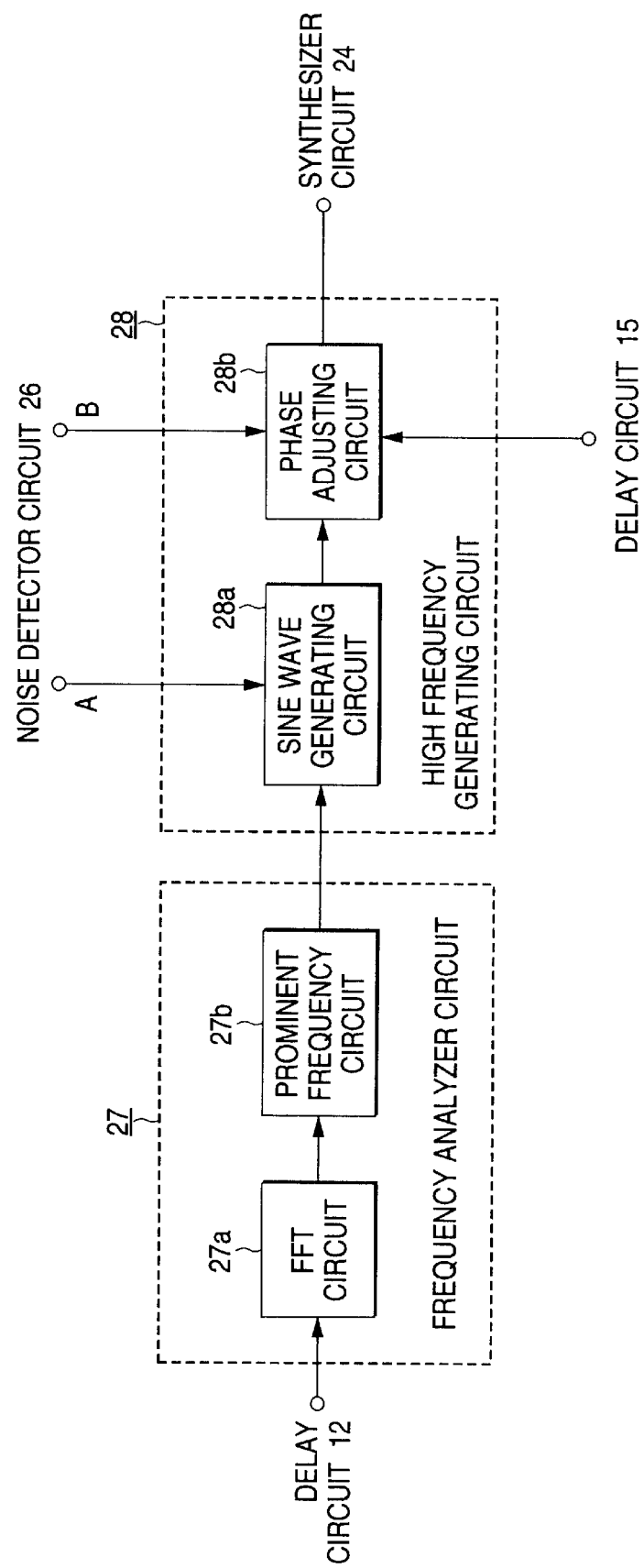
FIG. 67 is an example of configuration of the frequency analyzer circuit and the high frequency band generating circuit.

FIG. 67 shows examples of particular configurations of the frequency analyzer circuit 27 and the high frequency band generating circuit 28. The frequency analyzer circuit 27 is composed of an FFT circuit 27a and a prominent frequency circuit 27b, and the high frequency band generating circuit 28 is composed of a sine wave generating circuit 28a and a phase adjusting circuit 28b.

The FFT circuit 27a receives the audio signal output from the delay circuit 12, and then calculates the frequency distribution as explained in FIG. 66. Based on this frequency distribution, the prominent frequency circuit 27b outputs the frequency value which is within the frequency range cut off by the LPF 13 and below the Nyquist frequency. Accordingly, the value is output from the frequency analyzer circuit 27 at a time interval which is required for operations of the FFT circuit 27a and the prominent frequency circuit 27b.

The sine wave generating circuit 28a receives the output of the frequency analyzer circuit 27, then generates a single sine wave or a plurality of sine waves, and then outputs it or them. If a plurality of sine waves are output, they are synthesized and then output. The phase adjusting circuit 28b receives the output of the delay circuit 15 and the output of the noise detector circuit 26 directed toward the high frequency band generating circuit 28 and the synthesizer circuit 24, and then outputs the signal such that such signal is common in phase with the output of the delay circuit 15 immediately before the noise generation period and the output of the sine wave generating circuit 28a.

Figure 68:
FIG. 68 is a view showing timings of operation of the interpolation circuit.
Figure 68:
Figure 68:
Figure 68:
Figure 68:
Figure 68:
Figure 68:
Figure 68:

FIG. 68 is a view showing timings of the polynomial interpolation circuit 14, the high frequency band interpolation circuit 23, and the delay circuit 15. FIG. 68A shows the result of noise detection by the noise detector circuit 26. FIG. 68B shows the output of the delay circuit 12. FIG. 68C shows an output of the noise detector circuit 26 directed toward the polynomial interpolation circuit 14. FIG. 68D shows the output of the LPF 13 and the output of the low frequency band interpolation signal of the polynomial interpolation circuit 14. FIG. 68E shows an input of the frequency analyzer circuit 27 and an output of the high frequency band generating circuit 28. FIG. 68F shows an output of the noise detector circuit 26 directed toward the synthesizer circuit 24. FIG. 68G shows the output of the delay circuit 15. FIG. 68H shows the output of the synthesizer circuit 24. Since the output of the polynomial interpolation circuit 14 is output at the most delayed timing in time, the output of the high frequency band generating circuit 28 and the output of the delay circuit 15 operate in synchronous with the output of the polynomial interpolation circuit 14 in timing. Also, the noise detector circuit 26 outputs its output at timings which are defined by the delay by caused the LPF 13 and a time required to output the low frequency band interpolation signal to the output of the polynomial interpolation circuit 14.

Meanwhile, an output of the delay circuit 12 is delayed by the delay circuit 15 by an amount to coincide in timing with an output of the polynomial interpolation circuit 14 and an output of the high frequency band interpolation circuit 19. An output of the audio signal of the delay circuit 15, an output of the low frequency band interpolation signal of the polynomial interpolation circuit 14, and an output of the high frequency band interpolation circuit 23 are input into the synthesizer circuit 24. Then, according to the results of noise detection in the output of the noise detector circuit 20 toward the synthesizer circuit 24, the synthesizer circuit 24 exchanges the noise portion of the audio signal with the interpolation signal to output a synthesized signal.

Figure 69A:
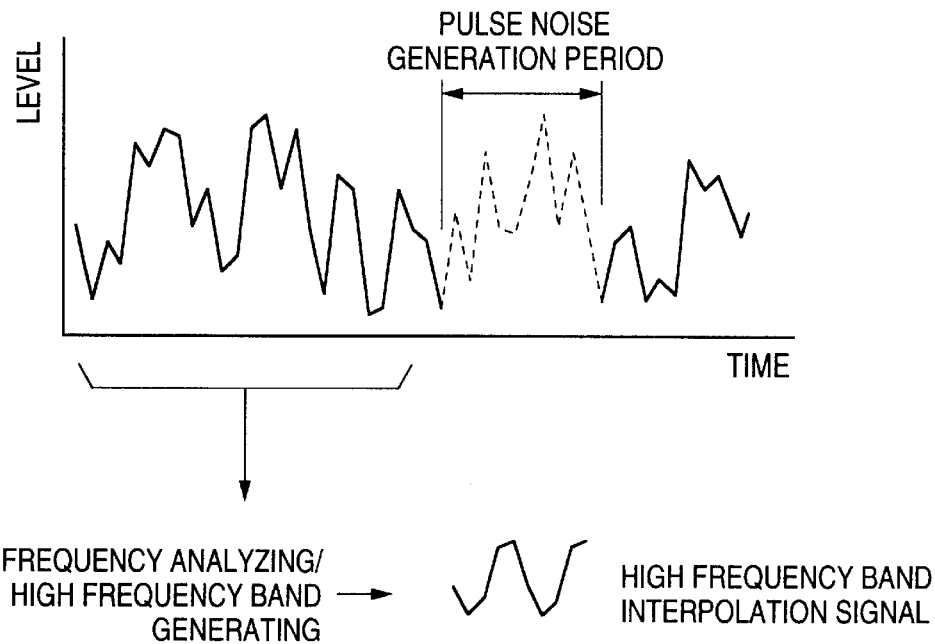
FIG. 69 is a view showing operation of the embodiment 12.
Figure 69B:
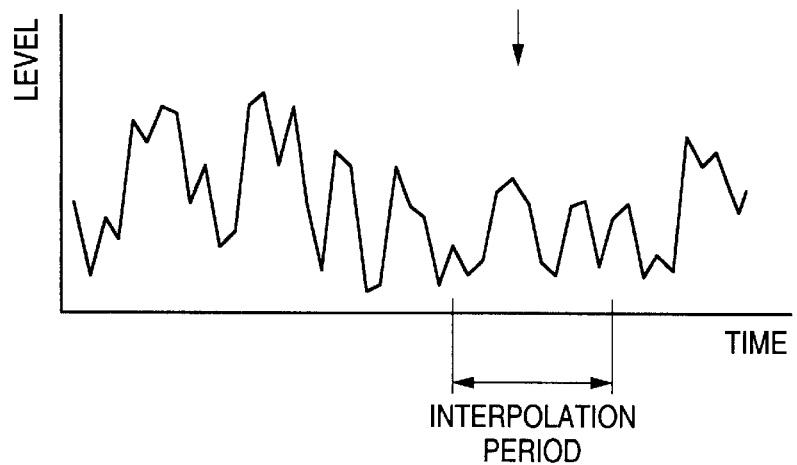

FIG. 69 is a view showing the result of operation of the embodiment 12. FIG. 69A shows an original signal wherein a broken line portion indicates the pulse-like noise generation period. FIG. 69B shows the result of operation of the embodiment 12. The low frequency band interpolation signal, which is polynomial-interpolated after the high frequency component has been removed, and the high frequency band interpolation signal, which is generated by the high frequency band generating circuit based on the frequency detected by the frequency analysis in the region immediately before the pulse-like noise generation period, are synthesized, and then the synthesized signal is exchanged with the noise portion of the audio signal.

Figure 70:
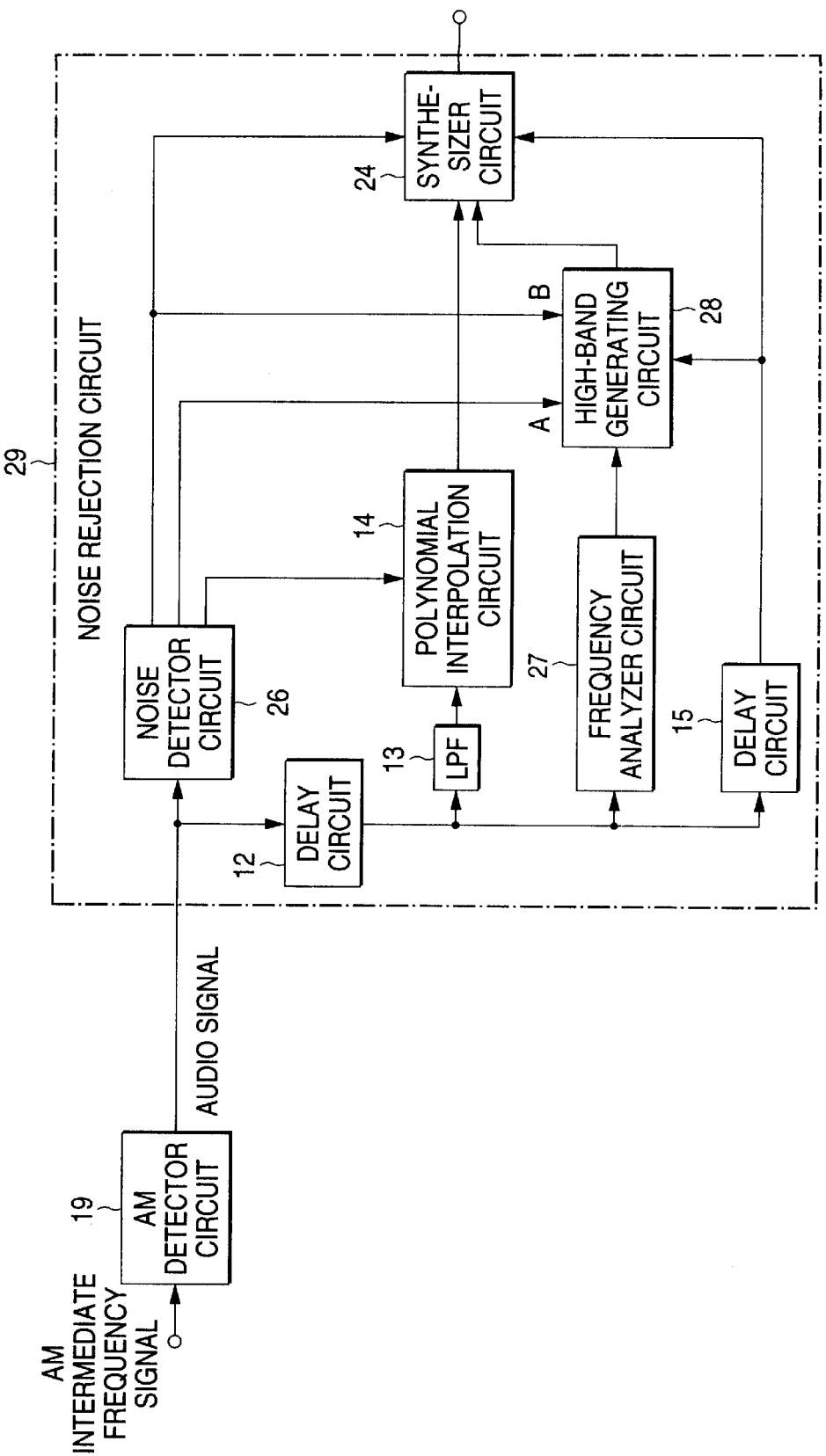
FIG. 70 is a view showing another example of the embodiment 12.

In the embodiment 12, the noise rejection for the FM stereo signal has been explained. In the case of the monoral signal, two outputs of the FM demodulator circuit 5 are the totally same signals, but the operation is completely identical. Similarly, as for the AM signal, as shown in FIG. 70, since there is no change in the process for the audio signal as an output of the AM detector circuit 19 and subsequent processes, a configuration and an operation of the noise rejection circuit 29 is basically identical.

Since the present invention is constructed as mentioned above, following advantages can be achieved.

Since the noise period of the low frequency component extracted from the audio signal is polynomial-interpolated, the protruded interpolation signal is never derived and also it does not become extremely discontinuous before and after the noise period at all. In addition, since the level of the noise period of the intermediate and high frequency components being extracted from the audio signal is suppressed, the noise can be completely removed. Further, since the noise period is interpolated and suppressed independently every channel after the stereo demodulation, no discrepancy is caused before and after the noise period even if there is difference between signals over a plurality of channels.

Also, the polynomial interpolation is carried out after the degree of the inclination of the segment, which is defined by two respective preceding and succeeding points of the noise period of the low frequency component being extracted from the audio signal, is limited by the limiter means. Therefore, unless the cut-off characteristic of the LPF which extracts the low frequency component is set to be steep, the protruded interpolation signal is never derived and no prominent discontinuity is caused at the start and end points of the noise period.

Since the low frequency component is extracted and then the polynomial interpolation is executed after the noise period of the audio signal has been linear-interpolated previously, the inclination of the segment defined by two preceding and succeeding points of the noise period serving as the start points of the polynomial interpolation can be made small in comparison with the case where the low frequency component is extracted by the LPF while containing the pulse-like noise as it is and then the polynomial interpolation is executed. Therefore, the protruded interpolation signal is never derived and no prominent discontinuity is caused at the start and end points of the noise period.

Since the low frequency component is extracted and then the polynomial interpolation is executed after the noise period of the audio signal has been linear-interpolated previously, the inclination of the segment defined by two preceding and succeeding points of the noise period serving as the start points of the polynomial interpolation can be made small in comparison with the case where the low frequency component is extracted by the LPF while containing the pulse-like noise as it is and then the polynomial interpolation is executed. In addition, after the degree of the inclination of the segment defined by two preceding and succeeding points of the noise period serving as the start points of the polynomial interpolation has been limited by the limiting means, the polynomial interpolation is executed. Therefore, the protruded interpolation signal is never derived unless the cut-off characteristic of the LPF which extracts the low frequency component is set to be steep, and continuity at the start and end points of the noise period can be improved.

The low frequency component is extracted by the LPF after the noise period of the audio signal has been linear-interpolated in advance, and then such low frequency component and the intermediate and high frequency components which are extracted from the linear-interpolated audio signal and whose noise period is suppressed in level are synthesized. Therefore, the noise reduction system which lacks smoothness rather than the case where the noise period of the low frequency component is polynomial-interpolated, but has no protruded level of the interpolation signal can be obtained.

Since the second filter means for extracting the intermediate and high frequency components of the audio signal is composed of the delay means for delaying the audio signal by the same delay amount as the first filter means, and the subtracting means for subtracting the low frequency component being extracted by the first filter means from the audio signal, the second filter means for extracting the intermediate and high frequency components can be implemented with a simple configuration.

The intermediate frequency component is extracted by the third filter means from the intermediate and high frequency components extracted by the second filter means, then the high frequency component is extracted by the fourth filter means from the intermediate and high frequency components, then the levels of the noise periods of the intermediate frequency component and the high frequency component being extracted are appropriately suppressed respectively, and then the intermediate frequency component and the high frequency component are synthesized with the low frequency component whose noise period is polynomial-interpolated to thus obtain the audio signal. Therefore, while reducing the evil influence such as the beat sound which is caused by the noise rejection process applied to the intermediate frequency component and the high frequency component, the noise can be removed.

The means for suppressing the level of the noise period of the intermediate and high frequency components being extracted by the second filter means is constructed by the muting means for attenuating the noise period of the intermediate and high frequency components, and the fade-out/in means for fading out the intermediate and high frequency components immediately before the noise period and fading in them immediately after the noise period, otherwise the ON/OFF means for turning OFF the intermediate and high frequency components at the beginning of the noise period and turning ON them at an end of the noise period. Therefore, while reducing the evil influence such as the beat sound which is caused by the noise rejection process applied to the intermediate frequency component and the high frequency component, the noise can be removed.

The means for suppressing the noise period of the intermediate frequency component being extracted is constructed by the fade-out/in means for fading out the intermediate frequency component immediately before the noise period and fading in it immediately after the noise period, and the ON/OFF means for turning OFF the intermediate frequency component at a beginning of the noise period and also turning ON it at an end of the noise period, otherwise the level down means for suppressing a level of the noise period. Also, the means for suppressing the level of the noise period of the high frequency component being extracted is constructed by the fade-out/in means for fading out the high frequency component immediately before the noise period and fading in it immediately after the noise period. Therefore, the evil influence such as the beat sound which is caused by the noise rejection process applied to the intermediate frequency component and the high frequency component can be removed effectively.

Since fade-out and fade-in characteristics of the fade-out/in means are set like a saturation curve which is saturated from the pass band toward the cut-off region respectively, discontinuity in connection the interpolation signal and the audio signal at the start and end portion of the noise period can be reduced.

Since [KIK33] the polynomial interpolation is applied to the low frequency component of the audio signal, there is no case where the protruded interpolation signal is generated and also remarkable discontinuity is in no way caused at the start and end portions of the pulse-like noise generation period. In addition, since the signals are independently interpolated respectively over both channels after the stereo demodulation, no discrepancy is caused before and after the pulse-like noise generation period even though there is difference in the signals over both channels.

Since the preceding high frequency band signal of the audio signal is read from the memory and then synthesized with the low frequency band polynomial interpolation signal, connection of the signal at the start and end portions of the pulse-like noise generation period can be made smooth rather than the case where the interpolation is performed only by the low frequency component.

Since the high frequency band interpolation signal of the audio signal is generated from the preceding prominent frequency components and then synthesized with the low frequency band interpolation signal, connection of the signal at the start and end portions of the pulse-like noise generation period can be made smooth rather than the case where the interpolation is performed merely by the low frequency component.

What is claimed is:

1. An audio signal noise reduction system comprising:
   noise detecting means for detecting a noise of an audio signal and outputting a detection signal indicating a start time and an end time of a noise period of the noise;
   first filter means for extracting a low frequency component of the audio signal;
   low frequency band interpolation means for interpolating the noise period of the low frequency component being extracted;
   second filter means for extracting second frequency components different from the low frequency component of the audio signal;
   suppressing means for suppressing a level of the noise period of the second frequency components being extracted; and
   a signal synthesizing means for synthesizing the low frequency component, whose noise period is interpolated, and the second frequency components, the level of whose noise period is suppressed, to output the audio signal.

2. An audio signal noise reduction system as claimed in claim 1, wherein said low frequency band interpolation means comprises limiting means for limiting a degree of an inclination of a segment serving as a start point of the noise period of the low frequency component being extracted;
   means for polynomial-interpolating the noise period of the low frequency component in which the degree of the inclination of the segment serving as the start point of the noise period is limited.

3. An audio signal noise reduction system as claimed in claim 1, further comprising linear interpolation means for linear-interpolating the noise period of the audio signal; and
   wherein said first filter means extracts a low frequency component of the audio signal which is linear-interpolated.

4. An audio signal noise reduction system as claimed in claim 1 further comprising a linear interpolation means for linear-interpolating the noise period of the audio signal;
   wherein said filter means extracts a low frequency component of the audio signal which is linear-interpolated; and
   said low frequency band interpolation means comprises:
   limiting means for limiting a degree of an inclination of a segment serving as a start point of the noise period of the low frequency component being extracted; and
   means for polynomial-interpolating the noise period of the low frequency component in which the degree of the inclination of the segment serving as the start point of the noise period is limited; and
   said second filter means extracts the second frequency components of the audio signal which is linear-interpolated.

5. An audio signal noise reduction system as claimed in claim 1, wherein the second filter means includes:
   delay means for delaying the audio signal by the same amount as that in the first filter means; and
   subtracting means for subtracting the low frequency component extracted by the first filter means from the audio signal being delayed.

6. An audio signal noise reduction system as claimed in claim 1 further comprising:
   first delay means for providing a delay amount generated in the noise detecting means to the audio signal; and
   second delay means for providing a delay amount generated in the low frequency band interpolation means to the audio signal output from the first delay means;
   wherein said second filter means includes high frequency filter means for extracting a high frequency component of the audio signal output from first delay means;
   said audio signal noise reduction system further comprising:
   memory means for storing an output of the second filter means;
   high frequency band interpolation means for reading a high frequency component of the period, from which the noise is detected by the noise detecting means, from the memory means and polynomial-interpolating it;
   wherein said signal synthesizing means exchanges the audio signal output from the second delay means of the noise period with a synthesized signal of an output signal of the low frequency band interpolation means and an output signal of the high frequency band interpolation means.

7. An audio signal noise reduction system as claimed in claim 1, further comprising:
   first delay means for providing a delay amount generated in the noise detecting means to the audio signal and outputting the delayed audio signal to said first filter;
   second delay means for providing a delay amount generated in the low frequency band interpolation means to the audio signal output from the first delay means;
   frequency analyzer means for analyzing frequency components of the audio signal output from first delay means;
   high frequency component generating means for detecting a single prominent frequency or a plurality of prominent frequencies within a frequency range, which is cut off by the first filter means, of an output signal of the frequency analyzer means immediately before the noise period, and below a Nyquist frequency and then generating a sine wave of the frequency or frequencies; and
   wherein said signal synthesizing means exchanges the audio signal output from the second delay means of the noise period with a synthesized signal of an output signal of the low frequency band interpolation means and an output signal of the high frequency component generating means.

8. The audio signal noise reduction system according to claim 1, further comprising:

noise detecting means for detecting a noise of an audio signal and outputting a detection signal indicating a start time and an end time of a noise period of the noise; and linear-interpolation means for linear-interpolating the noise period of the audio signal, and where the first filter means extracts the low frequency component of the audio-signal being linear-interpolated, the second filter means extracts the second frequency components of the audio signal being linear-interpolated, the means for suppressing a level of the noise period of the second frequency components being extracted, and the signal synthesizing means for synthesizing the low frequency component being extracted and the second frequency components, the level of whose noise period is suppressed, to output the audio signal.

9. The audio signal noise reduction system according to claim 1, further comprising:

noise detecting means for detecting a noise of an audio signal and outputting a detection signal indicating a start time and an end time of a noise period of the noise, said first filter and second filter are replaced by filter means for separating the audio signal into at least three components composed of a low frequency component, an intermediate frequency component, and a high frequency component, the intermediate and high frequency components constituting the second frequency component, the low frequency band interpolation means polynomial interpolates the noise period of the low frequency component which is separated and extracted by said filter means, means for suppressing level of the noise period of the second frequency components, respectively, which are separated and extracted by said filter means, and signal synthesizing means for synthesizing the low frequency component whose noise period is polynomial interpolated, and the second component, the levels of whose noise periods are suppressed, to output the audio signal.

10. An audio signal noise reduction system as claimed in claim 9, wherein said suppressing means includes:

muting means for attenuating the noise period of the intermediate and high frequency components; and one of fade-out/in means for fading out the intermediate and high frequency components immediately before the noise period and fading in them immediately after the noise period, and ON/OFF means for turning OFF the intermediate and high frequency components at a beginning of the noise period and turning ON them at an end of the noise period.

11. An audio signal noise reduction system as claimed in claim 9, wherein means for suppressing the noise period of the intermediate frequency component which is extracted by said filter means, includes fade-out/in means for fading out the intermediate frequency component immediately before the noise period and fading in it immediately after the noise period, and one of ON/OFF means for turning OFF the intermediate frequency component at a beginning of the noise period and also turning ON it at an end of the noise period and level down means for suppressing a level of the noise period, and means for suppressing the level of the noise period of the high frequency component being extracted by the fourth filter means includes: fade-out/in means for fading out the high frequency component immediately before the noise period and fading in it immediately after the noise period.

12. An audio signal noise reduction system as claimed in claim 10, wherein fade-out and fade-in characteristics of the fade-out/in means are set like a saturation curve which is saturated from a pass band toward a cut-off region respectively.

13. The audio signal noise reduction system of claim 1, wherein the interpolation means uses polynomial interpolation.

* * * * *